(12) United States Patent
Yamazaki et al.

(10) Patent No.: US 12,628,422 B2
(45) Date of Patent: May 12, 2026

(54) DISPLAY DEVICE AND METHOD FOR FABRICATING DISPLAY DEVICE

(71) Applicant: Semiconductor Energy Laboratory Co., Ltd., Atsugi (JP)

(72) Inventors: Shunpei Yamazaki, Setagaya (JP); Takayuki Ikeda, Atsugi (JP); Kenichi Okazaki, Atsugi (JP); Yasumasa Yamane, Atsugi (JP); Hajime Kimura, Atsugi (JP); Tatsuya Onuki, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 381 days.

(21) Appl. No.: 18/270,767

(22) PCT Filed: Jan. 5, 2022

(86) PCT No.: PCT/IB2022/050053
§ 371 (c)(1),
(2) Date: Jul. 3, 2023

(87) PCT Pub. No.: WO2022/153140
PCT Pub. Date: Jul. 21, 2022

(65) Prior Publication Data
US 2024/0065054 A1 Feb. 22, 2024

(30) Foreign Application Priority Data
Jan. 14, 2021 (JP) ................................. 2021-004566

(51) Int. Cl.
*H10D 86/40* (2025.01)
*H10K 50/10* (2023.01)
(Continued)

(52) U.S. Cl.
CPC ......... *H10D 86/481* (2025.01); *H10K 50/171* (2023.02); *H10K 59/131* (2023.02);
(Continued)

(58) Field of Classification Search
CPC .... H10D 86/481; H10D 86/60; H10D 86/423; H10D 30/6755; H10K 50/171;
(Continued)

(56) References Cited

U.S. PATENT DOCUMENTS 5,953,985 A 9/1999 Kobayashi
6,120,338 A 9/2000 Hirano. et al.
(Continued)

FOREIGN PATENT DOCUMENTS

CN 001726607 A 1/2006
CN 001925705 A 3/2007
(Continued)

OTHER PUBLICATIONS

International Search Report (Application No. PCT/IB2022/050053) Dated Apr. 26, 2022.
(Continued)

*Primary Examiner* — Anne M Hines
*Assistant Examiner* — Jose M Diaz
(74) *Attorney, Agent, or Firm* — Eric J. Robinson; Robinson Intellectual Property Law Office, P.C.

(57) ABSTRACT

A high-resolution display device and a fabrication method thereof are provided. The display device includes a first insulating layer; a light-emitting element and a first conductive layer over the first insulating layer; a first layer over the first conductive layer; a second conductive layer over the first layer; a second insulating layer over the light-emitting element, the second conductive layer, and the first insulating layer; and a third conductive layer over the second insulating layer. The light-emitting element includes a fourth conduc-
(Continued)

tive layer, a second layer over the fourth conductive layer, a third layer over the second layer, and a fifth conductive layer over the third layer. The third conductive layer includes a region in contact with the second conductive layer through a first opening formed in the second insulating layer and a region in contact with the fifth conductive layer through a second opening formed in the second insulating layer; the second layer contains a light-emitting compound; the first conductive layer and the fourth conductive layer contain the same material; the first layer and the third layer contain the same material; and the second conductive layer and the fifth conductive layer contain the same material.

16 Claims, 19 Drawing Sheets

(51) Int. Cl.

| | |
|---|---|
| *H10K 50/17* | (2023.01) |
| *H10K 59/131* | (2023.01) |
| *H10K 59/80* | (2023.01) |
| *H10K 71/16* | (2023.01) |
| *H10K 71/60* | (2023.01) |

(52) U.S. Cl.
CPC ........... *H10K 71/166* (2023.02); *H10K 71/60* (2023.02); *H10K 50/10* (2023.02); *H10K 59/8731* (2023.02)

(58) Field of Classification Search
CPC .. H10K 50/10; H10K 59/131; H10K 59/8731; H10K 59/121; H10K 59/1201; H10K 59/124; H10K 59/8051–8052; H10K 71/166; H10K 71/60; H10K 71/621; G09F 9/00; G09F 9/30; H05B 33/06; H05B 33/10; H05B 33/12; H05B 33/22; C09K 11/06
See application file for complete search history.

(56) References Cited

U.S. PATENT DOCUMENTS

| | | | |
|---|---|---|---|
| 6,975,067 | B2 | 12/2005 | McCormick et al. |
| 7,156,942 | B2 | 1/2007 | McCormick et al. |
| 7,399,991 | B2 | 7/2008 | Seo et al. |
| 7,863,809 | B2 | 1/2011 | Sera et al. |
| 10,804,499 | B2 | 10/2020 | Shinya |
| 2002/0072139 | A1 | 6/2002 | Kashiwabara |
| 2004/0119403 | A1 | 6/2004 | Mccormick et al. |
| 2007/0053202 | A1 | 3/2007 | Sera et al. |
| 2011/0148290 | A1 | 6/2011 | Oota |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto. et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0256754 | A1 | 9/2017 | Defranco et al. |
| 2018/0190908 | A1 | 7/2018 | Ke et al. |
| 2019/0165322 | A1 | 5/2019 | Shinya |
| 2020/0203662 | A1 | 6/2020 | Mollard et al. |
| 2022/0223671 | A1 | 7/2022 | Yamazaki et al. |
| 2024/0057388 | A1* | 2/2024 | Wang .................. H10K 59/1201 |

FOREIGN PATENT DOCUMENTS

| | | | |
|---|---|---|---|
| EP | 1579517 | A | 9/2005 |
| JP | 2000-036385 | A | 2/2000 |
| JP | 2002-324673 | | 11/2002 |
| JP | 2003-059663 | A | 2/2003 |
| JP | 2006-511916 | | 4/2006 |
| JP | 2006-252839 | A | 9/2006 |
| JP | 2007-095659 | A | 4/2007 |
| JP | 2008-098106 | A | 4/2008 |
| JP | 2008-147072 | A | 6/2008 |
| JP | 2008-251270 | A | 10/2008 |
| JP | 2012-160473 | A | 8/2012 |
| JP | 2013-134847 | A | 7/2013 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2019-179696 | A | 10/2019 |
| JP | 2020-160305 | A | 10/2020 |
| KR | 2005-0092369 | A | 9/2005 |
| KR | 2007-0026125 | A | 3/2007 |
| WO | WO-2004/061992 | | 7/2004 |
| WO | WO-2018/034040 | | 2/2018 |

OTHER PUBLICATIONS

Written Opinion (Application No. PCT/IB2022/050053) Dated Apr. 26, 2022.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

FIG. 4A1
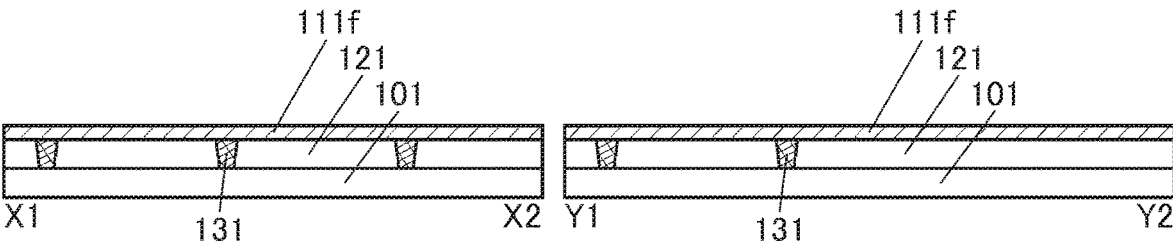
FIG. 4A2
FIG. 4B1
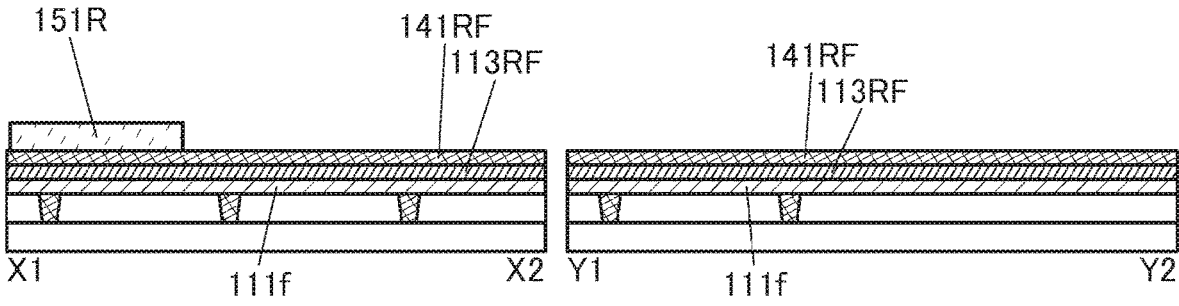
FIG. 4B2
FIG. 4C1
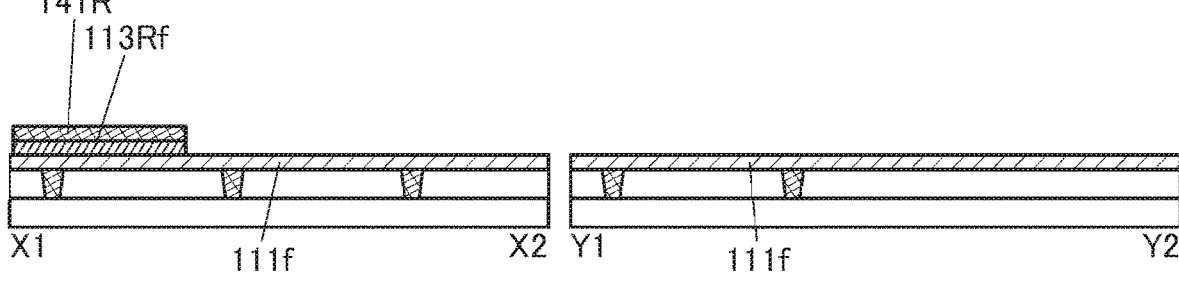
FIG. 4C2

FIG. 5A1
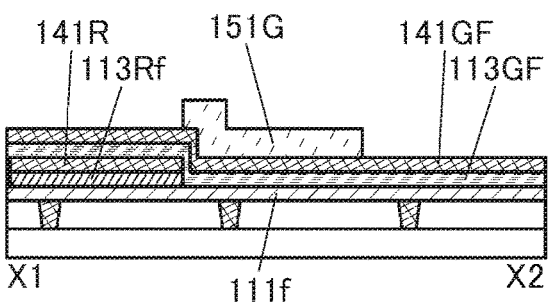
FIG. 5A2
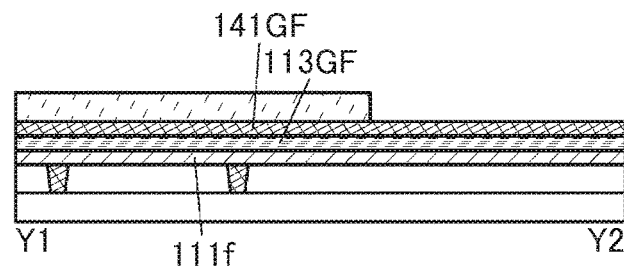
FIG. 5B1
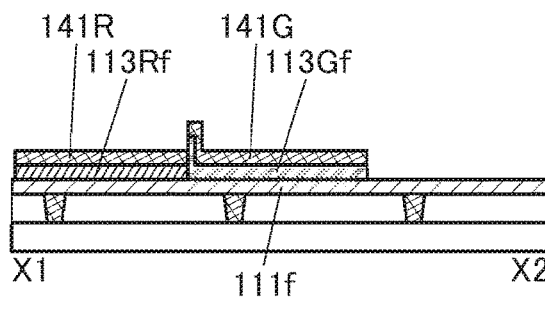
FIG. 5B2
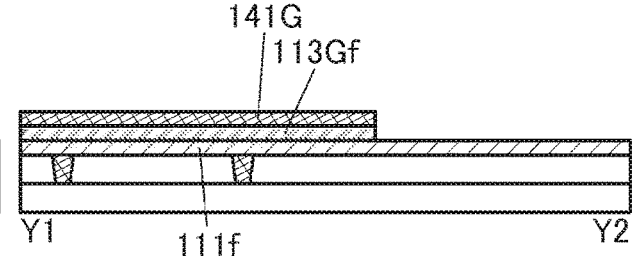
FIG. 5C1
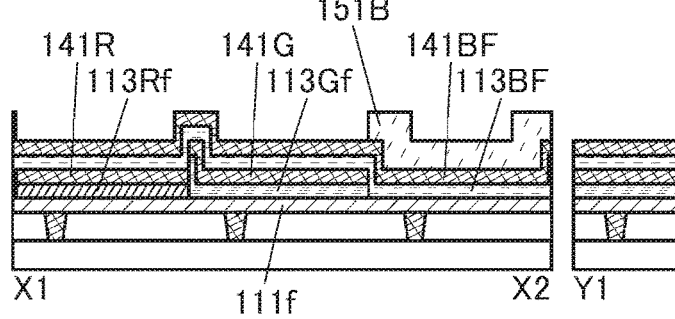
FIG. 5C2
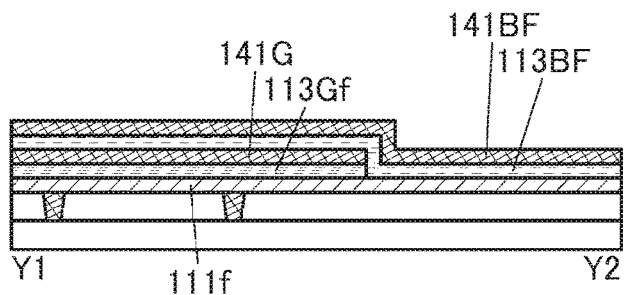
FIG. 5D1
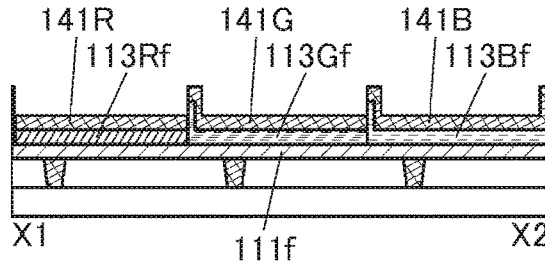
FIG. 5D2
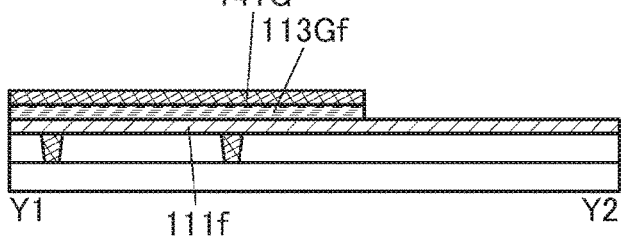

FIG. 6A1
FIG. 6A2
FIG. 6B1
FIG. 6B2
FIG. 6C1
FIG. 6C2
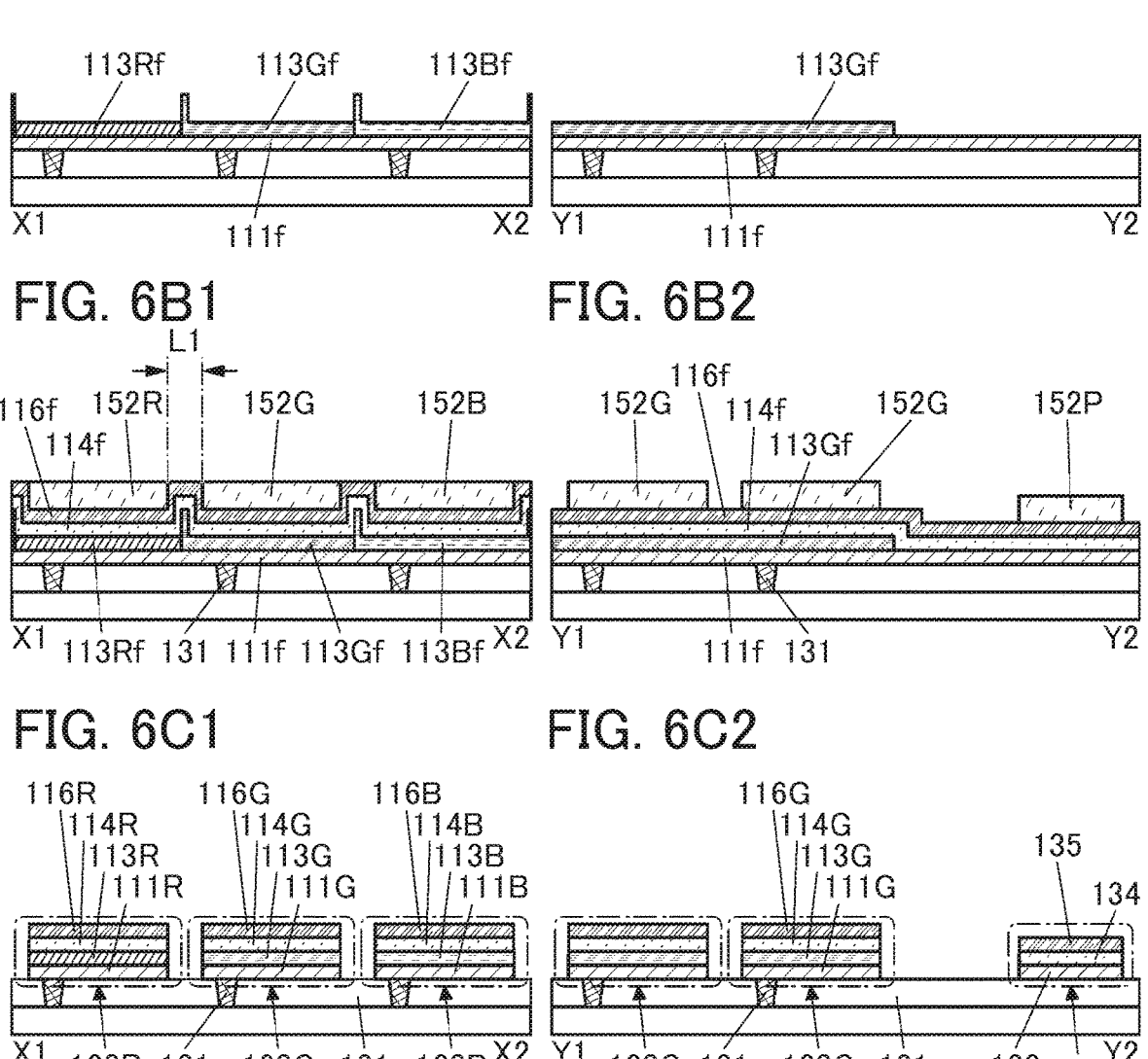

FIG. 7A1 FIG. 7A2
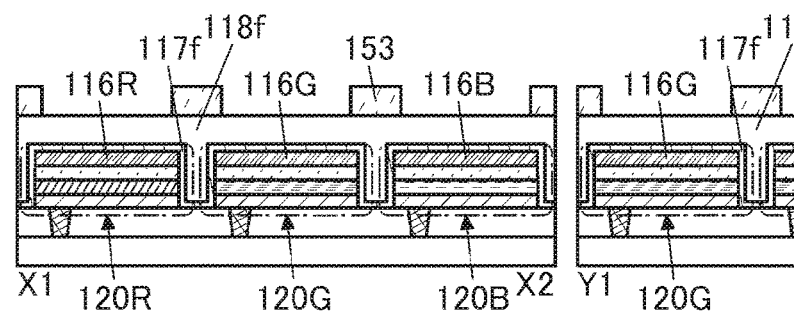
FIG. 7B1 FIG. 7B2
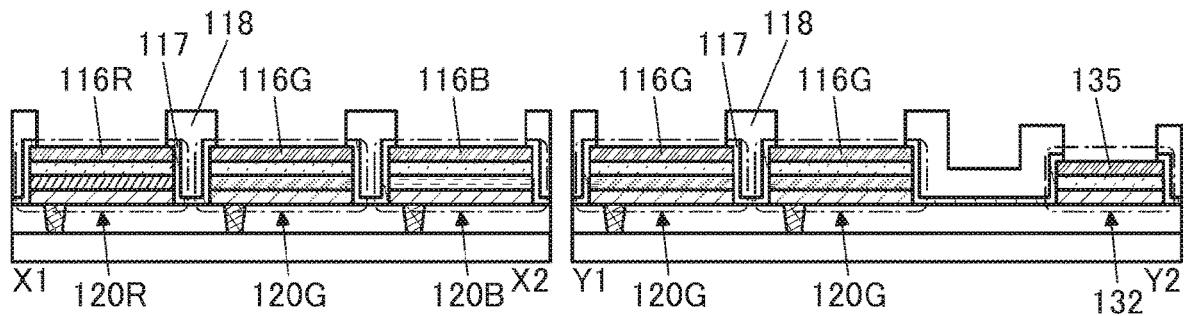
FIG. 7C1 FIG. 7C2
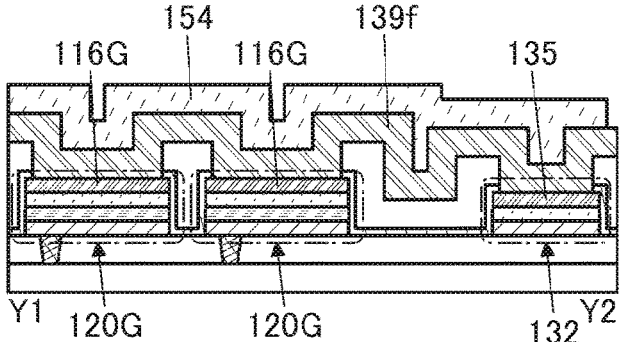
FIG. 7D1 FIG. 7D2
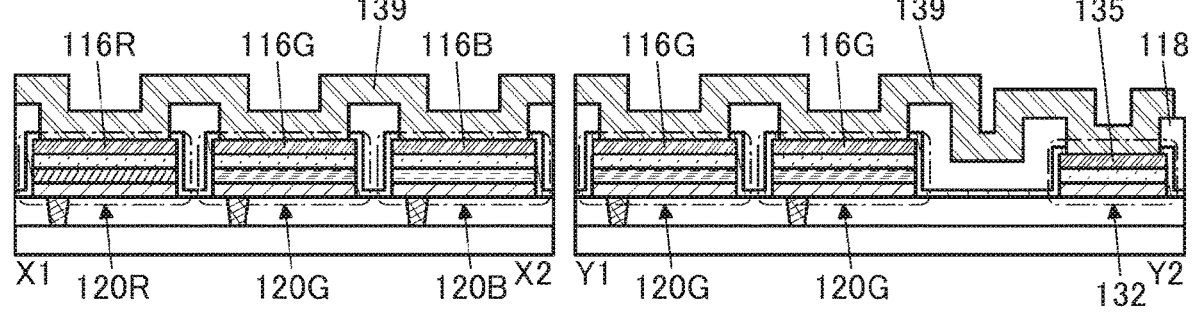

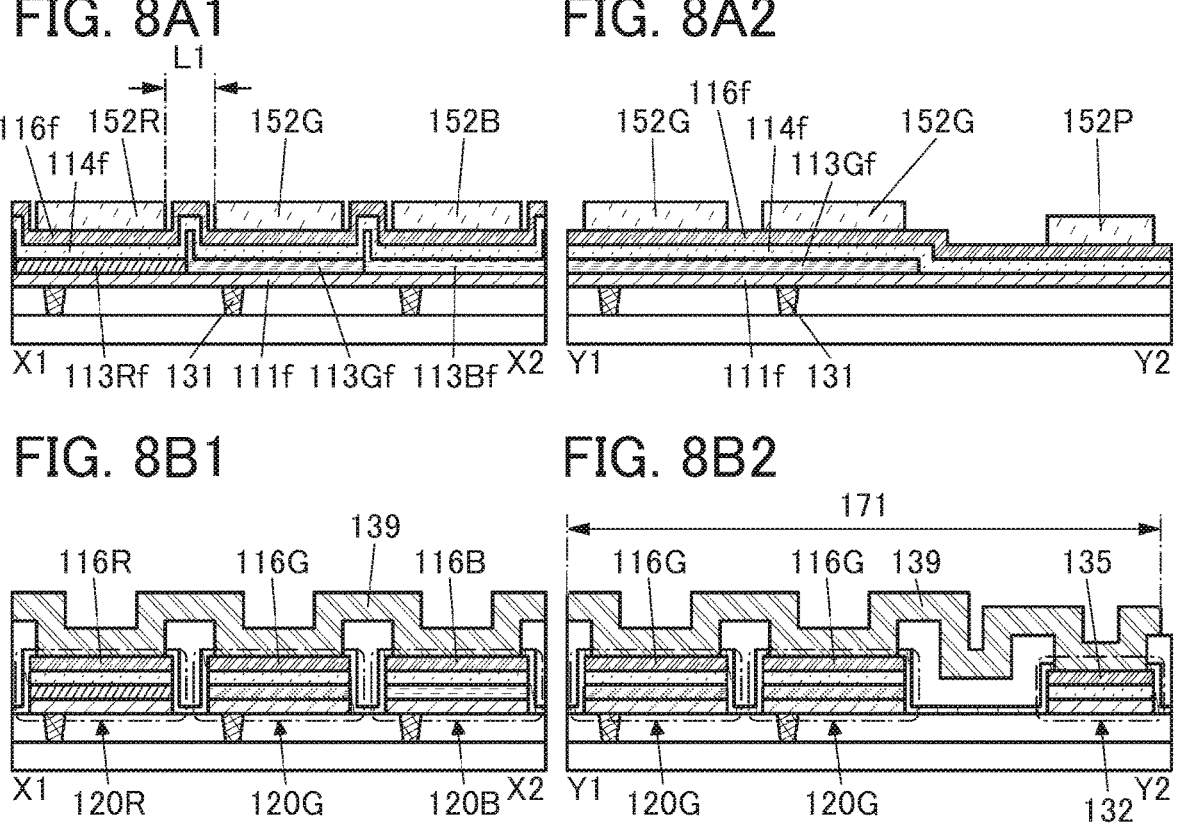
FIG. 8A1
FIG. 8A2
FIG. 8B1
FIG. 8B2

FIG. 19A
9200
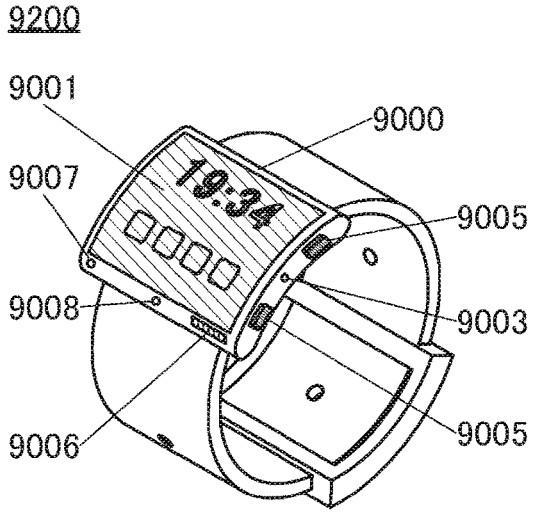
FIG. 19B
9101
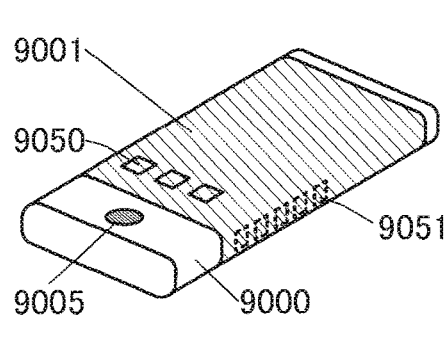
FIG. 19C
9102
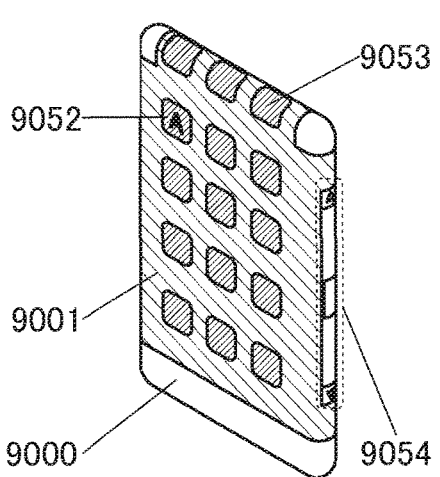
FIG. 19D
9201
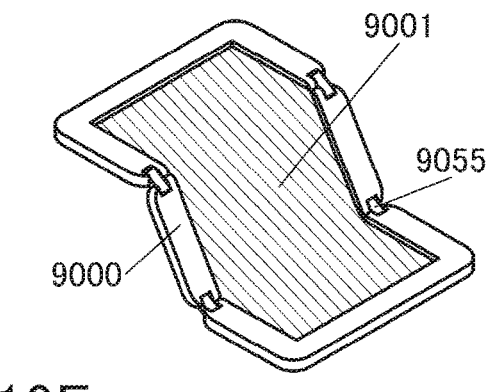
FIG. 19E
9201
FIG. 19F
9201
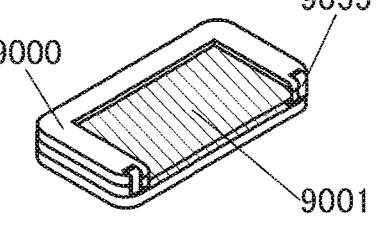

DISPLAY DEVICE AND METHOD FOR FABRICATING DISPLAY DEVICE

TECHNICAL FIELD

One embodiment of the present invention relates to a display device. One embodiment of the present invention relates to a method for fabricating a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. Note that in this specification and the like, a semiconductor device generally means a device that can function by utilizing semiconductor characteristics.

BACKGROUND ART

In recent years, higher-resolution display panels have been required. As a device that requires a high-resolution display panel, for example, devices for virtual reality (VR), augmented reality (AR), substitutional reality (SR), or mixed reality (MR) are given and have been actively developed in recent years.

Examples of a display device that can be used for a display panel include, typically, a liquid crystal display device, a light-emitting device including a light-emitting element such as an organic EL (Electro Luminescence) element or a light-emitting diode (LED), and electronic paper performing display by an electrophoretic method or the like.

For example, the basic structure of an organic EL element is a structure in which a layer containing a light-emitting organic compound is provided between a pair of electrodes. By voltage application to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element.

REFERENCE

Patent Document

[Patent Document 1] Japanese Published Patent Application No. 2002-324673

SUMMARY OF THE INVENTION

Problems to be Solved by the Invention

For example, in the above-described device for VR, AR, SR, or MR that is wearable, a lens for focus adjustment needs to be provided between eyes and the display panel. Since part of the screen is enlarged by the lens, low resolution of the display panel might cause a problem of weak sense of reality and immersion.

The display panel is also required to have high color reproducibility. In particular, when using the display panel with high color reproducibility, the above-described device for VR, AR, SR, or MR can perform display with colors that are close to those of the actual objects, leading to higher sense of reality and immersion.

An object of one embodiment of the present invention is to provide a display device with extremely high resolution. An object of one embodiment of the present invention is to provide a display device in which high color reproducibility is achieved. An object of one embodiment of the present invention is to provide a high-luminance display device. An object of one embodiment of the present invention is to provide a highly reliable display device. An object of one embodiment of the present invention is to provide a method for manufacturing the above-described display device.

Note that the description of these objects does not preclude the existence of other objects. One embodiment of the present invention does not have to achieve all the objects. Note that objects other than these can be derived from the description of the specification, the drawings, the claims, and the like.

Means for Solving the Problems

One embodiment of the present invention is a display device including a first insulating layer, a light-emitting element and a first conductive layer over the first insulating layer, a first layer over the first conductive layer, a second conductive layer over the first layer, and a third conductive layer over the light-emitting element and the second conductive layer. The light-emitting element includes a fourth conductive layer, a second layer over the fourth conductive layer, a third layer over the second layer, and a fifth conductive layer over the third layer; the third conductive layer includes a region in contact with the second conductive layer and a region in contact with the fifth conductive layer; the second layer contains a light-emitting compound; the first conductive layer contains a material identical to a material of the fourth conductive layer; the first layer contains a material identical to a material of the third layer; and the second conductive layer contains a material identical to a material of the fifth conductive layer.

Another embodiment of the present invention is a display device including a first insulating layer, a light-emitting element and a first conductive layer over the first insulating layer, a first layer over the first conductive layer, a second conductive layer over the first layer, a second insulating layer over the light-emitting element, the second conductive layer, and the first insulating layer, and a third conductive layer over the second insulating layer. The light-emitting element includes a fourth conductive layer, a second layer over the fourth conductive layer, a third layer over the second layer, and a fifth conductive layer over the third layer; the second insulating layer includes a region in contact with each of a side surface of the fourth conductive layer, a side surface of the second layer, a side surface of the third layer, a side surface of the fifth conductive layer, and a top surface of the fifth conductive layer; the second insulating layer includes a first opening including a region overlapping with the second conductive layer and a second opening including a region overlapping with the fifth conductive layer; the third conductive layer includes a region in contact with the second conductive layer through the first opening and a region in contact with the fifth conductive layer through the second opening; the second layer contains a light-emitting compound; the first conductive layer contains a material identical to a material of the fourth conductive layer; the first layer contains a material identical to a material of the third layer; and the second conductive layer contains a material identical to a material of the fifth conductive layer.

In the above display device, it is preferable that the second insulating layer have a stacked-layer structure of a third insulating layer and a fourth insulating layer over the third insulating layer, the third insulating layer include a region in contact with a side surface of the fourth conductive layer, a region in contact with a side surface of the second layer, a region in contact with a side surface of the third layer, a region in contact with a side surface of the fifth conductive layer, and a region in contact with a top surface of the fifth conductive layer, the third insulating layer contain aluminum and oxygen, and the fourth insulating layer contain silicon and nitrogen.

The above display device preferably includes a gap in a region that is positioned between the third insulating layer and the fourth insulating layer and does not overlap with the fifth conductive layer.

In the above display device, the third layer preferably contains a substance with a high electron-injection property. Moreover, the third layer preferably contains lithium fluoride.

In the above display device, the third layer preferably contains silver and a compound having an electron deficient heteroaromatic ring.

Another embodiment of the present invention is a method for fabricating a display device, including the steps of forming a first conductive film over a first insulating layer; forming a first film containing a light-emitting compound over the first conductive film; forming a first sacrificial layer over the first film; forming a first resist mask over the first sacrificial layer; forming a second sacrificial layer from the first sacrificial layer and a second film from the first film by removing the first sacrificial layer and the first film that are not covered with the first resist mask; removing the second sacrificial layer; forming a third film over the second film; forming a second conductive film over the third film; forming a second resist mask over the second conductive film; and forming a fifth conductive layer and a second conductive layer from the second conductive film, a third layer and a first layer from the third film, a second layer from the second film, and a fourth conductive layer and a first conductive layer from the first conductive film by removing the second conductive film, the third film, the second film, and the first conductive film that are not covered with the second resist mask.

Another embodiment of the present invention is a method for fabricating a display device, including the steps of forming a first conductive film over a first insulating layer; forming a first film containing a light-emitting compound over the first conductive film; forming a first sacrificial layer over the first film; forming a first resist mask over the first sacrificial layer; forming a second sacrificial layer from the first sacrificial layer and a second film from the first film by removing the first sacrificial layer and the first film that are not covered with the first resist mask; removing the second sacrificial layer; forming a third film using a metal mask over the second film; forming a second conductive film over the third film and the first conductive film; forming a second resist mask over the second conductive film; and forming a fifth conductive layer and a second conductive layer from the second conductive film, a third layer from the third film, a second layer from the second film, and a fourth conductive layer and a first conductive layer that is in contact with the second conductive layer from the first conductive film by removing the second conductive film, the third film, the second film, and the first conductive film that are not covered with the second resist mask.

In the above method for fabricating a display device, it is preferable that a second insulating layer be formed over the second conductive layer, the fifth conductive layer, and the first insulating layer after the fifth conductive layer, the second conductive layer, the third layer, the first layer, the second layer, the fourth conductive layer, and the first conductive layer are formed; a first opening positioned in a region overlapping with the second conductive layer and a second opening positioned in a region overlapping with the fifth conductive layer be formed in the second insulating layer; and a third conductive layer be formed in contact with the second conductive layer through the first opening and in contact with the fifth conductive layer through the second opening.

In the above method for fabricating a display device, it is preferable that the second insulating layer have a stacked-layer structure of a third insulating layer and a fourth insulating layer over the third insulating layer; the third insulating layer be formed by an ALD method; and the fourth insulating layer be formed by a sputtering method.

In the above method for fabricating a display device, it is preferable that the second insulating layer have a stacked-layer structure of a third insulating layer, a fourth insulating layer over the third insulating layer, and a fifth insulating layer over the fourth insulating layer; the third insulating layer and the fifth insulating layer be formed by an ALD method; and the fourth insulating layer be formed by a sputtering method.

In the above method for fabricating a display device, the third film preferably contains a substance with a high electron-injection property. Moreover, the third film preferably contains lithium fluoride.

Alternatively, in the above method for fabricating a display device, the third film preferably contains silver and a compound having an electron deficient heteroaromatic ring.

Effect of the Invention

According to one embodiment of the present invention, a display device with extremely high resolution can be provided. A display device in which high color reproducibility is achieved can be provided. A high-luminance display device can be provided. A highly reliable display device can be provided. A method for manufacturing the above-described display device can be provided.

Note that the description of these effects does not preclude the existence of other effects. One embodiment of the present invention does not need to have all of these effects. Note that effects other than these can be derived from the description of the specification, the drawings, the claims, and the like.

BRIEF DESCRIPTION OF THE DRAWINGS

FIG. 3A to FIG. 3D are diagrams illustrating structure examples of a display device.

FIG. 4A1 to FIG. 4C2 are diagrams illustrating an example of a method for fabricating a display device.

FIG. 5A1 to FIG. 5D2 are diagrams illustrating an example of a method for fabricating a display device.

FIG. 6A1 to FIG. 6C2 are diagrams illustrating an example of a method for fabricating a display device.

FIG. 7A1 to FIG. 7D2 are diagrams illustrating an example of a method for fabricating a display device.

FIG. 8A1 to FIG. 8B2 are diagrams illustrating an example of a method for fabricating a display device.

FIG. 9A1 to FIG. 9C2 are diagrams illustrating an example of a method for fabricating a display device.

FIG. 19A to FIG. 19F are diagrams illustrating examples of electronic devices.

MODE FOR CARRYING OUT THE INVENTION

Figure 1A:
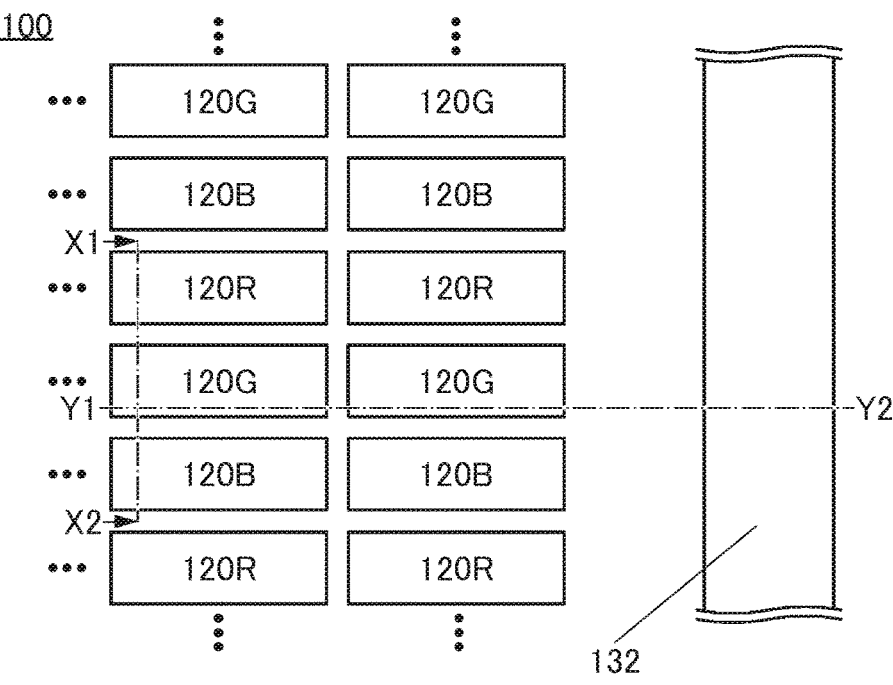
FIG. 1A to FIG. 1C are diagrams illustrating a structure example of a display device.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be interpreted as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, ordinal numbers such as "first" and "second" are used in order to avoid confusion among components and do not limit the number.

In this specification and the like, the term "film" and the term "layer" can be interchanged with each other. For example, in some cases, the term "conductive layer" and the term "insulating layer" can be interchanged with the term "conductive film" and the term "insulating film," respectively.

Note that in this specification, an EL layer means a layer containing at least a light-emitting substance (also referred to as a light-emitting layer) or a stacked-layer body including the light-emitting layer provided between a pair of electrodes of a light-emitting element.

In this specification and the like, a display panel that is one embodiment of a display device has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

In this specification, in the case where the maximum value and the minimum value are specified, a structure in which the maximum value and the minimum value are freely combined is disclosed.

Embodiment 1

In this embodiment, a structure example of a display device of one embodiment of the present invention and an example of a method for fabricating the display device will be described.

The display device of one embodiment of the present invention includes light-emitting elements (also referred to as light-emitting devices) emitting light of different colors. The light-emitting element includes a lower electrode, an upper electrode, and a layer containing a light-emitting compound (also referred to as a light-emitting layer or an EL layer) therebetween. As the light-emitting element, an electroluminescent element such as an organic EL element or an inorganic EL element is preferably used. Alternatively, a light-emitting diode (LED) may be used.

As the EL element, an OLED (Organic Light Emitting Diode), a QLED (Quantum-dot Light Emitting Diode), or the like can be used. Examples of a light-emitting substance contained in the EL element include a substance that emits fluorescent light (a fluorescent material), a substance that emits phosphorescent light (a phosphorescent material), an inorganic compound (e.g., a quantum dot material), and a substance that exhibits thermally activated delayed fluorescence (a thermally activated delayed fluorescent (TADF) material).

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of a hole-transport material and an electron-transport material can be used. Alternatively, as one or more kinds of organic compounds, a bipolar material or a TADF material may be used.

The light-emitting layer preferably contains a phosphorescent material and a combination of a hole-transport material and an electron-transport material that easily forms an exciplex, for example. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of the lowest-energy-side absorption band of the light-emitting substance, energy can be transferred smoothly and light emission can be obtained efficiently. With this structure, high efficiency, low-voltage driving, and a long lifetime of the light-emitting device can be achieved at the same time.

As the light-emitting substance, a substance that exhibits an emission color of blue, purple, bluish purple, green, yellowish green, yellow, orange, red, or the like is used as appropriate. A substance that emits near-infrared light may be used.

The light-emitting layer may contain one or more kinds of compounds (e.g., a host material and an assist material) in addition to the light-emitting substance (a guest material). As the host material and the assist material, one or more kinds of substances whose energy gap is larger than the energy gap of the light-emitting substance (the guest material) can be selected and used. As the host material and the assist material, compounds that form an exciplex are preferably used in combination. In order to form an exciplex efficiently, it is particularly preferable to combine a compound that easily accepts holes (a hole-transport material) and a compound that easily accepts electrons (an electron-transport material).

Either a low molecular compound or a high molecular compound can be used for the light-emitting element, and an inorganic compound (e.g., a quantum dot material) may also be contained.

In the display device of one embodiment of the present invention, the light-emitting elements of different colors can be separately formed with extremely high accuracy. Thus, a display device with higher resolution than a conventional display device can be achieved. For example, the display device preferably has extremely high resolution in which pixels including one or more light-emitting elements are arranged with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

More specific structure examples and fabrication method examples of the display device of one embodiment of the present invention will be described below with reference to drawings.

Structure Example 1

Structure Example 1-1

Figure 1B:
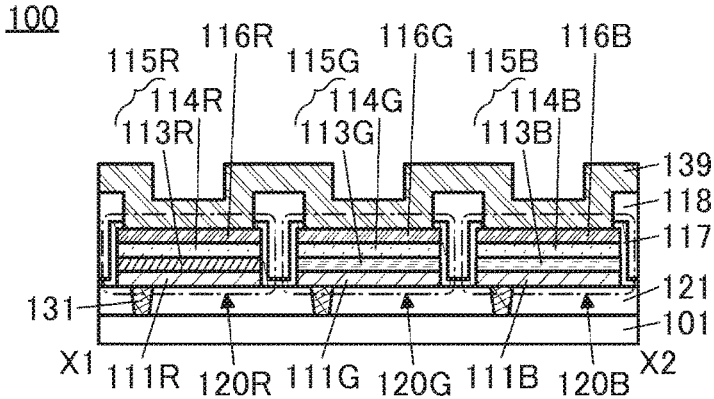
Figure 1C:
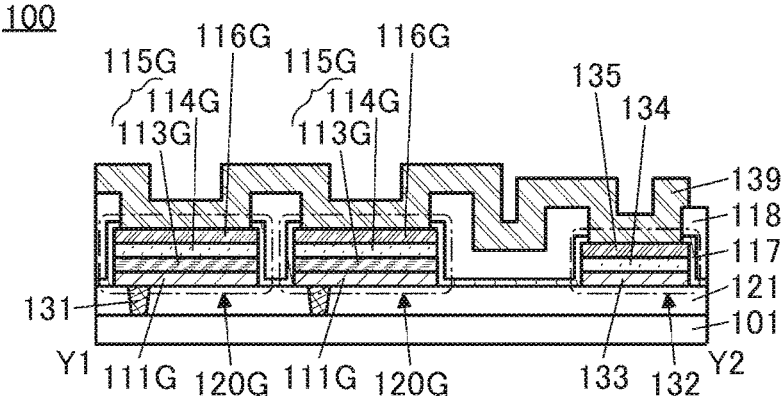

FIG. 1A to FIG. 1C are diagrams illustrating a display device of one embodiment of the present invention. FIG. 1A is a schematic top view of a display device 100, and FIG. 1B and FIG. 1C are schematic cross-sectional views of the display device 100. Here, FIG. 1B is a cross-sectional view of a portion indicated by the dashed-dotted line X1-X2 in FIG. 1A. FIG. 1C is a cross-sectional view of a portion indicated by the dashed-dotted line Y1-Y2 in FIG. 1A. Note that for clarity of the drawing, some components are omitted in the top view of FIG. 1A.

In the case where stripe arrangement illustrated in FIG. 1A is employed for light-emitting elements, the adjacent light-emitting elements emitting different colors are arranged in the X1-X2 direction, and the adjacent light-emitting elements emitting the same color are arranged in the Y1-Y2 direction.

The display device 100 includes an insulating layer 121, a light-emitting element 120R, a light-emitting element 120G, and a light-emitting element 120B. The light-emitting element 120R is a light-emitting element emitting red light, the light-emitting element 120G is a light-emitting element emitting green light, and the light-emitting element 120B is a light-emitting element emitting blue light. In other words, the light-emitting element 120R and the light-emitting element 120G emit light of different colors. The light-emitting element 120G and the light-emitting element 120B emit light of different colors. The light-emitting element 120B and the light-emitting element 120R emit light of different colors. Such a structure in which emission colors (here, red (R), green (G), and blue (B)) are separately patterned for each of the light-emitting elements is referred to as an SBS (Side By Side) structure in some cases.

In this specification and the like, a structure in which light-emitting layers in light-emitting devices of different colors (here, blue (B), green (G), and red (R)) are separately formed or separately patterned may be referred to as an SBS structure. In this specification and the like, a light-emitting device capable of emitting white light may be referred to as a white-light-emitting device. Note that a combination of white-light-emitting devices with coloring layers (e.g., color filters) enables a full-color display device.

Note that in the following description common to the light-emitting element 120R, the light-emitting element 120G, and the light-emitting element 120B, the alphabets added to the reference numerals are omitted and the term "light-emitting element 120" is used in the description in some cases. Similarly, a conductive layer 111R, a conductive layer 111G, and a conductive layer 111B, which are described later, are described using the term "conductive layer 111" in some cases. Similarly, an EL layer 115R, an EL layer 115G, and an EL layer 115B, which are described later, are described using the term "EL layer 115" in some cases. Similarly, a conductive layer 116R, a conductive layer 116G, and a conductive layer 116B, which are described later, are described using the term "conductive layer 116" in some cases. The conductive layer 111R, the EL layer 115R, and the conductive layer 116R are included in the light-emitting element 120R. Similarly, the conductive layer 111G, the EL layer 115G, and the conductive layer 116G are included in the light-emitting element 120G, and the conductive layer 111B, the EL layer 115B, and the conductive layer 116B are included in the light-emitting element 120B.

The combination of colors of light emitted from the light-emitting elements 120 is not limited to the above, and colors such as cyan, magenta, and yellow may be used. Although the example in which three colors of red (R), green (G), and blue (B) are exhibited is shown above, the number of colors of light emitted from the light-emitting elements 120 included in the display device 100 may be two or four or more.

The light-emitting element 120 includes the conductive layer 111 functioning as a lower electrode, the EL layer 115, and the conductive layer 116 functioning as an upper electrode. The conductive layer 116 has a transmissive property and a reflective property with respect to visible light. The EL layer 115 contains a light-emitting compound.

As the light-emitting element 120, it is possible to use an electroluminescent element having a function of emitting light in accordance with current flowing into the EL layer

115 when a potential difference is supplied between the conductive layer 111 and the conductive layer 116. In particular, an organic EL element using a light-emitting organic compound is preferably used for the EL layer 115. In addition, the light-emitting element 120 is preferably an element emitting monochromatic light, which has one peak in the visible light region of the emission spectrum. Note that the light-emitting element 120 may be an element emitting white light, which has two or more peaks in the visible light region of the emission spectrum.

A potential for controlling the amount of light emitted from the light-emitting element 120 is independently supplied to the conductive layer 111 provided in the light-emitting element 120. The conductive layer 111 functions as a pixel electrode, for example.

The EL layer 115 includes at least a layer containing a light-emitting compound. A structure may be employed in which one or more layers selected from an electron-injection layer, an electron-transport layer, a charge-generation layer, a hole-transport layer, and a hole-injection layer are stacked in addition to the above. The EL layer 115 can be formed by, for example, a liquid phase method such as an evaporation method or an inkjet method.

The conductive layer 116 is formed to have a transmissive property and a reflective property with respect to visible light. For example, a metal film or an alloy film that is thin enough to transmit visible light can be used. Alternatively, a light-transmitting conductive film (e.g., a metal oxide film) may be stacked over such a film.

In the display device 100, each of the EL layer 115 and the conductive layer 116 is divided between adjacent light-emitting elements of different colors. Accordingly, current (leakage current) flowing between the adjacent light-emitting elements of different colors through the EL layer 115 can be prevented. Thus, light emission caused by the leakage current can be inhibited, so that display with high contrast can be obtained. Furthermore, even in the case where the resolution is increased, the range of choices for materials can be widened since the EL layer 115 can be formed using a material with high conductivity, which facilitates an improvement in efficiency, a reduction in power consumption, and an improvement in reliability.

The EL layer 115 and the conductive layer 116 may be patterned into an island shape by deposition with use of a shadow mask such as a metal mask; however, it is particularly preferable to employ a processing method using no metal mask. Accordingly, an extremely fine pattern can be formed; thus, resolution and an aperture ratio can be improved as compared to the formation method using a metal mask. A typical example of such a processing method is a photolithography method. Alternatively, a formation method such as a nanoimprinting method or a sandblasting method can be used.

In this specification and the like, a device formed using a metal mask or an FMM (fine metal mask) may be referred to as a device having an MM (metal mask) structure. In this specification and the like, a device formed without using a metal mask or an FMM may be referred to as a device having an MML (metal maskless) structure.

Accordingly, it is possible to achieve an extremely high-resolution display device in which pixels including one or more light-emitting elements are arranged with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

The display device 100 has a structure in which the side surface of the conductive layer 111, the side surface of the EL layer 115, and the side surface of the conductive layer 116 are substantially aligned with each other.

Note that in this specification and the like, the expression "side surfaces are substantially aligned with each other" means that at least outlines of an upper layer and a lower layer partly overlap with each other in a top view. For example, the case of processing the upper layer and the lower layer with the use of the same mask pattern or mask patterns that are partly the same is included. In addition, the expression "side surfaces are substantially aligned with each other" includes the case where side surfaces are aligned with each other. However, in some cases, the outlines do not exactly overlap with each other and the outline of the upper layer is located inward from the outline of the lower layer or the outline of the upper layer is located outward from the outline of the lower layer; such a case is also represented by the expression "side surfaces are substantially aligned with each other".

The insulating layer 121 is provided to have a single layer or a stacked-layer structure of two or more layers. For example, in the case where the insulating layer 121 has a stacked-layer structure of two layers, it is preferable to select, for a layer on the conductive layer 111 side, an insulator functioning as an etching stopper film at the time of forming the conductive layer 111 by etching a conductive film to be the conductive layer 111. For example, when silicon oxide or silicon oxynitride is used for a layer on the substrate 101 side, it is preferable to use silicon nitride, aluminum oxide, hafnium oxide, or the like for the layer on the conductive layer 111 side.

The display device 100 includes a structure body 132.

The structure body 132 functions as a wiring. Alternatively, the structure body 132 functions as a plug that electrically connects a conductive layer 139 and a wiring (not illustrated) positioned below the structure body 132. The structure body 132 includes a conductive layer 133 over the insulating layer 121, a layer 134 over the conductive layer 133, and a conductive layer 135 over the layer 134. The structure body 132 has a structure in which the side surface of the conductive layer 133, the side surface of the layer 134, and the side surface of the conductive layer 135 are substantially aligned with each other.

The conductive layer 133 and the conductive layer 111 contain the same material. The conductive layer 135 and the conductive layer 116 contain the same material. The layer 134 contains a material contained in the EL layer 115.

The structure body 132 functions as a wiring or a plug and thus needs to have conductivity. The layer 134 contains the material contained in the EL layer 115 and thus has a band gap. Hence, the layer 134 preferably has a small thickness. The thickness of the layer 134 is preferably larger than or equal to 0.5 nm and smaller than or equal to 10 nm, further preferably larger than or equal to 1 nm and smaller than or equal to 5 nm. This structure causes the tunnel effect or dielectric breakdown, so that the conductive layer 133 and the conductive layer 135 are electrically connected to each other. Accordingly, the structure body 132 can have conductivity.

The display device 100 includes an insulating layer 117, an insulating layer 118 over the insulating layer 117, and the conductive layer 139.

In the insulating layer 117 and the insulating layer 118, a first opening positioned in a region overlapping with the conductive layer 135 and a second opening positioned in a region overlapping with the conductive layer 116 are formed.

The insulating layer 117 is in contact with part of the top surface of the insulating layer 121, the side surface of the light-emitting element 120, and part of the top surface of the light-emitting element 120. In other words, the insulating layer 117 is in contact with part of the top surface of the insulating layer 121, the side surface of the conductive layer 111, the side surface of the EL layer 115, the side surface of the conductive layer 116, and part of the top surface of the conductive layer 116. In addition, the insulating layer 117 is in contact with the side surface of the structure body 132 and part of the top surface of the structure body 132. In other words, the insulating layer 117 is in contact with the side surface of the conductive layer 133, the side surface of the layer 134, the side surface of the conductive layer 135, and part of the top surface of the conductive layer 135.

An inorganic material is preferably used for the insulating layer 117. Examples of the inorganic material include an inorganic oxide, an inorganic nitride, and an inorganic oxynitride. A single layer or stacked-layer structure including a film containing any of these materials can be used. For example, an aluminum oxide film, a silicon oxide film, or a silicon nitride film can be used as the insulating layer 117. Thus, diffusion of impurities such as water can be inhibited.

A film formed by an atomic layer deposition (ALD) method or the like is preferably used for the insulating layer 117.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition. Thus, the insulating layer 117 can be formed on the side surface of the conductive layer 116, the side surface of the EL layer 115, the side surface of the conductive layer 111, and the like with excellent coverage.

As described above, an aluminum oxide film formed by an ALD method can be suitably used as the insulating layer 117.

For the insulating layer 118, for example, an inorganic material, an organic material, a composite material of an inorganic material and an organic material, or the like is preferably used, and an inorganic material is further preferably used. Examples of the inorganic material include an inorganic oxide, an inorganic nitride, and an inorganic oxynitride. A single layer or stacked-layer structure including a film containing any of these materials can be used. For example, a silicon oxide film, a silicon nitride film, a silicon oxynitride film, an aluminum oxide film, an indium gallium zinc oxide film (also referred to as an IGZO film), or the like can be used as the insulating layer 118. A single layer or stacked-layer structure including any of these films can be used. Note that a silicon nitride film is a dense film having an excellent function of inhibiting diffusion of impurities such as water and thus can be suitably used as the insulating layer 118.

Alternatively, for example, the insulating layer 118 contains polyester, polyolefin, polyamide, polyimide, polycarbonate, polysiloxane, an acrylic resin, or the like. Alternatively, the insulating layer 118 may have a stacked-layer structure of any of these materials. Alternatively, the insulating layer 118 may be formed using a composite material of any of these materials.

Alternatively, an organic material such as a reactive curable adhesive, a photocurable adhesive, a thermosetting adhesive, or/and an anaerobic adhesive may be used for the insulating layer 118, for example.

Although the insulating layer 117 and the insulating layer 118 are provided in the display device 100, one embodiment of the present invention is not limited thereto. For example, a structure may be employed in which the insulating layer 117 is provided and the insulating layer 118 is not provided. A structure may also be employed in which the insulating layer 117 is not provided and the insulating layer 118 is provided. Alternatively, one or both of the insulating layer 117 and the insulating layer 118 may have a stacked-layer structure.

The conductive layer 139 includes a region in contact with the conductive layer 135 through the first opening formed in the insulating layer 117 and the insulating layer 118 and a region in contact with the conductive layer 116 through the second opening formed in the insulating layer 117 and the insulating layer 118. With this structure, the conductive layer 116 and the conductive layer 135 can be electrically connected to each other.

The conductive layer 139 can be formed using the conductive film that can be used for the conductive layer 111, the conductive layer 116, or the like.

With the above structure, the EL layers can be separately formed in the light-emitting elements 120 of different colors, whereby color display with high color reproducibility can be performed with low power consumption. In addition, a microcavity structure can be given when the thickness of the EL layer in the light-emitting element 120 is adjusted in accordance with a peak wavelength of an emission spectrum, so that a high luminance display device can be achieved. Moreover, the light-emitting elements 120 can be arranged extremely densely. For example, a display device having resolution exceeding 2000 ppi can be achieved.

Although the preferred arrangement of the light-emitting elements 120 is stripe arrangement, arrangement other than the stripe arrangement may be employed. Examples of the arrangement of the light-emitting elements 120 include delta arrangement and mosaic arrangement.

In the display device 100, the insulating layer 121, the light-emitting element 120R, the light-emitting element 120G, and the light-emitting element 120B are provided over the substrate 101 provided with a semiconductor circuit. The display device 100 also includes a plug 131.

A circuit substrate including a transistor, a wiring, and the like can be used as the substrate 101. Note that in the case where either a passive matrix method or a segment method can be employed, an insulating substrate such as a glass substrate can be used as the substrate 101. The substrate 101 is a substrate provided with a circuit for driving the light-emitting elements (also referred to as a pixel circuit) or a semiconductor circuit functioning as a driver circuit for driving the pixel circuit. More specific structure examples of the substrate 101 will be described later.

The substrate 101 and the conductive layer 111 of the light-emitting element 120 are electrically connected to each other through the plug 131. The plug 131 is formed to be embedded in an opening formed in the insulating layer 121. The conductive layer 111 is provided in contact with the top surface of the plug 131.

Structure Example 1-2

Figure 2A:
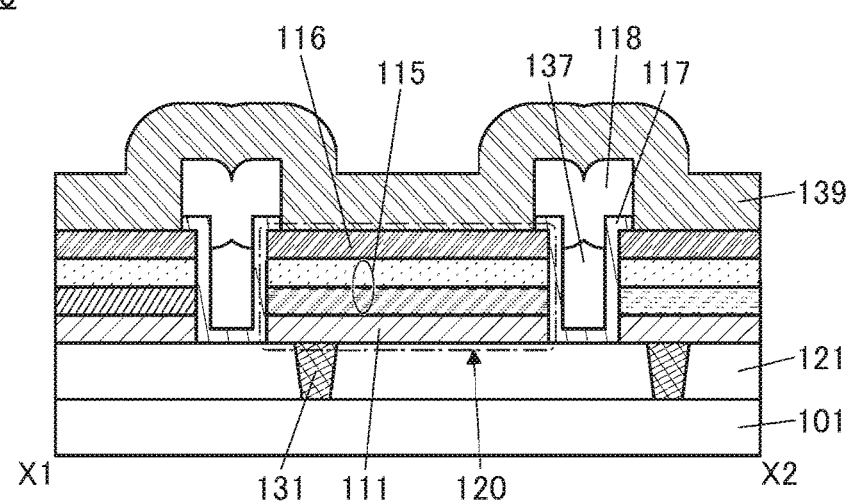
FIG. 2A to FIG. 2C are diagrams illustrating structure examples of a display device.

The display device 100 may include a gap between the insulating layer 117 and the insulating layer 118. FIG. 2A is a schematic cross-sectional view of the display device 100 including a gap 137 between the insulating layer 117 and the insulating layer 118.

As illustrated in FIG. 2A, the gap 137 is positioned in a region between the insulating layer 117 and the insulating layer 118 that does not overlap with the conductive layer 116.

The gap 137 contains, for example, any one or more selected from air, nitrogen, oxygen, carbon dioxide, and Group 18 elements. The gap 137 sometimes contains a gas that is used for forming an insulating film to be the insulating layer 118, for example. In the case where the insulating film to be the insulating layer 118 is formed by a sputtering method, for example, the gap 137 may contain a Group 18 element (typically, helium, neon, argon, xenon, krypton, or the like). In the case where the gap 137 contains a gas, the gas can be identified with a gas chromatography method or the like. Alternatively, in the case where the insulating film to be the insulating layer 118 is formed by a sputtering method, a gas used in the sputtering is sometimes contained in the insulating layer 118. In that case, an element such as argon is sometimes detected when the insulating layer 118 is analyzed by an energy dispersive X-ray analysis (EDX analysis) or the like.

In the case where the refractive index of the gap 137 is lower than the refractive index of the EL layer 115, light that is emitted from the EL layer 115 and is incident on an interface between the EL layer 115 and the gap 137 is totally reflected. This can inhibit entry of the light into the adjacent light-emitting element. Specifically, light emitted from the EL layer 115R can be inhibited from entering the light-emitting element 120G or the light-emitting element 120B. In addition, light emitted from the EL layer 115G can be inhibited from entering the light-emitting element 120R or the light-emitting element 120B. Moreover, light emitted from the EL layer 115B can be inhibited from entering the light-emitting element 120R or the light-emitting element 120G. This structure can inhibit mixture of light of different colors, so that the display device 100 can display a high-quality image.

Structure Example 1-3

Figure 2B:
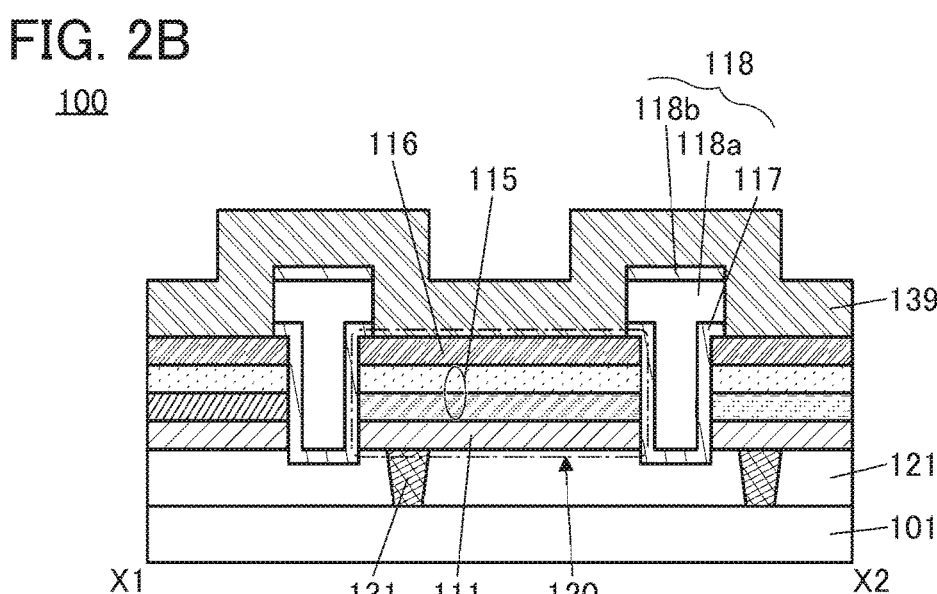

The insulating layer 118 may have a stacked-layer structure of an insulating layer 118a and an insulating layer 118b. FIG. 2B is a schematic cross-sectional view of the display device 100 in which the insulating layer 118 has a stacked-layer structure of the insulating layer 118a and the insulating layer 118b.

The insulating layer 118 includes the insulating layer 118a over the insulating layer 117 and the insulating layer 118b over the insulating layer 118a.

The insulating layer 118a and the insulating layer 118b differ in a material and/or a film formation method. For example, it is preferable to use a silicon nitride film formed by a sputtering method as the insulating layer 118a, and a silicon nitride film formed by a PEALD method as the insulating layer 118b. Thus, in the case where a pinhole, disconnection, or the like is formed in the film formed by a sputtering method, a portion overlapping with the pinhole, the disconnection, or the like can be filled with the film formed by an ALD method with excellent coverage.

Note that the insulating layer 118 may have a stacked-layer structure of three or more films formed using different materials and/or different film formation methods.

As illustrated in FIG. 2B, the insulating layer 121 may have a depression in a region not overlapping with the conductive layer 111.

Structure Example 1-4

Figure 2C:
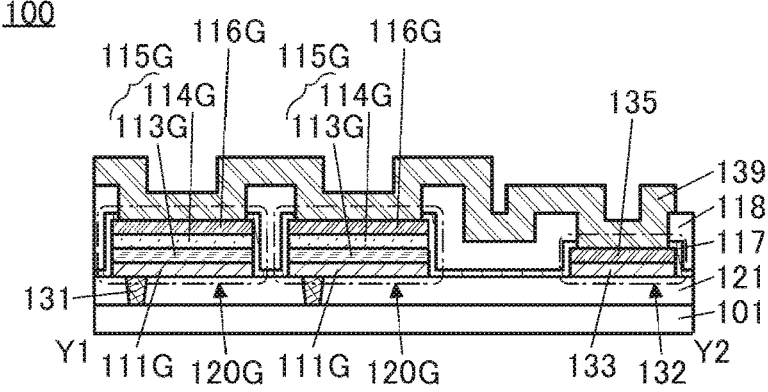

The structure body 132 does not include the layer 134 in some cases. FIG. 2C is a schematic cross-sectional view of the display device 100 including the structure body 132 formed of the conductive layer 133 and the conductive layer 135.

The structure body 132 includes the conductive layer 133 over the insulating layer 121 and the conductive layer 135 over the conductive layer 133. With this structure, the structure body 132 can have conductivity regardless of a material used for the EL layer 115. Accordingly, the structure body 132 can have a function of a wiring or a plug.

[Components]
[Light-Emitting Element]

As a light-emitting element that can be used as the light-emitting element 120, a self-luminous element can be used, and an element whose luminance is controlled by current or voltage is included in the category. For example, an LED, an organic EL element, an inorganic EL element, or the like can be used. In particular, an organic EL element is preferably used.

The light-emitting element has a top-emission structure, a bottom-emission structure, a dual-emission structure, or the like. A conductive film that transmits visible light is used as an electrode through which light is extracted. A conductive film that reflects visible light is used as an electrode through which no light is extracted.

In one embodiment of the present invention, a top-emission light-emitting element in which light is emitted to the opposite side of the formation surface or a dual-emission light-emitting element can be particularly suitably used.

The EL layer 115 includes at least a light-emitting layer. In addition to the light-emitting layer, the EL layer 115 may further include layers containing a substance with a high hole-injection property, a substance with a high hole-transport property, a hole-blocking material, a substance with a high electron-transport property, a substance with a high electron-injection property, an electron-blocking material, a substance with a bipolar property (a substance with a high electron-transport property and a high hole-transport property), and the like.

Either a low molecular compound or a high molecular compound can be used for the EL layer 115, and an inorganic compound may also be contained. The layers that constitute the EL layer 115 can each be formed by a method such as an evaporation method (including a vacuum evaporation method), a transfer method, a printing method, an inkjet method, or a coating method.

When a voltage higher than the threshold voltage of the light-emitting element 120 is applied between a cathode and an anode, holes are injected to the EL layer 115 from the anode side and electrons are injected to the EL layer 115 from the cathode side. The injected electrons and holes are recombined in the EL layer 115 and a light-emitting substance contained in the EL layer 115 emits light.

In the case where a light-emitting element emitting white light is used as the light-emitting element 120, the EL layer 115 preferably contains two or more kinds of light-emitting substances. For example, a white light emission can be obtained by selecting light-emitting substances such that two or more light-emitting substances emit light of complementary colors. For example, it is preferable to contain two or more out of light-emitting substances emitting light of R (red), G (green), B (blue), Y (yellow), 0 (orange), and the like or light-emitting substances emitting light containing two or more of spectral components of R, G, and B. A light-emitting element whose emission spectrum has two or more peaks in the wavelength range of a visible light region (e.g., 350 nm to 750 nm) is preferably employed. An emission spectrum of a material emitting light having a peak in a yellow wavelength range preferably includes spectral components also in green and red wavelength ranges.

The EL layer 115 preferably has a structure in which a light-emitting layer containing a light-emitting material emitting light of one color and a light-emitting layer containing a light-emitting material emitting light of another color are stacked. For example, the plurality of light-emitting layers in the EL layer 115 may be stacked in contact with each other or may be stacked with a region not containing any light-emitting material therebetween. For example, between a fluorescent light-emitting layer and a phosphorescent light-emitting layer, a region that contains the same material as the fluorescent light-emitting layer or phosphorescent light-emitting layer (for example, a host material or an assist material) and no light-emitting material may be provided. This facilitates the fabrication of the light-emitting element and reduces the drive voltage.

The light-emitting element 120 may be a single element (also referred to as a device with a single structure) including one EL layer or a tandem element (also referred to as a device with a tandem structure) in which a plurality of EL layers are stacked with a charge-generation layer therebetween.

A device with a single structure includes one light-emitting unit between a pair of electrodes, and the light-emitting unit preferably includes one or more light-emitting layers. To obtain white light emission, two or more light-emitting layers are selected such that emission colors of the light-emitting layers are complementary colors. For example, when emission colors of a first light-emitting layer and a second light-emitting layer are complementary colors, the light-emitting device can be configured to emit white light as a whole. The same applies to a light-emitting device including three or more light-emitting layers.

A device with a tandem structure includes two or more light-emitting units between a pair of electrodes, and each light-emitting unit preferably includes one or more light-emitting layers. To obtain white light emission, the structure is made such that light from light-emitting layers of the plurality of light-emitting units can be combined to be white light. Note that a structure for obtaining white light emission is similar to a structure in the case of a single structure. In the device with a tandem structure, it is suitable that an intermediate layer such as a charge-generation layer is provided between the plurality of light-emitting units.

When the white-light-emitting device (with a single structure or a tandem structure) and a light-emitting device with an SBS structure are compared to each other, the light-emitting device with an SBS structure can have lower power consumption than the white-light-emitting device. To reduce power consumption, a light-emitting device with an SBS structure is preferably used. Meanwhile, the white-light-emitting device is preferable in terms of lower manufacturing cost or higher manufacturing yield because the manufacturing process of the white-light-emitting device is simpler than that of a light-emitting device with an SBS structure.

The conductive film that can be used for the conductive layer 111 or the like and transmits visible light can be formed using, for example, indium oxide, indium tin oxide, indium zinc oxide, zinc oxide, or zinc oxide to which gallium is added. Alternatively, a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like formed thin enough to have a light-transmitting property can be used. A stacked-layer film of any of the above materials can be used for the conductive layer. For example, a stacked-layer film of indium tin oxide and an alloy of silver and magnesium is preferably used, in which case conductivity can be increased. Further alternatively, graphene or the like may be used.

For a portion of the conductive layer 111 that is positioned on the EL layer 115 side, the conductive film that reflects visible light is preferably used. For the conductive film, for example, a metal material such as aluminum, gold, platinum, silver, nickel, tungsten, chromium, molybdenum, iron, cobalt, copper, or palladium or an alloy containing any of these metal materials can be used. Silver is preferable because of its high reflectance with respect to visible light. In addition, aluminum is preferable because an aluminum electrode is easily etched and thus is easily processed and aluminum has high reflectance with respect to visible light and near-infrared light. Lanthanum, neodymium, germanium, or the like may be added to the above metal material or alloy. Alternatively, an alloy (an aluminum alloy) containing aluminum and titanium, nickel, or neodymium may be used. Alternatively, an alloy containing silver and copper, palladium, or magnesium may be used. An alloy containing silver and copper is preferable because of its high heat resistance.

The conductive layer 111 may have a structure in which a conductive metal oxide film is stacked over a conductive film that reflects visible light. Such a structure can inhibit oxidation, corrosion, or the like of the conductive film that reflects visible light. For example, when a metal film or a metal oxide film is stacked in contact with an aluminum film or an aluminum alloy film, oxidation can be inhibited. Examples of a material for the metal film or the metal oxide film include titanium and titanium oxide. Alternatively, the above conductive film that transmits visible light and a film containing a metal material may be stacked. For example, a stacked-layer film of silver and indium tin oxide or a stacked-layer film of an alloy of silver and magnesium and indium tin oxide can be used.

When aluminum is used for the conductive layer 111, the thickness of aluminum is preferably larger than or equal to 40 nm, further preferably larger than or equal to 70 nm, in which case the reflectance with respect to visible light or the like can be sufficiently increased. When silver is used for the conductive layer 111, the thickness of silver is preferably larger than or equal to 70 nm, further preferably larger than or equal to 100 nm, in which case the reflectance with respect to visible light or the like can be sufficiently increased.

As the conductive film having a light-transmitting property and a reflective property that can be used for the conductive layer 116, the conductive film reflecting visible light that is formed to be thin enough to transmit visible light can be used. In addition, with a stacked-layer structure of the conductive film and the conductive film transmitting visible light, the conductivity, the mechanical strength, or the like can be increased.

The conductive film having a light-transmitting property and a reflective property preferably has a reflectance with respect to visible light (e.g., the reflectance with respect to light having a specific wavelength within the range of 400 nm to 700 nm) that is higher than or equal to 20% and lower than or equal to 80%, preferably higher than or equal to 40% and lower than or equal to 70%. The conductive film having a reflective property preferably has a reflectance with respect to visible light that is higher than or equal to 40% and lower than or equal to 100%, further preferably higher than or equal to 70% and lower than or equal to 100%. The conductive film having a light-transmitting property preferably has a reflectance with respect to visible light that is higher than or equal to 0% and lower than or equal to 40%, further preferably higher than or equal to 0% and lower than or equal to 30%.

For the conductive layer 111 functioning as a lower electrode, for example, a metal material such as aluminum, yttrium, zirconium, gold, silver, platinum, magnesium, nickel, tungsten, chromium, molybdenum, iron, cobalt, copper, palladium, tantalum, or titanium; an alloy containing any of these metal materials; or a nitride of any of these metal materials (e.g., titanium nitride) can be used. This material can also be suitably used as a conductive film of the plug 131.

The electrodes constituting the light-emitting elements may each be formed by an evaporation method, a sputtering method, or the like. Alternatively, a discharging method such as an inkjet method, a printing method such as a screen printing method, or a plating method may be used for the formation.

Note that the aforementioned light-emitting layer and layers containing a substance with a high hole-injection property, a substance with a high hole-transport property, a substance with a high electron-transport property, a substance with a high electron-injection property, a substance with a bipolar property, and the like may contain an inorganic compound such as a quantum dot or a high molecular compound (e.g., an oligomer, a dendrimer, or a polymer). For example, when used for the light-emitting layer, the quantum dots can function as a light-emitting material.

Note that as the quantum dot material, a colloidal quantum dot material, an alloyed quantum dot material, a core-shell quantum dot material, a core quantum dot material, or the like can be used. A material containing elements belonging to Group 12 and Group 16, elements belonging to Group 13 and Group 15, or elements belonging to Group 14 and Group 16 may be used. Alternatively, a quantum dot material containing an element such as cadmium, selenium, zinc, sulfur, phosphorus, indium, tellurium, lead, gallium, arsenic, or aluminum may be used.

In each of the light-emitting elements, the optical distance between the surface of the reflective layer reflecting visible light and the conductive layer 116 having a light-transmitting property and a reflective property with respect to visible light is preferably adjusted to be m×λ/2 (m is an integer greater than or equal to 1) or in the vicinity thereof, where λ is the wavelength of light whose intensity is desired to be increased.

To be exact, the above-described optical distance depends on a product of the physical distance between the reflective surface of the reflective layer and the reflective surface of the conductive layer 116 having a light-transmitting property and a reflective property and the refractive index of a layer provided therebetween, and thus is difficult to adjust precisely. Thus, it is preferable to adjust the optical distance on the assumption that the surface of the reflective layer and the surface of the conductive layer 116 having a light-transmitting property and a reflective property are each the reflective surface.

Examples of a material that can be used for the plug 131 include metals such as aluminum, titanium, chromium, nickel, copper, yttrium, zirconium, molybdenum, gold, silver, platinum, magnesium, iron, cobalt, palladium, tantalum, and tungsten; an alloy containing any of these metal materials; and a nitride of any of these metal materials. As the plug 131, a single layer or stacked-layer structure including a film containing any of these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. Copper containing manganese is preferably used because it increases controllability of a shape by etching.

Structure Example of EL Layer 115

Figures 3A, 3B, 3C, 3D:
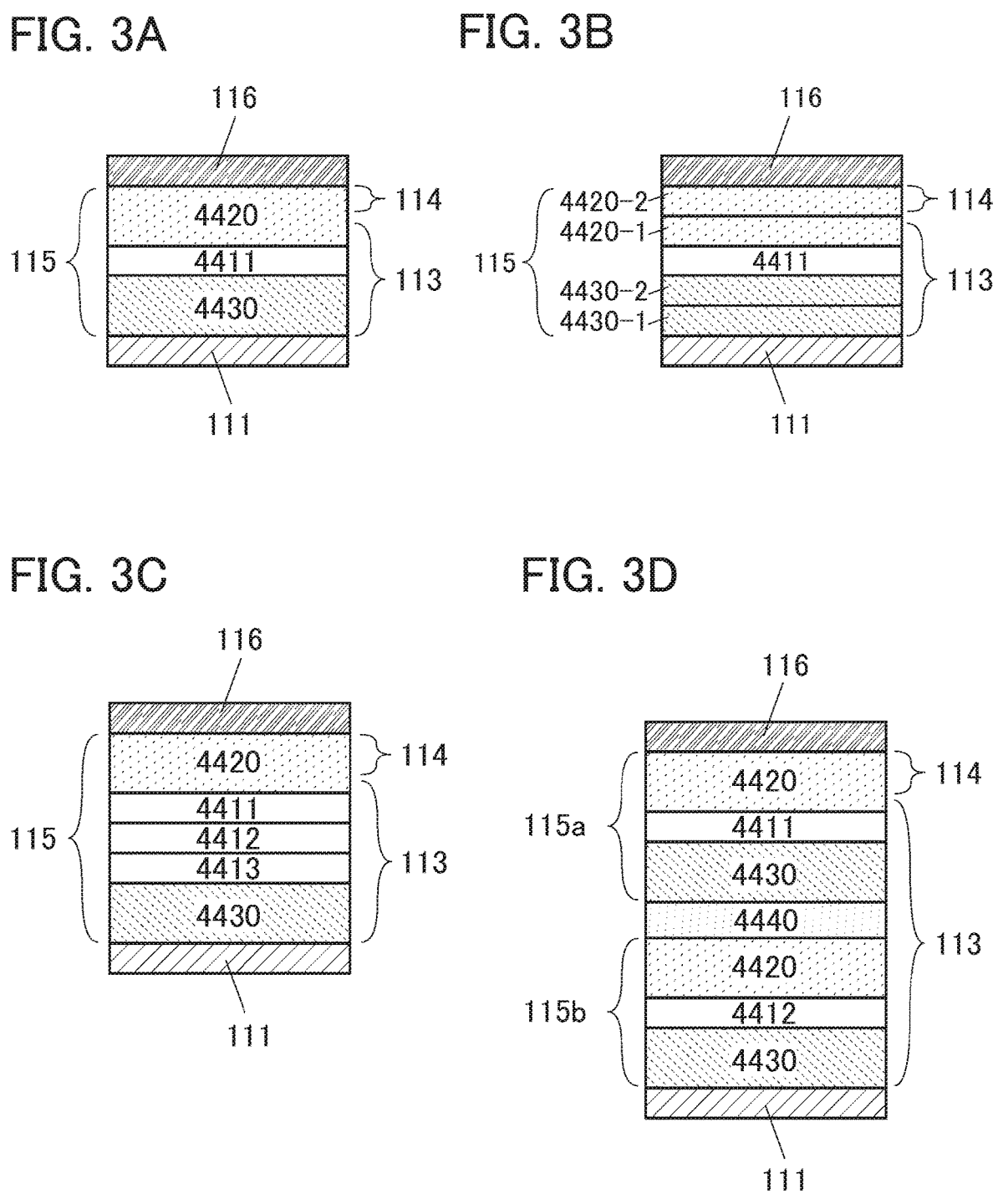

The EL layer 115 included in the light-emitting element 120 can be formed of a plurality of layers such as a layer 4420, a light-emitting layer 4411, and a layer 4430, as illustrated in FIG. 3A. In the case where the conductive layer 111 functions as an anode and the conductive layer 116 functions as a cathode, the layer 4420 can include a layer containing a substance with a high electron-injection property (an electron-injection layer) and a layer containing a substance with a high electron-transport property (an electron-transport layer), for example. The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer). In the case where the conductive layer 111 functions as a cathode and the conductive layer 116 functions as an anode, the layer 4420 can include a hole-injection layer, a hole-transport layer, and the like, the light-emitting layer 4411 can include a light-emitting compound and the like, and the layer 4430 can include an electron-injection layer, an electron-transport layer, and the like, for example.

The structure including the layer 4420, the light-emitting layer 4411, and the layer 4430, which is provided between a pair of electrodes, can function as one light-emitting unit, and the structure in FIG. 3A is referred to as a single structure in this specification.

FIG. 3B is a modification example of the EL layer 115 included in the light-emitting element 120 illustrated in FIG. 3A. Specifically, the light-emitting element 120 illustrated in FIG. 3B includes a layer 4430-1 over the conductive layer 111, a layer 4430-2 over the layer 4430-1, the light-emitting layer 4411 over the layer 4430-2, a layer 4420-1 over the light-emitting layer 4411, a layer 4420-2 over the layer 4420-1, and the conductive layer 116 over the layer 4420-2. For example, when the conductive layer 111 is an anode and the conductive layer 116 is a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the conductive layer 111 is a cathode and the conductive layer 116 is an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layer structure, carriers can be efficiently injected to the light-emitting layer 4411, and the efficiency of the recombination of carriers in the light-emitting layer 4411 can be enhanced.

Note that a structure in which a plurality of light-emitting layers (the light-emitting layer 4411, a light-emitting layer 4412, and a light-emitting layer 4413) are provided between the layer 4420 and the layer 4430 as illustrated in FIG. 3C is a variation of the single structure.

A structure in which a plurality of light-emitting units (an EL layer 115a and an EL layer 115b) are connected in series with an intermediate layer 4440 therebetween as illustrated in FIG. 3D is referred to as a tandem structure in this specification. Note that the intermediate layer 4440 is sometimes referred to as a charge-generation layer. In this specification and the like, the structure illustrated in FIG. 3D is referred to as a tandem structure; however, without being limited to this, the tandem structure may be referred to as a stack structure, for example. Note that the tandem structure enables a light-emitting element to emit light at high luminance.

Also in FIG. 3C and FIG. 3D, the layer 4420 and the layer 4430 may each have a stacked-layer structure of two or more layers as illustrated in FIG. 3B.

Note that the EL layer 115 has a stacked-layer structure of two layers in FIG. 1B and FIG. 1C. For example, the EL layer 115R includes a layer 113R and a layer 114R over the layer 113R. The EL layer 115G includes a layer 113G and a layer 114G over the layer 113G. The EL layer 115B includes a layer 113B and a layer 114B over the layer 113B.

In the following description common to the layer 113R, the layer 113G, and the layer 113B, the alphabets added to the reference numerals are omitted and the term "layer 113" is used in the description in some cases. Similarly, the layer 114R, the layer 114G, and the layer 114B are described using the term "layer 114" in some cases.

In the case where the conductive layer 111 functions as an anode and the conductive layer 116 functions as a cathode, the layer 114 is a layer including at least an electron-injection layer, e.g., an electron-injection layer. The layer 113 includes all the layers included in the EL layer 115 besides the layer 114. In the case where the light-emitting element 120 includes an electron-injection layer and an electron-transport layer as the layer 4420 and the layer 114 is the electron-injection layer, for example, the layer 113 included in the light-emitting element 120 illustrated in FIG. 3A includes the electron-transport layer, the light-emitting layer 4411, and the layer 4430. The layer 113 included in the light-emitting element 120 illustrated in FIG. 3B includes the layer 4420-1, the light-emitting layer 4411, the layer 4430-2, and the layer 4430-1. The layer 113 included in the light-emitting element 120 illustrated in FIG. 3C includes the electron-transport layer, the light-emitting layer 4411, the light-emitting layer 4412, the light-emitting layer 4413, and the layer 4430. The layer 113 included in the light-emitting element 120 illustrated in FIG. 3D includes the electron-transport layer, the light-emitting layer 4411, the layer 4430, the intermediate layer 4440, and the EL layer 115b.

In the above structure, the layer 114 and the layer 134 contain the same material. Note that the expression "contain the same material" refers to the case of containing the same constituent material and having substantially the same compositions. The thickness of the layer 134 is substantially equal to the thickness of the layer 114.

[Hole-Injection Layer]

The hole-injection layer is a layer that injects holes from an anode to the hole-transport layer and contains a material with a high hole-injection property. Examples of the material with a high hole-injection property include an aromatic amine compound and a composite material containing a hole-transport material and an acceptor material (electron-accepting material).

[Hole-Transport Layer]

The hole-transport layer is a layer that transports holes, which are injected from the anode by the hole-injection layer, to the light-emitting layer. The hole-transport layer is a layer containing a hole-transport material. As the hole-transport material, a substance having a hole mobility greater than or equal to $1 \times 10^{-6}$ cm$^2$/Vs is preferable. Note that other substances can also be used as long as they have a property of transporting more holes than electrons. As the hole-transport material, materials with a high hole-transport property, such as a π-electron rich heteroaromatic compound (e.g., a carbazole derivative, a thiophene derivative, and a furan derivative) and an aromatic amine (a compound having an aromatic amine skeleton), are preferable.

[Electron-Transport Layer]

The electron-transport layer is a layer that transports electrons, which are injected from a cathode by the electron-injection layer, to the light-emitting layer. The electron-transport layer is a layer containing an electron-transport material. As the electron-transport material, a substance having an electron mobility greater than or equal to $1 \times 10^{-6}$ cm$^2$/Vs is preferable. Note that other substances can also be used as long as they have a property of transporting more electrons than holes. As the electron-transport material, it is possible to use a material with a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

[Electron-Injection Layer]

The electron-injection layer is a layer that contains a substance having a high electron-injection property. The electron-injection layer is a layer for increasing the efficiency of electron injection from the conductive layer 116 and is preferably formed using a material whose LUMO level value has a small difference (0.5 eV or less) from the work function value of the material used for the conductive layer 116. Thus, the electron-injection layer can be formed using an alkali metal, an alkaline earth metal, or a compound thereof, such as lithium, cesium, lithium fluoride (LiF), cesium fluoride (CsF), calcium fluoride (CaF$_2$), 8-(quinolinolato)lithium (abbreviation: Liq), 2-(2-pyridyl)phenolato-lithium (abbreviation: LiPP), 2-(2-pyridyl)-3-pyridinolato-lithium (abbreviation: LiPPy), 4-phenyl-2-(2-pyridyl) phenolatolithium (abbreviation: LiPPP), lithium oxide ($LiO_x$), or cesium carbonate. A rare earth metal compound like erbium fluoride ($ErF_3$) can also be used. In addition, an electride may be used for the electron-injection layer. Examples of the electride include a substance in which electrons are added at high concentration to a mixed oxide of calcium and aluminum. Any of the substances for forming the electron-transport layer can also be used.

A composite material in which an organic compound and an electron donor (donor) are mixed may also be used for the electron-injection layer. Such a composite material is excellent in an electron-injection property and an electron-transport property because electrons are generated in the organic compound by the electron donor. The organic compound here is preferably a material excellent in transporting the generated electrons; specifically, for example, the electron-transport materials used for the electron-transport layer (e.g., a metal complex or a heteroaromatic compound) can be used. As the electron donor, a substance showing an electron-donating property with respect to the organic compound may be used. Specifically, an alkali metal, an alkaline earth metal, and a rare earth metal element are preferable, and lithium, cesium, magnesium, calcium, erbium, ytterbium, and the like are given as examples. In addition, an alkali metal oxide and an alkaline earth metal oxide are preferable, and lithium oxide, calcium oxide, barium oxide, and the like are given as examples. A Lewis base such as magnesium oxide can be used. Furthermore, an organic compound such as tetrathiafulvalene (abbreviation: TTF) can be used.

A composite material in which an organic compound and a metal are mixed may also be used for the electron-injection layer. Note that the organic compound used here preferably has a LUMO (Lowest Unoccupied Molecular Orbital) level higher than or equal to −3.6 eV and lower than or equal to −2.3 eV. Moreover, a material having an unshared electron pair is preferable. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

Thus, the above organic compound is preferably a material having an unshared electron pair, such as a heterocyclic compound having a pyridine skeleton, a diazine (pyrimidine, pyrazine, or the like) skeleton, or a triazine skeleton.

Examples of the heterocyclic compound having a pyridine skeleton include 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), bathocuproine (abbreviation: BCP), 2,9-bis(naphthalen-2-yl)-4,7-diphenyl-1,10-phenanthroline (abbreviation: NBPhen), and bathophenanthroline (abbreviation: BPhen). Note that NBPhen has a higher glass transition temperature (Tg) than BPhen and thus has high heat resistance.

Examples of the heterocyclic compound having a diazine skeleton include 2-[3-(dibenzothiophen-4-yl)phenyl] dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-

(dibenzothiophen-4-yl)phenyl]dibenzo[f,h]quinoxaline (abbreviation: 6mDBTPDBq-II), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), and 4-{3-[3'-(9H-carbazol-9-yl)]biphenyl-3-yl}benzofuro[3,2-d]pyrimidine (abbreviation: 4mCzBPBfpm).

Examples of the heterocyclic compound having a triazine skeleton include 2-{4-[3-(N-phenyl-9H-carbazol-3-yl)-9H-carbazol-9-yl]phenyl}-4,6-diphenyl-1,3,5-triazine (abbreviation: PCCzPTzn), 2,4,6-tris[3'-(pyridin-3-yl)biphenyl-3-yl]-1,3,5-triazine (abbreviation: TmPPPyTz), and 2,4,6-tris (2-pyridyl)-1,3,5-triazine (abbreviation: 2Py3Tz).

As a metal, a transition metal belonging to Group 5, Group 7, Group 9, or Group 11 or a material belonging to Group 13 of the periodic table is preferably used. Examples of the metal include silver (Ag), copper (Cu), aluminum (Al), and indium (In). Here, the organic compound forms a singly occupied molecular orbital (SOMO) with the metal.

The thickness of the electron-injection layer is preferably larger than or equal to 3 nm, further preferably larger than or equal to 5 nm. The thickness of the electron-injection layer is preferably smaller than or equal to 50 nm, further preferably smaller than or equal to 20 nm, still further preferably smaller than or equal to 10 nm. This structure reduces the influence of light absorption by the electron-injection layer, whereby the light-emitting element can have high emission efficiency. Note that the thickness of the electron-injection layer is not limited to the above as long as the layer can function as an electron-injection layer. For example, the thickness of the electron-injection layer may be larger than or equal to 0.5 nm, or larger than or equal to 1 nm. The thickness of the electron-injection layer may be smaller than or equal to 100 nm.

Fabrication Method Example

An example of a method for fabricating the display device of one embodiment of the present invention will be described with reference to FIG. 4 to FIG. 9.

Note that A1, B1, C1, and D1 of each of FIG. 4 to FIG. 9 are cross-sectional views taken along the dashed-dotted line X1-X2 in FIG. 1A. In addition, A2, B2, C2, and D2 of each drawing are cross-sectional views taken along the dashed-dotted line Y1-Y2 in FIG. 1A.

Note that thin films that constitute the display device (insulating films, semiconductor films, conductive films, and the like) can be formed by a sputtering method, a chemical vapor deposition (CVD) method, a vacuum evaporation method, a pulsed laser deposition (PLD) method, an ALD method, or the like. Examples of the CVD method include a plasma-enhanced chemical vapor deposition (PECVD: Plasma Enhanced CVD) method and a thermal CVD method. An example of a thermal CVD method is a metal organic chemical vapor deposition (MOCVD) method.

Alternatively, thin films that constitute the display device (insulating films, semiconductor films, conductive films, and the like) can be formed by a method such as spin coating, dipping, spray coating, ink-jetting, dispensing, screen printing, offset printing, a doctor knife, a slit coater, a roll coater, a curtain coater, and a knife coater.

When the thin films that constitute the display device are processed, a photolithography method or the like can be used for the processing. Besides, a nanoimprinting method, a sandblasting method, a lift-off method, or the like may be used for the processing of the thin films. Alternatively, island-shaped thin films may be directly formed by a film formation method using a shielding mask such as a metal mask. Note that in this specification and the like, the term "island shape" refers to a state where two or more layers formed using the same material in the same step are physically separated from each other.

There are the following two typical examples of a photolithography method. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, it is possible to use light with an i-line (wavelength: 365 nm), light with a g-line (wavelength: 436 nm), light with an h-line (wavelength: 405 nm), or combined light of any of them. Alternatively, ultraviolet light, KrF laser light, ArF laser light, or the like can be used. Exposure may be performed by liquid immersion exposure technique. As the light used for the exposure, extreme ultraviolet (EUV) light or X-rays may be used. Furthermore, instead of the light used for the exposure, an electron beam can also be used. It is preferable to use extreme ultraviolet light, X-rays, or an electron beam because extremely fine processing can be performed. Note that a photomask is not needed when exposure is performed by scanning with a beam such as an electron beam.

For processing of the thin film, a dry etching method, a wet etching method, a sandblasting method, or the like can be used. Note that the resist mask can be removed by dry etching treatment such as ashing, wet etching treatment, wet etching treatment after dry etching treatment, or dry etching treatment after wet etching treatment.

For the planarization treatment of the thin film, typically, a polishing method such as a chemical mechanical polishing (CMP) method or the like can be suitably used. Alternatively, dry etching treatment or plasma treatment may be used. Note that polishing treatment, dry etching treatment, or plasma treatment may be performed a plurality of times, or these treatments may be performed in combination. In the case where the treatments are performed in combination, the order of steps is not particularly limited and may be set as appropriate depending on the roughness of the surface to be processed.

In order to accurately process the thin film to have a desired thickness, for example, the CMP method is employed. In that case, first, polishing is performed at a constant processing rate until part of the top surface of the thin film is exposed. After that, polishing is performed under a condition with a lower processing rate until the thin film has a desired thickness, so that highly accurate processing can be performed.

Examples of a method for detecting the end of the polishing include an optical method in which the surface to be processed is irradiated with light and a change in the reflected light is detected; a physical method in which a change in the polishing resistance received by the processing apparatus from the surface to be processed is detected; and a method in which a magnetic line is applied to the surface to be processed and a change in the magnetic line due to the generated eddy current is used.

After the top surface of the thin film is exposed, polishing treatment is performed under a condition with a low processing rate while the thickness of the thin film is monitored by an optical method using a laser interferometer or the like, whereby the thickness of the thin film can be controlled with high accuracy. Note that the polishing treatment may be performed a plurality of times until the thin film has a desired thickness, as necessary.

Fabrication Method Example 1

Description is made below using, as an example, the display device 100 exemplified in the above structure example and illustrated in FIG. 1A to FIG. 1C.
{Preparation for Substrate 101}
As the substrate 101, a substrate having at least heat resistance high enough to withstand the following heat treatment can be used. In the case where an insulating substrate is used as the substrate 101, a glass substrate, a quartz substrate, a sapphire substrate, a ceramic substrate, or the like can be used. Alternatively, a single crystal semiconductor substrate or a polycrystalline semiconductor substrate using silicon or silicon carbide as a material, a compound semiconductor substrate of silicon germanium or the like, a semiconductor substrate such as an SOI substrate, or the like can be used.

As the substrate 101, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

In this embodiment, a substrate including at least a pixel circuit is used as the substrate 101.
{Formation of Insulating Layer 121 and Plug 131}
The insulating layer 121 is formed over the substrate 101. Next, an opening reaching the substrate 101 is formed in the insulating layer 121 in a position where the plug 131 is to be formed. The opening is preferably an opening reaching an electrode or a wiring provided in the substrate 101. Then, a conductive film is formed to fill the opening and planarization treatment is performed to expose the top surface of the insulating layer 121. In this manner, the plug 131 embedded in the insulating layer 121 can be formed.
{Formation of Light-Emitting Element 120R, Light-Emitting Element 120G, Light-Emitting Element 120B, and Structure Body 132}
A conductive film 111f is formed over the insulating layer 121 and the plug 131 (see FIG. 4A1 and FIG. 4A2). The conductive film 111f can be formed by a sputtering method, a CVD method, an MBE method, a PLD method, an ALD method, or the like as appropriate.

Then, a film 113RF to be the layer 113R and a sacrificial film 141RF are formed in this order over the conductive film 111f (see FIG. 4B1 and FIG. 4B2). As will be described in detail later, a sacrificial layer formed by processing the sacrificial film 141RF functions as a protective layer that protects a film (a film 113Rf described later) formed below the sacrificial layer from damage in a later step. The sacrificial layer sometimes functions as a mask at the time of processing the film (the film 113Rf described later) formed below the sacrificial layer. Thus, a sacrificial layer in this specification and the like can be referred to as a mask layer or a protective layer. In addition, a sacrificial film to be a sacrificial layer can be referred to as a mask film or a protective film.

The film 113RF includes at least a film containing a light-emitting compound. A structure may be employed in which one or more films functioning as an electron-transport layer, a charge-generation layer, a hole-transport layer, and a hole-injection layer are stacked in addition to the above.

The film 113RF can be formed by, for example, an evaporation method, a sputtering method, an inkjet method, or the like. Without limitation to this, the above-described film formation method can be used as appropriate.

The sacrificial film 141RF can be formed by a sputtering method, an ALD method (a thermal ALD method or a PEALD method), or a vacuum evaporation method, for example. A formation method that gives less damage to a film to be the layer 113 is preferred, and an ALD method or a vacuum evaporation method is more suitable for the formation of the sacrificial film 141RF than a sputtering method.

Besides these film formation methods, a wet film formation method such as spin coating, dipping, spray coating, ink-jetting, dispensing, screen printing, offset printing, a doctor knife method, a slit coater, a roll coater, a curtain coater, or a knife coater may be used for the formation of the sacrificial film 141RF.

As the sacrificial film 141RF, a film that can be removed by a wet etching method is preferably used. The use of a wet etching method can reduce damage to the film to be the layer 113 in processing of the sacrificial film 141RF, as compared with the case of using a dry etching method. In the case of using a wet etching method, it is preferable to use a developer, a tetramethyl ammonium hydroxide solution (TMAH), dilute hydrofluoric acid, oxalic acid, phosphoric acid, acetic acid, nitric acid, or a chemical solution containing a mixed solution thereof, for example.

In the method for fabricating the display device of this embodiment, it is desirable that the film to be the layer 113 not be easily processed in the steps of processing the sacrificial films, and that the sacrificial films not be easily processed in the step of processing the film to be the layer 113. The materials and processing methods of the sacrificial films and the processing method of the film to be the layer 113 are desirably selected in consideration of the above.

The sacrificial film 141RF can be formed using an inorganic film such as a metal film, an alloy film, a metal oxide film, a semiconductor film, or an inorganic insulating film, for example.

For the sacrificial film 141RF, for example, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used.

For the sacrificial film 141RF, a metal oxide such as an indium gallium zinc oxide (In—Ga—Zn oxide, also referred to as IGZO) can be used. It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Indium tin oxide containing silicon, or the like can also be used.

An element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium described above. In particular, M is preferably one or more kinds selected from gallium, aluminum, and yttrium.

As the sacrificial film 141RF, a variety of inorganic insulating films that can be used as the insulating layer 117 or the insulating layer 118 can be used. In particular, an oxide insulating film is preferable because its adhesion to the film to be the layer 113 is higher than that of a nitride insulating film. For example, an inorganic insulating material such as aluminum oxide, hafnium oxide, or silicon oxide can be used for the sacrificial film 141RF. An aluminum oxide film formed by an ALD method is particularly suitable for the sacrificial film 141RF because damage to an underlying layer (especially the EL layer or the like) can be reduced.

Alternatively, a material that can be dissolved in a solvent chemically stable with respect to at least the uppermost film of the film 113RF may be used for the sacrificial film 141RF. For example, a material that will be dissolved in water or alcohol may be used for the sacrificial film 141RF. In the formation of the sacrificial film 141RF using this material, it is preferable that application of the material dissolved in a solvent such as water or alcohol be performed by the aforementioned wet film formation method and followed by heat treatment for evaporating the solvent. At this time, the heat treatment is performed under a reduced-pressure atmosphere, whereby the solvent can be removed at a low temperature in a short time and thermal damage to the film 113RF can be accordingly reduced.

Examples of the material that will be dissolved in water or alcohol include organic materials such as polyvinyl alcohol (PVA), polyvinylbutyral, polyvinylpyrrolidone, polyethylene glycol, polyglycerin, pullulan, water-soluble cellulose, and an alcohol-soluble polyamide resin.

Next, a resist mask 151R is formed over the sacrificial film 141RF (see FIG. 4B1 and FIG. 4B2). Note that the width of the resist mask 151R in the X1-X2 direction is preferably larger than the width of the conductive layer 111R formed later.

For the resist mask 151R, a resist material containing a photosensitive resin, such as a positive type resist material or a negative type resist material, can be used.

In the cross-sectional view of the display device 100 in FIG. 4B1, the end portion of the resist mask 151R is perpendicular or substantially perpendicular to the substrate 101; however, the shape of the end portion of the resist mask 151R is not limited thereto. The end portion of the resist mask 151R may have a tapered shape or an inverse tapered shape. Note that the tapered shape refers to the case where the angle formed between a side surface and a bottom surface of a layer (corresponding to the resist mask 151R here) is smaller than 90° when the side surface of the layer is observed in the cross-sectional (plane perpendicular to the surface of the substrate) direction. The inverse tapered shape refers to the case where the angle formed between a side surface and a bottom surface of a layer (corresponding to the resist mask 151R here) is larger than 90° when the side surface of the layer is observed in the cross-sectional (plane perpendicular to the surface of the substrate) direction. Alternatively, the inverse tapered shape refers to a shape in which the side portion or the upper portion extends beyond the bottom portion in the direction parallel to the substrate.

Then, the sacrificial film 141RF and the film 113RF that are not covered with the resist mask 151R are removed, so that part of the top surface of the conductive film 111f is exposed (see FIG. 4C1 and FIG. 4C2). Thus, a sacrificial layer 141R and the film 113Rf can be formed.

A dry etching method or a wet etching method can be used for partly removing the sacrificial film 141RF and the film 113RF. It is particularly preferable to perform anisotropic dry etching, which can prevent an exposed side surface of the film 113Rf from being etched and the pattern of the film 113Rf from being reduced after the etching. Note that part of the sacrificial film 141RF and part of the film 113RF may be removed under the same condition or different conditions.

Then, the resist mask 151R is removed (see FIG. 4C1 and FIG. 4C2). The sacrificial layer 141R is preferably provided over the film 113Rf, in which case exposure of the film 113Rf to a chemical solution or the like used for removing the resist mask 151R can be prevented.

When the above step is finished, the sacrificial layer 141R preferably remains over the film 113Rf. This enables the sacrificial layer 141R to function as a protective layer that protects the film 113Rf from damage in a later step.

Then, a film 113GF to be the layer 113G and a sacrificial film 141GF are formed in this order over the sacrificial layer 141R and the conductive film 111$f$ (see FIG. 5A1 and FIG. 5A2). At this time, the film 113GF includes a region in contact with the side surface of the film 113Rf as illustrated in FIG. 5A1.

For a film formation method of the film 113GF, refer to the above description of the film 113RF. For a material that can be used for the sacrificial film 141GF and a film formation method of the sacrificial film 141GF, refer to the above description of the sacrificial film 141RF.

Next, a resist mask 151G is formed over the sacrificial film 141GF (see FIG. 5A1 and FIG. 5A2). As illustrated in FIG. 5A1, one side surface of the resist mask 151G is preferably positioned near one side surface of the film 113Rf, and is further preferably substantially aligned with the one side surface of the film 113Rf. This enables the light-emitting elements to be arranged with an extremely high density, which can significantly increase the resolution of the display device 100.

For the resist mask 151G, a resist material containing a photosensitive resin, such as a positive type resist material or a negative type resist material, can be used.

In the cross-sectional views of the display device 100 in FIG. 5A1 and FIG. 5A2, the end portion of the resist mask 151G is substantially perpendicular to the substrate 101; however, the shape of the end portion of the resist mask 151G is not limited thereto. The end portion of the resist mask 151G may have a tapered shape or an inverse tapered shape.

Then, the sacrificial film 141GF and the film 113GF that are not covered with the resist mask 151G are removed, so that the top surface of the sacrificial layer 141R and part of the top surface of the conductive film 111$f$ are exposed (see FIG. 5B1 and FIG. 5B2). Thus, a sacrificial layer 141G and a film 113Gf can be formed.

A dry etching method or a wet etching method can be used for partly removing the sacrificial film 141GF and the film 113GF. It is particularly preferable to perform anisotropic dry etching, which can prevent an exposed side surface of the film 113Gf from being etched and the pattern of the film 113Gf from being reduced after the etching. Note that part of the sacrificial film 141GF and part of the film 113GF may be removed under the same condition or different conditions.

As illustrated in FIG. 5B1, the film 113Gf sometimes has a projection on its end portion that is in contact with the film 113Rf. In that case, the sacrificial layer 141G sometimes has a projection in a region overlapping with the projection of the film 113Gf. Although the end portions of the projections of the film 113Gf and the sacrificial layer 141G are substantially perpendicular to the substrate 101 in FIG. 5B1, the shapes of the end portions of the projections of the film 113Gf and the sacrificial layer 141G are not limited thereto. The end portion of the projection of the film 113Gf and/or the sacrificial layer 141G may have a tapered shape.

Note that the film 113Gf and/or the sacrificial layer 141G might not have a projection depending on the shape of the resist mask 151G, the method for partly removing the sacrificial film 141GF and the film 113GF, and the like.

Then, the resist mask 151G is removed (see FIG. 5B1 and FIG. 5B2). The sacrificial layer 141G is preferably provided over the film 113Gf, in which case exposure of the film 113Gf to a chemical solution or the like used for removing the resist mask 151G can be prevented.

When the above step is finished, it is preferable that the sacrificial layer 141R remain over the film 113Rf and the sacrificial layer 141G remain over the film 113Gf. This enables the sacrificial layer 141R and the sacrificial layer 141G to function as protective layers that protect the film 113Rf and the film 113Gf from damage in a later step. Although FIG. 5B1 illustrates the structure in which the film 113Gf and the sacrificial layer 141G have the projections on their end portions, the shapes of the end portions of the film 113Gf and the sacrificial layer 141G are not limited thereto. The film 113Gf and/or the sacrificial layer 141G might not have a projection on the end portion.

Then, a film 113BF to be the layer 113B and a sacrificial film 141BF are formed in this order over the sacrificial layer 141R, the sacrificial layer 141G, and the conductive film 111$f$ (see FIG. 5C1 and FIG. 5C2). At this time, the film 113BF includes a region in contact with the side surface of the film 113Rf and a region in contact with the side surface of the film 113Gf as illustrated in FIG. 5C1.

For a film formation method of the film 113BF, refer to the above description of the film 113RF. For a material that can be used for the sacrificial film 141BF and a film formation method of the sacrificial film 141BF, refer to the above description of the sacrificial film 141RF.

Next, a resist mask 151B is formed over the sacrificial film 141BF (see FIG. 5C1 and FIG. 5C2). As illustrated in FIG. 5C1, one side surface of the resist mask 151B is preferably positioned near one side surface of the film 113Gf, and is further preferably substantially aligned with the one side surface of the film 113Gf. This enables the light-emitting elements to be arranged with an extremely high density, which can significantly increase the resolution of the display device 100. In addition, the other side surface of the resist mask 151B is preferably positioned near the other side surface of the film 113Rf, and is further preferably substantially aligned with the other side surface of the film 113Rf. This enables the light-emitting elements to be arranged with an extremely high density, which can significantly increase the resolution of the display device 100.

For the resist mask 151B, a resist material containing a photosensitive resin, such as a positive type resist material or a negative type resist material, can be used.

In the cross-sectional views of the display device 100 in FIG. 5C1 and FIG. 5C2, the end portion of the resist mask 151B is perpendicular or substantially perpendicular to the substrate 101; however, the shape of the end portion of the resist mask 151B is not limited thereto. The end portion of the resist mask 151B may have a tapered shape or an inverse tapered shape.

Then, the sacrificial film 141BF and the film 113BF that are not covered with the resist mask 151B are removed, so that the top surface of the sacrificial layer 141R, the top surface of the sacrificial layer 141G, and part of the top surface of the conductive film 111$f$ are exposed (see FIG. 5D1 and FIG. 5D2). Thus, a sacrificial layer 141B and a film 113Bf can be formed.

A dry etching method or a wet etching method can be used for partly removing the sacrificial film 141BF and the film 113BF. It is particularly preferable to perform anisotropic dry etching, which can prevent an exposed side surface of the film 113Bf from being etched and the pattern of the film 113Bf from being reduced after the etching. Note that part of the sacrificial film 141BF and part of the film 113BF may be removed under the same condition or different conditions.

As illustrated in FIG. 5D1, the film 113Bf sometimes has projections on its end portion that is in contact with the film 113Rf and its end portion that is in contact with the film 113Gf. In that case, the sacrificial layer 141B sometimes has projections in regions overlapping with the projections of the film 113Bf. Although the end portions of the projections of the film 113Bf and the sacrificial layer 141B are perpendicular or substantially perpendicular to the substrate 101 in FIG. 5D1, the shapes of the end portions of the projections of the film 113Bf and the sacrificial layer 141B are not limited thereto. The end portions of the projections of the film 113Bf and/or the sacrificial layer 141B may have a tapered shape.

Note that the film 113Bf and/or the sacrificial layer 141B might not have projections depending on the shape of the resist mask 151B, the method for partly removing the sacrificial film 141BF and the film 113BF, and the like.

Then, the resist mask 151B is removed (see FIG. 5D1 and FIG. 5D2). The sacrificial layer 141B is preferably provided over the film 113Bf, in which case exposure of the film 113Bf to a chemical solution or the like used for removing the resist mask 151B can be prevented.

When the above step is finished, it is preferable that the sacrificial layer 141R remain over the film 113Rf, the sacrificial layer 141G remain over the film 113Gf, and the sacrificial layer 141B remain over the film 113Bf. This enables the sacrificial layer 141R, the sacrificial layer 141G, and the sacrificial layer 141B to function as protective layers that protect the film 113Rf, the film 113Gf, and the film 113Bf from damage in a later step. Although FIG. 5D1 illustrates the structure in which the film 113Gf, the film 113Bf, the sacrificial layer 141G, and the sacrificial layer 141B have the projections on their end portions, the shapes of the end portions of the film 113Gf, the film 113Bf, the sacrificial layer 141G, and the sacrificial layer 141B are not limited thereto. One or more of the film 113Gf, the film 113Bf, the sacrificial layer 141G, and the sacrificial layer 141B might not have a projection on the end portion.

Next, the sacrificial layer 141R, the sacrificial layer 141G, and the sacrificial layer 141B are removed, so that the top surface of the film 113Rf, the top surface of the film 113Gf, and the top surface of the film 113Bf are exposed (see FIG. 6A1 and FIG. 6A2).

The sacrificial layer 141R, the sacrificial layer 141G, and the sacrificial layer 141B can be removed by wet etching or dry etching. At this time, a method that causes as little damage as possible to the film 113Rf, the film 113Gf, and the film 113Bf is preferably employed.

In the case where an inorganic film is used as each of the sacrificial layer 141R, the sacrificial layer 141G, and the sacrificial layer 141B, wet etching using a tetramethyl ammonium hydroxide solution (TMAH), diluted hydrofluoric acid, oxalic acid, phosphoric acid, acetic acid, nitric acid, or a mixed solution thereof is preferably employed for removing the sacrificial layer 141R, the sacrificial layer 141G, and the sacrificial layer 141B, for example.

Alternatively, in the case where an organic material is used for each of the sacrificial layer 141R, the sacrificial layer 141G, and the sacrificial layer 141B, it is preferable that the sacrificial layer 141R, the sacrificial layer 141G, and the sacrificial layer 141B be removed by being dissolved in a solvent such as water or alcohol.

Examples of the alcohol in which the sacrificial layer 141R, the sacrificial layer 141G, and the sacrificial layer 141B can be dissolved include various alcohols such as ethyl alcohol, methyl alcohol, isopropyl alcohol (IPA), and glycerin.

Although FIG. 6A1 illustrates the structure in which the film 113Gf and the film 113Bf have the projections on their end portions, the shapes of the end portions of the film 113Gf and the film 113Bf are not limited thereto. The film 113Gf and the film 113Bf might not have projections on their end portions depending on the shapes of the end portions of the film 113Gf, the film 113Bf, the sacrificial layer 141G, and the sacrificial layer 141B, the method for removing the sacrificial layer 141R, the sacrificial layer 141G, and the sacrificial layer 141B, and the like.

After the sacrificial layer 141R, the sacrificial layer 141G, and the sacrificial layer 141B are removed, drying treatment is preferably performed to remove water contained in the film 113Rf, the film 113Gf, and the film 113Bf and water adsorbed on their surfaces. For example, heat treatment is preferably performed under an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere because drying at a lower temperature is possible.

Next, a film 114f and a conductive film 116f are formed in this order over the film 113Rf, the film 113Gf, and the film 113Bf (see FIG. 6B1 and FIG. 6B2). In the case where each of the film 113Gf and the film 113Bf has a projection on the end portion, the film 114f and the conductive film 116f each have projections in regions overlapping with the projections of the film 113Gf and the film 113Bf as illustrated in FIG. 6B1. In the case where each of the film 113Gf and the film 113Bf does not have a projection on the end portion, the film 114f and the conductive film 116f might not have projections.

As the film 114f, for example, it is preferable to use a film containing a material that can be used for the above-described electron-injection layer. Examples of the material that can be used for the electron-injection layer include alkali metal, alkaline earth metal, a compound of them, and a composite material formed by mixing an organic compound and a metal. Specifically, a film containing lithium fluoride (LiF), a film containing NBPhen and Ag, or the like is preferably used as the film 114f.

For a film formation method of the film 114f, refer to the above description of the film 113RF.

The conductive film 116f can be formed by a sputtering method or a vacuum evaporation method, for example.

Then, a resist mask 152R, a resist mask 152G, a resist mask 152B, and a resist mask 152P are formed over the conductive film 116f (see FIG. 6B1 and FIG. 6B2).

In the following description common to the resist mask 152R, the resist mask 152G, and the resist mask 152B, the alphabets added to the reference numerals are omitted and the term "resist mask 152" is used in the description in some cases.

The resist mask 152R is formed to overlap with the film 113Rf. The resist mask 152R includes a region overlapping with the plug 131. The width of the resist mask 152R in the X1-X2 direction is preferably smaller than the width of the film 113Rf. In the case where the film 114f and the conductive film 116f each have projections, the resist mask 152R preferably does not overlap with the projections of the film 114*f* and further preferably does not overlap with the projections of the conductive film 116*f*. FIG. 6B1 illustrates a structure in which the side surfaces of the resist mask 152R are in contact with the side surfaces of the projections of the conductive film 116*f*.

The resist mask 152G is formed to overlap with the film 113Gf. The resist mask 152G includes a region overlapping with the plug 131. The width of the resist mask 152G in the X1-X2 direction is preferably smaller than the width of the film 113Gf. In the case where the film 114*f* and the conductive film 116*f* each have projections, the resist mask 152G preferably does not overlap with the projections of the film 113Gf, further preferably does not overlap with the projections of the film 114*f*, and still further preferably does not overlap with the projections of the conductive film 116*f*. FIG. 6B1 illustrates a structure in which the side surfaces of the resist mask 152G are in contact with the side surfaces of the projections of the conductive film 116*f*.

The resist mask 152B is formed to overlap with the film 113Bf. The resist mask 152B includes a region overlapping with the plug 131. The width of the resist mask 152B in the X1-X2 direction is preferably smaller than the width of the film 113Bf. In the case where the film 114*f* and the conductive film 116*f* each have projections, the resist mask 152B preferably does not overlap with the projections of the film 113Bf, further preferably does not overlap with the projections of the film 114*f*, and still further preferably does not overlap with the projections of the conductive film 116*f*. FIG. 6B1 illustrates a structure in which the side surfaces of the resist mask 152B are in contact with the side surfaces of the projections of the conductive film 116*f*.

The shortest distance (the distance L1 illustrated in FIG. 6B1) between the side surface of the resist mask 152R and the side surface of the resist mask 152G that face each other in the X1-X2 direction is determined as appropriate in accordance with the thickness of the insulating layer 117 or the like, the processing accuracy, the resolution, and the like. For example, the distance L1 is greater than or equal to 50 nm and less than or equal to 600 nm, preferably greater than or equal to 100 nm and less than or equal to 500 nm, further preferably greater than or equal to 150 nm and less than or equal to 400 nm.

The preferred range of the distance L1 can apply to the shortest distance between the side surface of the resist mask 152R and the side surface of the resist mask 152B that face each other in the X1-X2 direction. It can also apply to the shortest distance between the side surface of the resist mask 152G and the side surface of the resist mask 152B that face each other in the X1-X2 direction.

The preferred range of the distance L1 can apply to the shortest distance between the facing side surfaces of the resist masks 152 adjacent to each other in the Y1-Y2 direction.

The above structure enables the light-emitting elements to be arranged with an extremely high density, which can significantly increase the resolution of the display device 100.

Depending on the resolution or the like of the display device, the side surface of the resist mask 152 is not necessarily in contact with the side surface of the conductive film 116*f* in the light-emitting element 120 as illustrated in FIG. 8A1 and FIG. 8A2.

The resist mask 152P is formed in a region that overlaps with neither the film 113Rf, the film 113Gf, nor the film 113Bf.

For the resist mask 152 and the resist mask 152P, a resist material containing a photosensitive resin, such as a positive type resist material or a negative type resist material, can be used.

Then, the conductive film 116*f*, the film 114*f*, the film 113Rf, the film 113Gf, the film 113Bf, and the conductive film 111*f* that are not covered with the resist mask 152 and the resist mask 152P are removed, so that part of the top surface of the insulating layer 121 is exposed.

Through the above processing, the conductive layer 116 (the conductive layer 116R, the conductive layer 116G, and the conductive layer 116B) and the conductive layer 135 are formed from the conductive film 116*f* (see FIG. 6C1 and FIG. 6C2). Since the conductive layer 116 and the conductive layer 135 are formed by processing of the conductive film 116*f*, the conductive layer 116 and the conductive layer 135 contain the same material.

In addition, the layer 114 (the layer 114R, the layer 114G, and the layer 114B) and the layer 134 are formed from the film 114*f* (see FIG. 6C1 and FIG. 6C2). Since the layer 114 and the layer 134 are formed by processing of the film 114*f*, the layer 114 and the layer 134 contain the same material.

Moreover, the layer 113R is formed from the film 113Rf, the layer 113G is formed from the film 113Gf, and the layer 113B is formed from the film 113Bf (see FIG. 6C1 and FIG. 6C2).

In addition, the conductive layer 111 (the conductive layer 111R, the conductive layer 111G, and the conductive layer 111B) and the conductive layer 133 are formed from the conductive film 111*f* (see FIG. 6C1 and FIG. 6C2). Since the conductive layer 111 and the conductive layer 133 are formed by processing of the conductive film 111*f*, the conductive layer 111 and the conductive layer 133 contain the same material. The conductive layer 111 is electrically connected to the plug 131.

Part of the conductive film 116*f*, part of the film 114*f*, part of the film 113Rf, part of the film 113Gf, part of the film 113Bf, and part of the conductive film 111*f* can be removed by a dry etching method or a wet etching method. Note that part of the conductive film 116*f*, part of the film 114*f*, part of the film 113Rf, part of the film 113Gf, and part of the film 113Bf may be removed under the same condition as or different conditions from part of the conductive film 111*f*.

Through the above processing, part of the insulating layer 121 that does not overlap with the resist mask 152 and the resist mask 152P is sometimes removed. In that case, as illustrated in FIG. 2B, the insulating layer 121 has a depression in a region not overlapping with the conductive layer 111. In other words, the thickness of the insulating layer 121 in the region not overlapping with the conductive layer 111 is smaller than the thickness of the insulating layer 121 in a region overlapping with the conductive layer 111.

Next, the resist mask 152 and the resist mask 152P are removed (see FIG. 6C1 and FIG. 6C2).

In the above manner, the light-emitting element 120R including the conductive layer 111R, the layer 113R, the layer 114R, and the conductive layer 116R; the light-emitting element 120G including the conductive layer 111G, the layer 113G, the layer 114G, and the conductive layer 116G; the light-emitting element 120B including the conductive layer 111B, the layer 113B, the layer 114B, and the conductive layer 116B; and the structure body 132 including the conductive layer 135, the layer 134, and the conductive layer 133 can be formed.

Note that the formation order of the film 113RF, the film 113GF, and the film 113BF is not limited to the above. For example, the formation order may be as follows: the film 113RF, the film 113BF, and the film 113GF. Furthermore, the film 113GF may be formed first, or the film 113BF may be formed first.

The fabrication method is preferably adjusted as appropriate depending on the number of colors of light emitted from the light-emitting elements 120 included in the display device 100. For example, in the case where the number of colors of light emitted from the light-emitting elements 120 included in the display device 100 is two, a process including the steps of forming a sacrificial film and a film containing at least a light-emitting compound, forming a resist mask, removing the sacrificial film and the film that are not covered with the resist mask, and removing the resist mask is preferably performed twice. In the case where the number of colors of light emitted from the light-emitting elements 120 included in the display device 100 is four, the process is preferably performed four times.

According to the fabrication method example, providing the sacrificial layer over the layer 113 prevents exposure of the layer 113 to a chemical solution or the like used for removing the resist mask 151R, the resist mask 151G, and the resist mask 151B. Thus, without using a metal mask for forming the layer 113, the light-emitting element 120 can be formed.

{Formation of Insulating Layer 117, Insulating Layer 118, and Conductive Layer 139}

Next, an insulating film 117$f$ and an insulating film 118$f$ are formed in this order over the conductive layer 116R, the conductive layer 116G, the conductive layer 116B, the conductive layer 135, and the insulating layer 121 (see FIG. 7A1 and FIG. 7A2).

The insulating film 117$f$ can be formed by a sputtering method, a CVD method, an MBE method, a PLD method, an ALD method, or the like as appropriate. In this embodiment, an aluminum oxide film is formed as the insulating film 117$f$ by an ALD method. The insulating film 117$f$ needs to be formed on the side surface of the conductive layer 116, the side surface of the layer 114, the side surface of the layer 113, and the side surface of the conductive layer 111 with excellent coverage. By an ALD method, an atomic layer can be deposited one by one on these side surfaces, whereby the insulating film 117$f$ can be formed with excellent coverage.

For example, in the case where an aluminum oxide film is formed by an ALD method, two kinds of gases, $H_2O$ as an oxidizer and a source gas that is obtained by vaporizing a liquid containing a solvent and an aluminum precursor compound (trimethylaluminum (TMA, $Al(CH_3)_3$) or the like), are used. Examples of another material include tris (dimethylamide)aluminum, triisobutyl aluminum, and aluminum tris(2,2,6,6-tetramethyl-3,5-heptanedionate).

The insulating film 118$f$ can be formed by a sputtering method, a CVD method, an MBE method, a PLD method, an ALD method, or the like as appropriate. In this embodiment, a silicon nitride film is formed as the insulating film 118$f$.

In the case where the insulating film 118$f$ is formed by a method that offers low coverage, the gap 137 is sometimes formed between the insulating film 117$f$ and the insulating film 118$f$ in a region between the light-emitting elements 120 as illustrated in FIG. 2A. Examples of the film formation method that offers low coverage include a sputtering method and a CVD method.

As the insulating film 118$f$, two films may be formed using different materials and/or different film formation methods. For example, an insulating film to be the insulating layer 118$a$ is formed over the insulating film 117$f$, and an insulating film to be the insulating layer 118$b$ is formed over the insulating film to be the insulating layer 118$a$. Specifically, the insulating film to be the insulating layer 118$a$ is formed by a sputtering method over the insulating film 117$f$, and the insulating film to be the insulating layer 118$b$ is formed by an ALD method over the insulating film to be the insulating layer 118$a$. Thus, in the case where a pinhole, disconnection, or the like is formed in the film formed by a sputtering method, a portion overlapping with the pinhole, the disconnection, or the like can be filled with the film formed by an ALD method with excellent coverage.

Next, a resist mask 153 is formed over the insulating film 118$f$ (see FIG. 7A1 and FIG. 7A2).

For the resist mask 153, a resist material containing a photosensitive resin, such as a positive type resist material or a negative type resist material, can be used.

Then, the insulating film 118$f$ and the insulating film 117$f$ that are not covered with the resist mask 153 are removed, so that part of the top surface of the conductive layer 116 and part of the top surface of the conductive layer 135 are exposed (see FIG. 7B1 and FIG. 7B2). Thus, the insulating layer 118 and the insulating layer 117 can be formed. The insulating layer 118 and the insulating layer 117 have the first opening in a region overlapping with at least part of the conductive layer 135 and the second opening in a region overlapping with at least part of the conductive layer 116.

Then, the resist mask 153 is removed (see FIG. 7B1 and FIG. 7B2).

Next, a conductive film 139$f$ is formed over the conductive layer 116, the conductive layer 135, and the insulating layer 118 (see FIG. 7C1 and FIG. 7C2). The conductive film 139$f$ can be formed by a sputtering method, a CVD method, an MBE method, a PLD method, an ALD method, or the like as appropriate.

Next, a resist mask 154 is formed over the conductive film 139$f$ (see FIG. 7C1 and FIG. 7C2).

For the resist mask 154, a resist material containing a photosensitive resin, such as a positive type resist material or a negative type resist material, can be used.

Next, the conductive film 139$f$ not covered with the resist mask 154 is removed, so that part of the top surface of the insulating layer 118 is exposed (see FIG. 7D1 and FIG. 7D2). Thus, the conductive layer 139 can be formed. The conductive layer 139 includes the region in contact with the conductive layer 135 through the first opening formed in the insulating layer 117 and the insulating layer 118. The conductive layer 139 also includes the region in contact with the conductive layer 116 through the second opening formed in the insulating layer 117 and the insulating layer 118.

Then, the resist mask 154 is removed (see FIG. 7D1 and FIG. 7D2).

In the above manner, the display device 100 can be fabricated.

The conductive layer 139 is formed uniformly in a region overlapping with the light-emitting element 120 or the structure body 132 and thus does not require fine processing in some cases. Hence, the conductive layer 139 may be formed using a metal mask in some cases. For example, as illustrated in FIG. 8B1 and FIG. 8B2, the conductive layer 139 is preferably formed using a metal mask in a region 171. In the case where the conductive layer 139 is formed using a metal mask, the process including the steps of forming the resist mask 154, removing the conductive film not covered with the resist mask 154, and removing the resist mask 154 can be omitted. This can reduce the number of steps and improve the productivity.

According to the above fabrication method example, the difference in the optical distance between the conductive layer 111 and the conductive layer 116 can be precisely controlled by the thicknesses of the EL layer 115; thus, chromaticity deviation in the light-emitting elements is unlikely to occur, so that a display device having excellent color reproducibility and extremely high display quality can be fabricated easily.

The light-emitting element 120 can be formed over the insulating layer 121 with a planarized top surface. Furthermore, the lower electrode (the conductive layer 111) of the light-emitting element 120 can be electrically connected to a pixel circuit or the like on the substrate 101 through the plug 131, so that an extremely minute pixel can be formed and accordingly a display device with extremely high resolution can be achieved. Since the light-emitting element 120 can be placed to overlap with the pixel circuit or the driver circuit, a display device with a high aperture ratio (effective light-emitting area ratio) can be achieved.

Fabrication Method Example 2

Description is made below using, as an example, the display device 100 exemplified in the above structure example and illustrated in FIG. 2C.

Note that for the portions similar to those in Fabrication method example 1, the above description is referred to and the repeated description is skipped below, in some cases.
{Preparation for Substrate 101}

As in the above, a substrate including at least a pixel circuit is used as the substrate 101.
{Formation of Insulating Layer 121 and Plug 131}

Next, the insulating layer 121 and the plug 131 are formed (see FIG. 4A1 and FIG. 4A2). The insulating layer 121 and the plug 131 can be formed by methods similar to those described above.
{Formation of Light-Emitting Element 120R, Light-Emitting Element 120G, Light-Emitting Element 120B, and Structure Body 132}

Then, the film 113Rf, the film 113Gf, and the film 113Bf are formed over the conductive film 111*f* (see FIG. 6A1 and FIG. 6A2). The film 113Rf, the film 113Gf, and the film 113Bf can be formed by a method similar to the above.

Figures 9A1, 9A2, 9B1, 9B2, 9C1, 9C2:
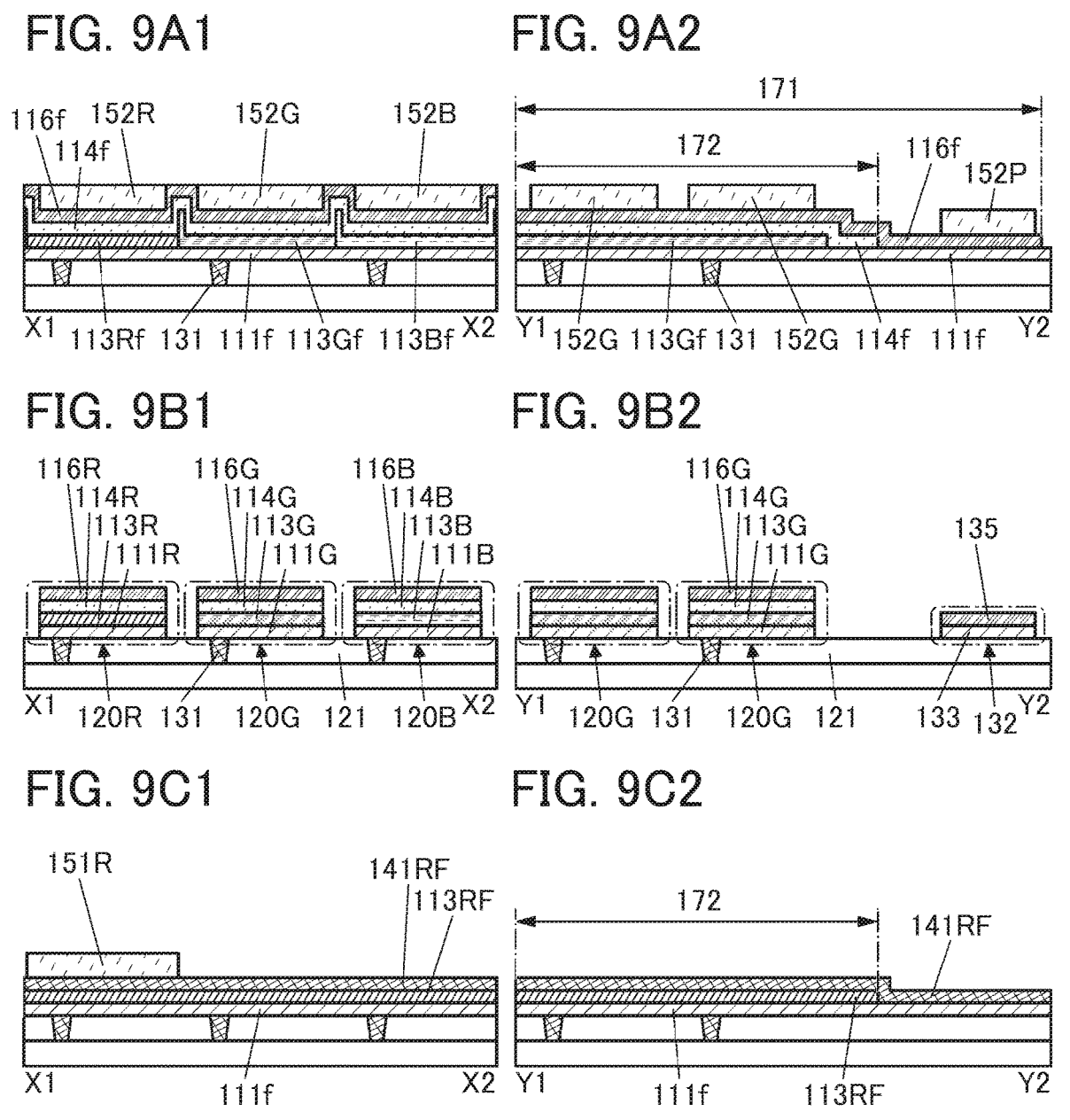

Next, the film 114*f* is formed over the film 113Rf, the film 113Gf, and the film 113Bf (see FIG. 9A1 and FIG. 9A2).

As illustrated in FIG. 9A2, the film 114*f* is not formed in a region where the structure body 132 is formed. In other words, the film 114*f* is formed in a region where the structure body 132 is not formed. A region where the film 114*f* is formed is, for example, a region 172 illustrated in FIG. 9A2. The region 172 is a region where the light-emitting element 120 is formed and the structure body 132 is not formed. In that case, the film 114*f* is preferably formed using a metal mask. This structure inhibits the formation of the film 114*f* in the region where the structure body 132 is formed.

Next, the conductive film 116*f* is formed over the film 114*f*, and the resist mask 152 (the resist mask 152R, the resist mask 152G, and the resist mask 152B) and the resist mask 152P are formed over the conductive film 116*f* (see FIG. 9A1 and FIG. 9A2). The formation of the conductive film 116*f* and the formation of the resist mask 152 and the resist mask 152P can be performed by methods similar to the above.

Note that the conductive film 116*f* may be formed on the entire top surface of the conductive film 111*f*, or may be formed in the region 171 as illustrated in FIG. 9A2. In the case where the conductive film 116*f* is formed in the region 171, the metal mask used for forming the conductive layer 139 can be used.

After the conductive film 116*f*, the film 114*f*, the film 113Rf, the film 113Gf, the film 113Bf, and the conductive film 111*f* that are not covered with the resist mask 152 and the resist mask 152P are removed, the resist mask 152 and the resist mask 152P are removed (see FIG. 9B1 and FIG. 9B2). The conductive film 116*f*, the film 114*f*, the film 113Rf, the film 113Gf, the film 113Bf, and the conductive film 111*f* that are not covered with the resist mask 152 and the resist mask 152P can be removed by a method similar to the above.

In the above manner, the light-emitting element 120R, the light-emitting element 120G, the light-emitting element 120B, and the structure body 132 formed of the conductive layer 133 and the conductive layer 135 can be formed.

Note that the method for forming the structure body 132 formed of the conductive layer 133 and the conductive layer 135 is not limited to the above. For example, the structure body 132 formed of the conductive layer 133 and the conductive layer 135 may be formed through the step of forming the conductive film 116*f* after the film 114*f* is formed and the film 114*f* in a region overlapping with the structure body 132 is removed.

The film 113RF, the film 113GF, and the film 113BF may be formed on the entire top surface of the conductive film 111*f* as illustrated in FIG. 4B2, FIG. 5A2, and FIG. 5C2; however, the structure is not limited thereto. The film 113RF, the film 113GF, and the film 113BF are not necessarily formed in the region where the structure body 132 is formed. For example, the region where the film 113RF, the film 113GF, and the film 113BF are formed may be the region 172 illustrated in FIG. 9C1 and FIG. 9C2. In that case, the metal mask used for forming the film 114*f* can be used.

Structure Example 2

An example of a display device including a transistor will be described below.

Structure Example 2-1

Figure 10:
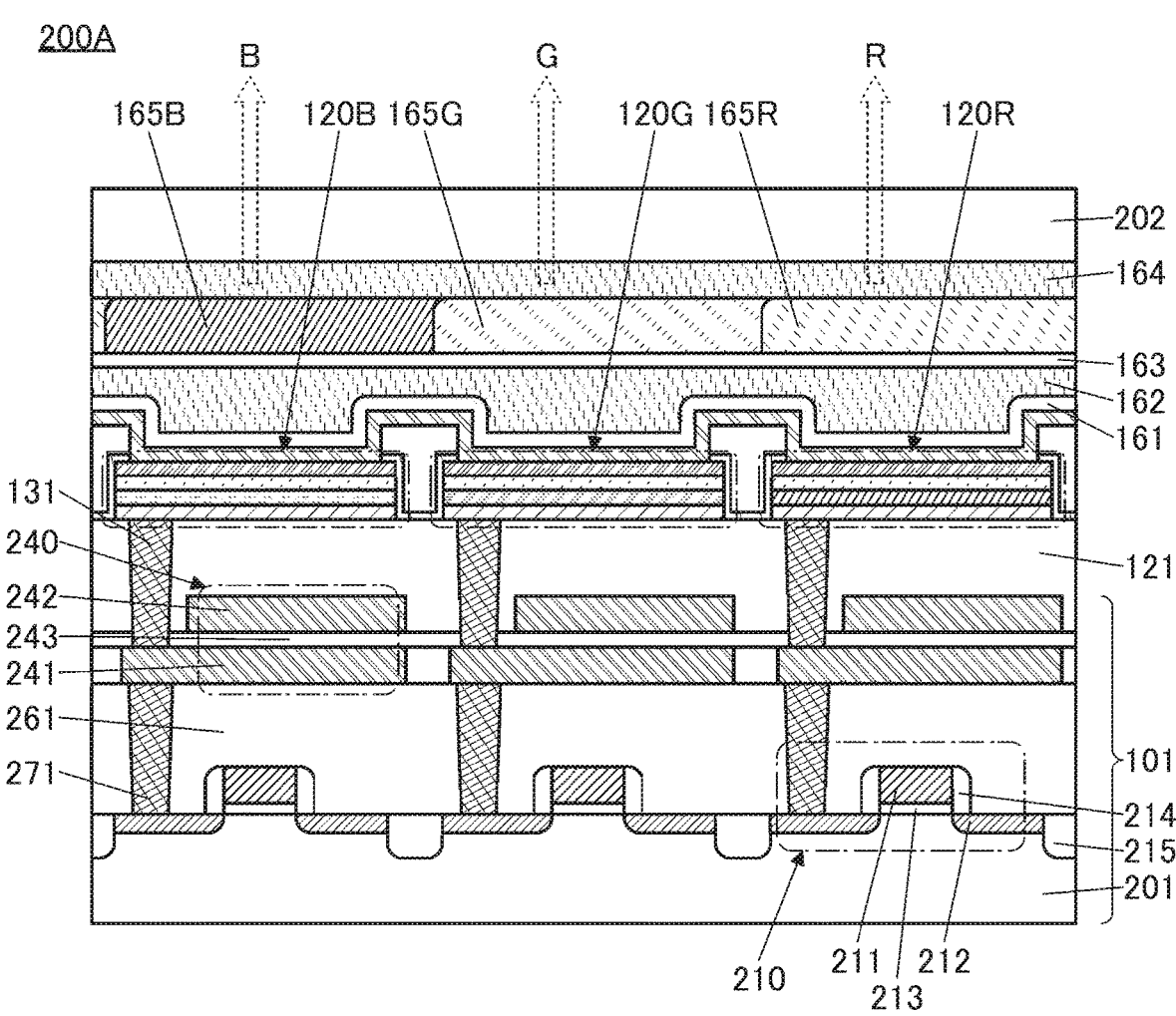
FIG. 10 is a diagram illustrating a structure example of a display device.

FIG. 10 is a schematic cross-sectional view of a display device 200A.

The display device 200A includes a substrate 201, the light-emitting element 120R, the light-emitting element 120G, the light-emitting element 120B, a capacitor 240, a transistor 210, and the like.

A stacked-layer structure from the substrate 201 to the capacitor 240 corresponds to the above-described substrate 101 in Structure example 1.

The transistor 210 is a transistor whose channel formation region is formed in the substrate 201. As the substrate 201, for example, a semiconductor substrate such as a single crystal silicon substrate can be used. The transistor 210 includes part of the substrate 201, a conductive layer 211, a low-resistance region 212, an insulating layer 213, an insulating layer 214, and the like. The conductive layer 211 functions as a gate electrode. The insulating layer 213 is positioned between the substrate 201 and the conductive layer 211 and functions as a gate insulating layer. The low-resistance region 212 is a region where the substrate 201 is doped with an impurity, and functions as one of a source and a drain. The insulating layer 214 is provided to cover the side surfaces of the conductive layer 211 and functions as an insulating layer.

In addition, an element isolation layer 215 is provided between two adjacent transistors 210 to be embedded in the substrate 201.

Furthermore, an insulating layer 261 is provided to cover the transistor 210, and the capacitor 240 is provided over the insulating layer 261.

The capacitor 240 includes a conductive layer 241, a conductive layer 242, and an insulating layer 243 positioned therebetween. The conductive layer 241 functions as one electrode of the capacitor 240, the conductive layer 242 functions as the other electrode of the capacitor 240, and the insulating layer 243 functions as a dielectric of the capacitor 240.

The conductive layer 241 is provided over the insulating layer 261 and is electrically connected to one of a source and a drain of the transistor 210 through a plug 271 embedded in the insulating layer 261. The insulating layer 243 is provided to cover the conductive layer 241. The conductive layer 242 is provided in a region overlapping with the conductive layer 241 with the insulating layer 243 therebetween.

The insulating layer 121 is provided to cover the capacitor 240, and the light-emitting element 120R, the light-emitting element 120G, the light-emitting element 120B, and the like are provided over the insulating layer 121. In the example illustrated here, the structure described in Structure example 1-1 and FIG. 1B is used as the structures of the light-emitting element 120R, the light-emitting element 120G, and the light-emitting element 120B; however, there is no limitation and a variety of structures exemplified above can be employed.

In the display device 200A, an insulating layer 161, an insulating layer 162, and an insulating layer 163 are provided in this order to cover the conductive layer 139 over the light-emitting element 120. These three insulating layers each function as a protective layer that prevents diffusion of impurities such as water into the light-emitting element 120. As the insulating layer 161 and the insulating layer 163, it is preferable to use an inorganic insulating film with low moisture permeability, such as a silicon oxide film, a silicon nitride film, or an aluminum oxide film. As the insulating layer 162, an organic insulating film having a high light-transmitting property can be used. Using an organic insulating film as the insulating layer 162 can reduce the influence of an uneven shape below the insulating layer 162, so that the formation surface of the insulating layer 163 can be a smooth surface. Accordingly, a defect such as a pinhole is unlikely to be generated in the insulating layer 163, leading to higher moisture permeability of the protective layer. Note that the structure of the protective layer covering the light-emitting element 120 is not limited thereto, and a single layer or a two-layer structure may be employed or a stacked-layer structure of four or more layers may be employed.

A coloring layer 165R overlapping with the light-emitting element 120R, a coloring layer 165G overlapping with the light-emitting element 120G, and a coloring layer 165B overlapping with the light-emitting element 120B are provided over the insulating layer 163. For example, the coloring layer 165R transmits red light, the coloring layer 165G transmits green light, and the coloring layer 165B transmits blue light. This can increase the color purity of light from the light-emitting elements, so that a display device with higher display quality can be achieved. Furthermore, the positional alignment of the light-emitting units and the coloring layers is easier in the case where the coloring layers are formed over the insulating layer 163 than in the case where the coloring layers are formed over a substrate 202 described later, so that a display device with extremely high resolution can be achieved.

The display device 200A includes the substrate 202 on the viewing side. The substrate 202 and the substrate 201 are bonded to each other with an adhesive layer 164 having a light-transmitting property. As the substrate 202, a substrate having a light-transmitting property, such as a glass substrate, a quartz substrate, a sapphire substrate, or a plastic substrate, can be used.

With such a structure, a display device with extremely high resolution and high display quality can be achieved.

Structure Example 2-2

Figure 11:
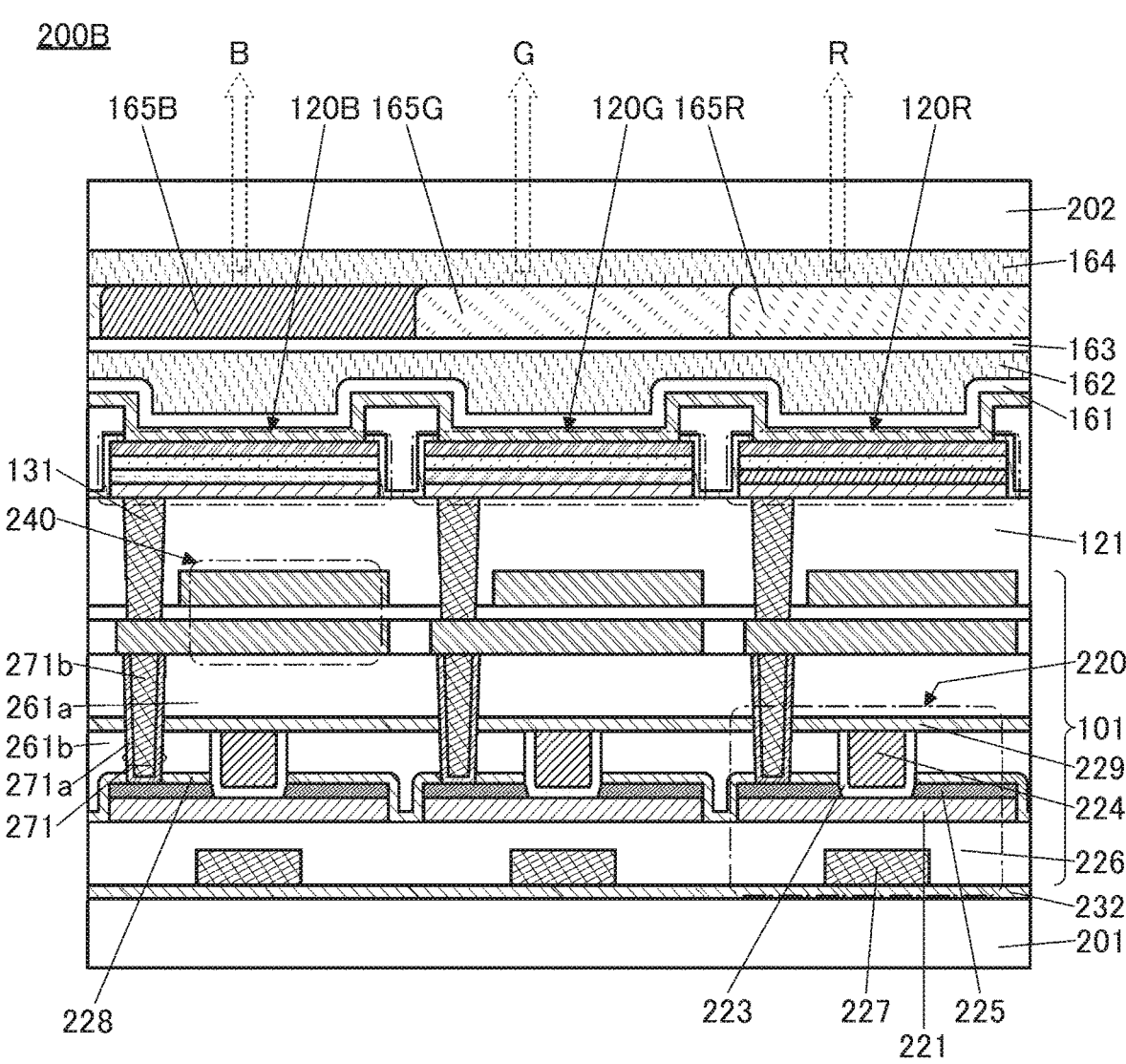
FIG. 11 is a diagram illustrating a structure example of a display device.

FIG. 11 is a schematic cross-sectional view of a display device 200B. The display device 200B is different from the display device 200A mainly in a transistor structure.

A transistor 220 is a transistor in which a metal oxide (also referred to as an oxide semiconductor) is used in a semiconductor layer where a channel is formed.

The transistor 220 includes a semiconductor layer 221, an insulating layer 223, a conductive layer 224, a pair of conductive layers 225, an insulating layer 226, a conductive layer 227, and the like.

As the substrate 201 over which the transistor 220 is provided, the above-described insulating substrate or semiconductor substrate can be used.

An insulating layer 232 is provided over the substrate 201. The insulating layer 232 functions as a barrier layer that prevents diffusion of impurities such as water or hydrogen from the substrate 201 into the transistor 220 and release of oxygen from the semiconductor layer 221 to the substrate 201 side. As the insulating layer 232, it is possible to use, for example, a film in which hydrogen or oxygen is less likely to be diffused than in a silicon oxide film, such as an aluminum oxide film, a hafnium oxide film, or a silicon nitride film.

The conductive layer 227 is provided over the insulating layer 232, and the insulating layer 226 is provided to cover the conductive layer 227. The conductive layer 227 functions as a first gate electrode of the transistor 220, and part of the insulating layer 226 functions as a first gate insulating layer. For the insulating layer 226 at least in a portion in contact with the semiconductor layer 221, an oxide insulating film such as a silicon oxide film is preferably used. The top surface of the insulating layer 226 is preferably planarized.

The semiconductor layer 221 is provided over the insulating layer 226. The semiconductor layer 221 preferably includes a film of a metal oxide exhibiting semiconductor characteristics (also referred to as an oxide semiconductor). A material that can be suitably used for the semiconductor layer 221 will be described in detail later.

The pair of conductive layers 225 is provided over and in contact with the semiconductor layer 221, and functions as a source electrode and a drain electrode.

An insulating layer 228 is provided to cover the top surfaces and side surfaces of the pair of conductive layers 225, the side surfaces of the semiconductor layer 221, and the like, and an insulating layer 261b is provided over the insulating layer 228. The insulating layer 228 functions as a barrier layer that prevents diffusion of impurities such as water or hydrogen from the insulating layer 261b or the like to the semiconductor layer 221 and release of oxygen from the semiconductor layer 221. As the insulating layer 228, an insulating film similar to the insulating layer 232 can be used.

An opening reaching the semiconductor layer 221 is provided in the insulating layer 228 and the insulating layer 261*b*. The insulating layer 223 that is in contact with the side surfaces of the insulating layer 261*b*, the insulating layer 228, and the conductive layer 225 and the top surface of the semiconductor layer 221, and the conductive layer 224 are embedded in the opening. The conductive layer 224 functions as a second gate electrode and the insulating layer 223 functions as a second gate insulating layer.

The top surface of the conductive layer 224, the top surface of the insulating layer 223, and the top surface of the insulating layer 261*b* are planarized so that they are substantially level with each other, and an insulating layer 229 and an insulating layer 261*a* are provided to cover these layers.

Note that in this specification and the like, the expression "substantially level with" indicates a structure having the same level from a reference surface (e.g., a flat surface such as a substrate surface) in a cross-sectional view. For example, in a manufacturing process of a semiconductor device, planarization treatment (typically, CMP treatment) is performed, whereby the surface(s) of a single layer or a plurality of layers may be exposed. In that case, the surfaces on which the CMP treatment is performed are at the same level from a reference surface. In addition, the expression "substantially level with" includes the case of being level with each other. Note that a plurality of layers may be on different levels depending on a treatment apparatus, a treatment method, or a material of the treated surfaces, used for the CMP treatment. This case is also regarded as "substantially level with" in this specification and the like. For example, the expression "substantially level with" includes the case where two layers (here, given as a first layer and a second layer) have different two levels with respect to a reference surface and the difference between the top-surface level of the first layer and the top-surface level of the second layer is less than or equal to 20 nm.

The insulating layer 261*a* and the insulating layer 261*b* function as an interlayer insulating layer. The insulating layer 229 functions as a barrier layer that prevents diffusion of impurities such as water or hydrogen from the insulating layer 261*a* or the like to the transistor 220. As the insulating layer 229, an insulating film similar to the insulating layer 228 and the insulating layer 232 can be used.

The plug 271 electrically connected to one of the pair of conductive layers 225 is provided to be embedded in the insulating layer 261*a*, the insulating layer 229, and the insulating layer 261*b*. Here, the plug 271 preferably includes a conductive layer 271*a* covering the side surfaces of the opening in the insulating layer 261*a*, the insulating layer 261*b*, the insulating layer 229, and the insulating layer 228 and part of the top surface of the conductive layer 225, and a conductive layer 271*b* in contact with the top surface of the conductive layer 271*a*. In that case, a conductive material in which hydrogen and oxygen are unlikely to be diffused is preferably used for the conductive layer 271*a*.

Structure Example 2-3

Figure 12:
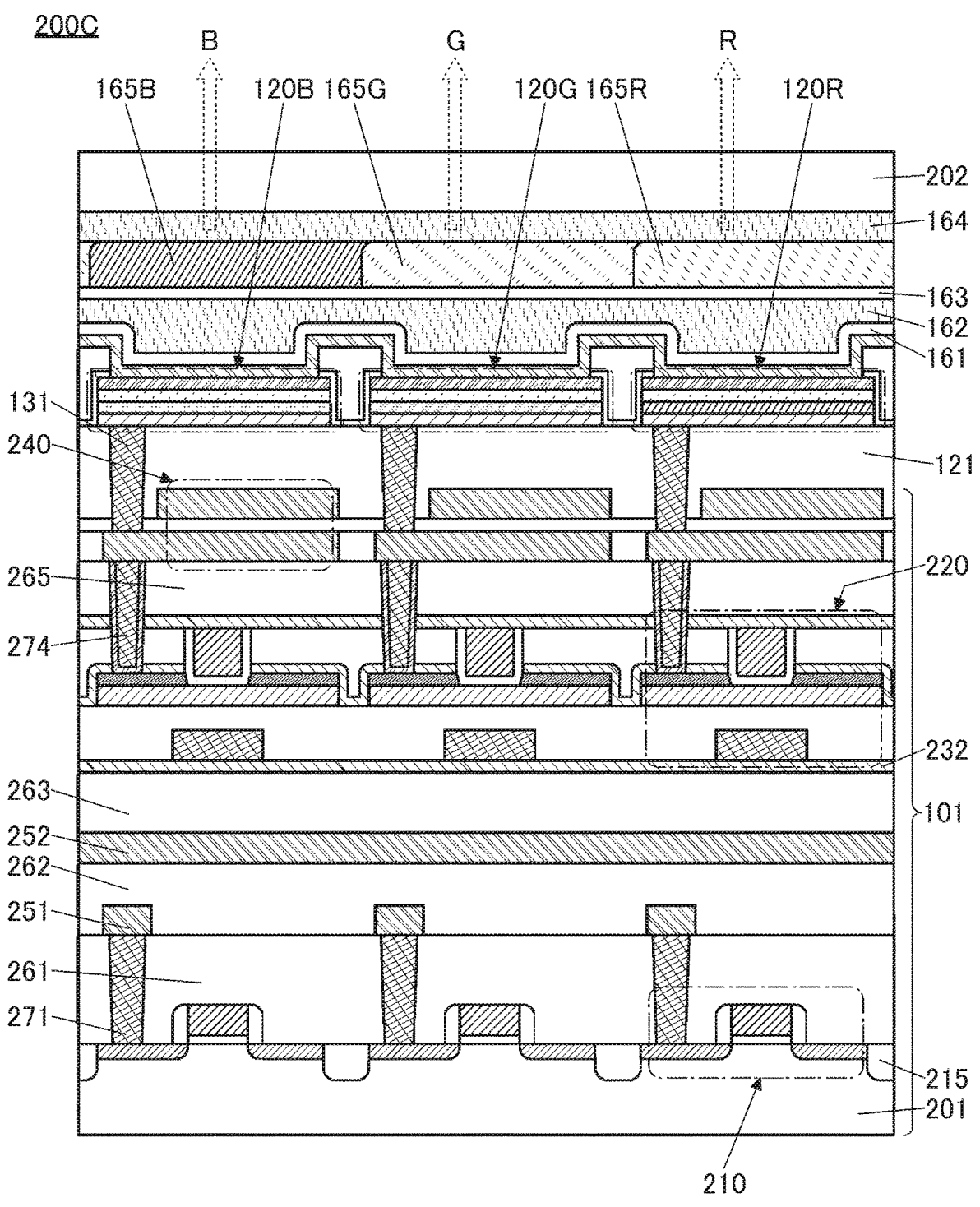
FIG. 12 is a diagram illustrating a structure example of a display device.

FIG. 12 is a schematic cross-sectional view of a display device 200C. The display device 200C has a structure in which the transistor 210 whose channel is formed in the substrate 201 and the transistor 220 including a metal oxide in the semiconductor layer where the channel is formed are stacked.

The insulating layer 261 is provided to cover the transistor 210 and a conductive layer 251 is provided over the insulating layer 261. An insulating layer 262 is provided to cover the conductive layer 251 and a conductive layer 252 is provided over the insulating layer 262. The conductive layer 251 and the conductive layer 252 each function as a wiring. An insulating layer 263 and the insulating layer 232 are provided to cover the conductive layer 252, and the transistor 220 is provided over the insulating layer 232. An insulating layer 265 is provided to cover the transistor 220, and the capacitor 240 is provided over the insulating layer 265. The capacitor 240 and the transistor 220 are electrically connected to each other through a plug 274.

The transistor 220 can be used as a transistor included in a pixel circuit. The transistor 210 can also be used as a transistor included in a pixel circuit or a transistor included in a driver circuit (a gate line driver circuit or a source line driver circuit) for driving the pixel circuit. The transistor 210 and the transistor 220 can also be used as transistors included in a variety of circuits such as an arithmetic circuit and a memory circuit.

With such a structure, not only the pixel circuit but also the driver circuit or the like can be formed directly under the light-emitting unit; thus, the display device can be downsized as compared with the case where the driver circuit is provided around a display region.

Structure Example 2-4

Figure 13:
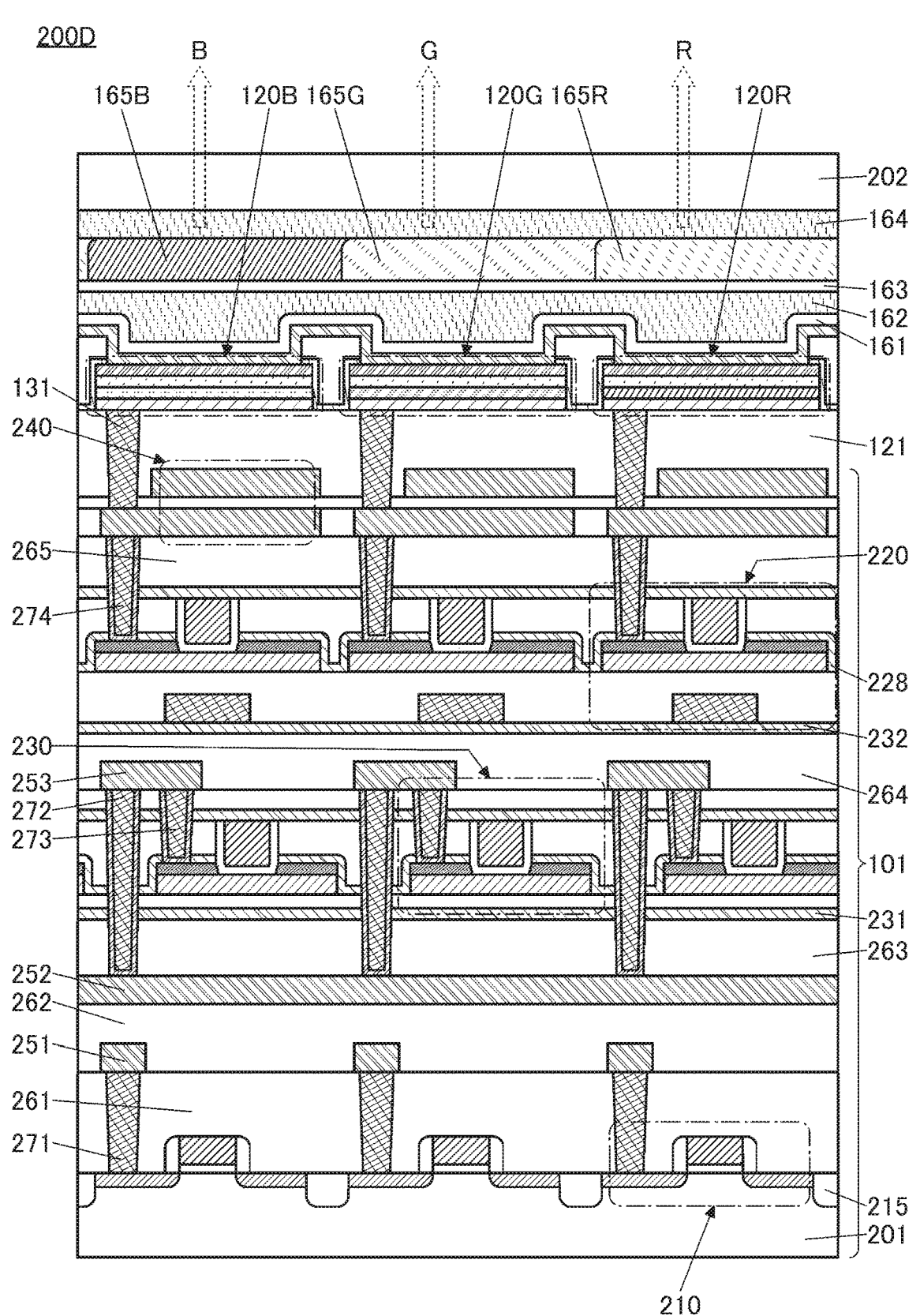
FIG. 13 is a diagram illustrating a structure example of a display device.

FIG. 13 is a schematic cross-sectional view of a display device 200D. The display device 200D is different from the display device 200C mainly in that two transistors using an oxide semiconductor are stacked.

The display device 200D includes a transistor 230 between the transistor 210 and the transistor 220. The transistor 230 has a structure similar to that of the transistor 220 except that the first gate electrode is not included. Note that the transistor 230 may have a structure including the first gate electrode.

The insulating layer 263 and an insulating layer 231 are provided to cover the conductive layer 252, and the transistor 230 is provided over the insulating layer 231. The transistor 230 and the conductive layer 252 are electrically connected to each other through a plug 273, a conductive layer 253, and a plug 272. An insulating layer 264 and the insulating layer 232 are provided to cover the conductive layer 253, and the transistor 220 is provided over the insulating layer 232.

The transistor 220 functions as, for example, a transistor for controlling current flowing through the light-emitting element 120. The transistor 230 functions as a selection transistor for controlling the selection state of a pixel. The transistor 210 functions as a transistor included in a driver circuit for driving a pixel, for example.

When three or more layers in which a transistor is formed are stacked in this manner, the area occupied by the pixel can be further reduced and a high-resolution display device can be achieved.

Components such as a transistor that can be used in the display device will be described below.

[Transistor]

The transistor includes a conductive layer functioning as a gate electrode, a semiconductor layer, a conductive layer functioning as a source electrode, a conductive layer functioning as a drain electrode, and an insulating layer functioning as a gate insulating layer.

Note that there is no particular limitation on the structure of the transistor included in the display device of one embodiment of the present invention. For example, a planar transistor, a staggered transistor, or an inverted staggered transistor may be used. A top-gate or bottom-gate transistor structure may be employed. Gate electrodes may be provided above and below a channel.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be inhibited.

A semiconductor layer of a transistor preferably contains a metal oxide (also referred to as an oxide semiconductor). That is, a transistor including a metal oxide in its channel formation region (hereinafter, an OS transistor) is preferably used for the display device of this embodiment. A metal oxide that can be used in an OS transistor will be described in Embodiment 4.

Alternatively, silicon may be used for a semiconductor in which a channel of a transistor is formed. As the silicon, amorphous silicon may be used but silicon having crystallinity is particularly preferably used. For example, microcrystalline silicon, polycrystalline silicon, or single crystal silicon is preferably used. In particular, polycrystalline silicon can be formed at a temperature lower than that for single crystal silicon and has higher field-effect mobility and higher reliability than amorphous silicon.

[Conductive Layer]

Examples of materials used for the gates (gate terminals or gate electrodes), the sources (source terminals, source regions, or source electrodes), and the drains (drain terminals, drain regions, or drain electrodes) of transistors and conductive layers such as a variety of wirings and electrodes included in the display device include metals such as aluminum, titanium, chromium, nickel, copper, yttrium, zirconium, molybdenum, silver, tantalum, and tungsten, and an alloy containing any of these metals as its main component. A single-layer structure or stacked-layer structure including a film containing any of these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. Copper containing manganese is preferably used because it increases controllability of a shape by etching.

[Insulating Layer]

Examples of an insulating material that can be used for the insulating layers include resins such as an acrylic resin and an epoxy resin, a resin having a siloxane bond, such as silicone, and inorganic insulating materials such as silicon oxide, silicon oxynitride, silicon nitride oxide, silicon nitride, and aluminum oxide.

Note that in this specification, an oxynitride refers to a material that contains more oxygen than nitrogen in its composition, and a nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

The light-emitting element is preferably provided between a pair of insulating films with low water permeability. In that case, impurities such as water can be inhibited from entering the light-emitting element; thus, a decrease in device reliability can be inhibited.

Examples of the insulating film with low water permeability include a film containing nitrogen and silicon, such as a silicon nitride film and a silicon nitride oxide film, and a film containing nitrogen and aluminum, such as an aluminum nitride film. Alternatively, a silicon oxide film, a silicon oxynitride film, an aluminum oxide film, or the like may be used.

For example, the moisture vapor transmission rate of the insulating film with low water permeability is lower than or equal to $1 \times 10^{-5}$ [g/(m$^2$·day)], preferably lower than or equal to $1 \times 10^{-6}$ [g/(m$^2$·day)], further preferably lower than or equal to $1 \times 10^{-7}$ [g/(m$^2$·day)], still further preferably lower than or equal to $1 \times 10^{-8}$ [g/(m$^2$·day)].

Structure Example of Display Module

A structure example of a display module including the display device of one embodiment of the present invention will be described below.

Figure 14A:
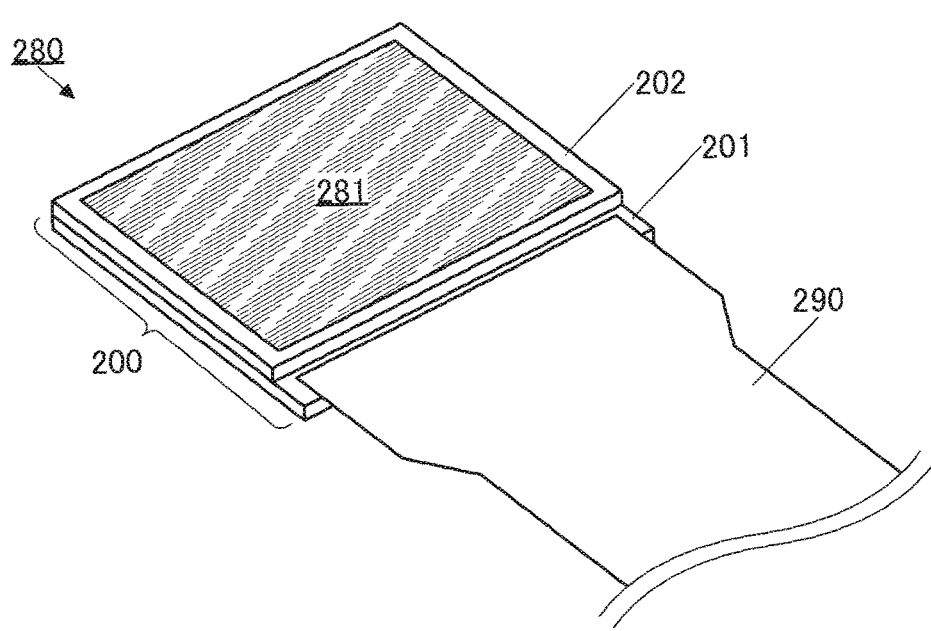
FIG. 14A and FIG. 14B are diagrams illustrating a structure example of a display module.

FIG. 14A is a schematic perspective view of a display module 280. The display module 280 includes the display device 200 and an FPC 290. Any of the display devices (the display device 200A to the display device 200D) described above in Structure example 2 can be used as the display device 200.

The display module 280 includes the substrate 201 and the substrate 202. A display portion 281 is also included on the substrate 202 side. The display portion 281 is a region of the display module 280 where an image is displayed and is a region where light emitted from pixels provided in a pixel portion 284 described later can be seen.

Figure 14B:
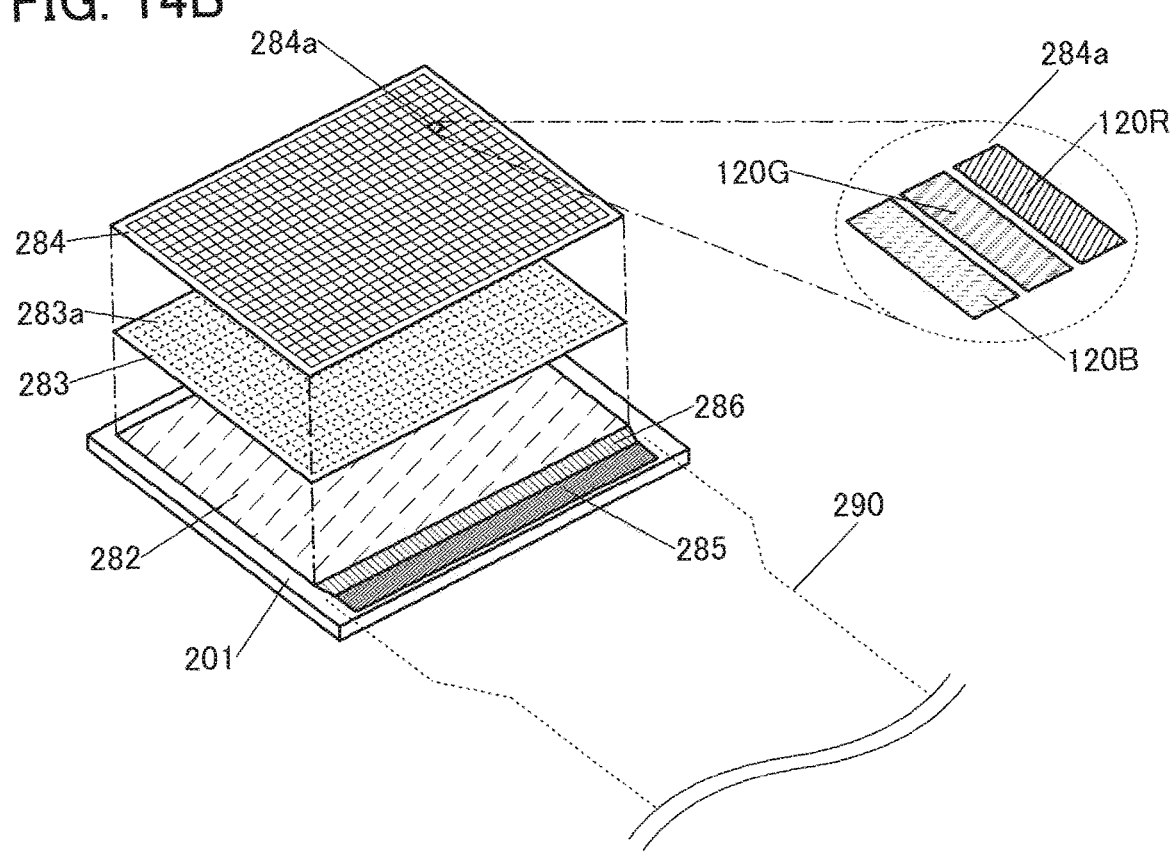

FIG. 14B is a perspective view schematically illustrating a structure on the substrate 201 side. The substrate 201 has a structure in which a circuit portion 282, a pixel circuit portion 283 over the circuit portion 282, and the pixel portion 284 over the pixel circuit portion 283 are stacked. In addition, a terminal portion 285 for connection to the FPC 290 is included in a portion not overlapping with the pixel portion 284 over the substrate 201. The terminal portion 285 and the circuit portion 282 are electrically connected to each other through a wiring portion 286 formed of a plurality of wirings.

The pixel portion 284 includes a plurality of pixels 284a that are periodically arranged. An enlarged view of one pixel 284a is illustrated on the right side of FIG. 14B. The pixel 284a includes the light-emitting element 120R, the light-emitting element 120G, and the light-emitting element 120B.

The pixel circuit portion 283 includes a plurality of pixel circuits 283a that are periodically arranged. The plurality of pixel circuits 283a may be placed in stripe arrangement illustrated in FIG. 14B. Alternatively, a variety of arrangement methods such as delta arrangement and PenTile arrangement can be employed.

One pixel circuit 283a is a circuit that controls light emission from three light-emitting elements included in one pixel 284a. One pixel circuit 283a may be provided with three circuits each of which controls light emission from one light-emitting element. For example, the pixel circuit 283a for one light-emitting element can include at least one selection transistor, one current control transistor (driving transistor), and a capacitor. In this case, a gate signal is input to a gate of the selection transistor and a source signal is input to one of a source and a drain thereof. With such a structure, an active-matrix display device is achieved.

The circuit portion 282 includes a circuit for driving the pixel circuits 283a in the pixel circuit portion 283. For example, a gate line driver circuit and a source line driver circuit are preferably included. In addition, an arithmetic circuit, a memory circuit, a power supply circuit, or the like may be included.

The FPC 290 functions as a wiring for supplying a video signal or a power supply potential to the circuit portion 282 from the outside. In addition, an IC may be mounted on the FPC 290.

The display module 280 can have a structure in which the pixel circuit portion 283, the circuit portion 282, and the like are stacked below the pixel portion 284; thus, the aperture ratio (the effective display area ratio) of the display portion 281 can be significantly high. For example, the aperture ratio of the display portion 281 can be higher than or equal to 40% and lower than 100%, preferably higher than or equal to 50% and lower than or equal to 95%, further preferably higher than or equal to 60% and lower than or equal to 95%. Furthermore, the pixels 284a can be arranged extremely densely and thus the display portion 281 can have extremely high resolution. For example, the pixels 284a are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a device for VR such as a head-mounted display or a glasses-type device for AR. For example, even in the case of a structure in which the display portion of the display module 280 is seen through a lens, pixels of the extremely-high-resolution display portion 281 included in the display module 280 are prevented from being seen when the display portion is enlarged by the lens, so that display providing a high sense of immersion can be performed. Without limitation to the above, the display module 280 can also be suitably used for an electronic device having a relatively small display portion. For example, the display module 280 can also be suitably used for a display portion of a wearable electronic device such as a wrist watch.

At least part of this embodiment can be implemented in combination with the other embodiments described in this specification as appropriate.

Embodiment 2

In this embodiment, a display device of one embodiment of the present invention will be described with reference to FIG. 15.

Figure 15A:
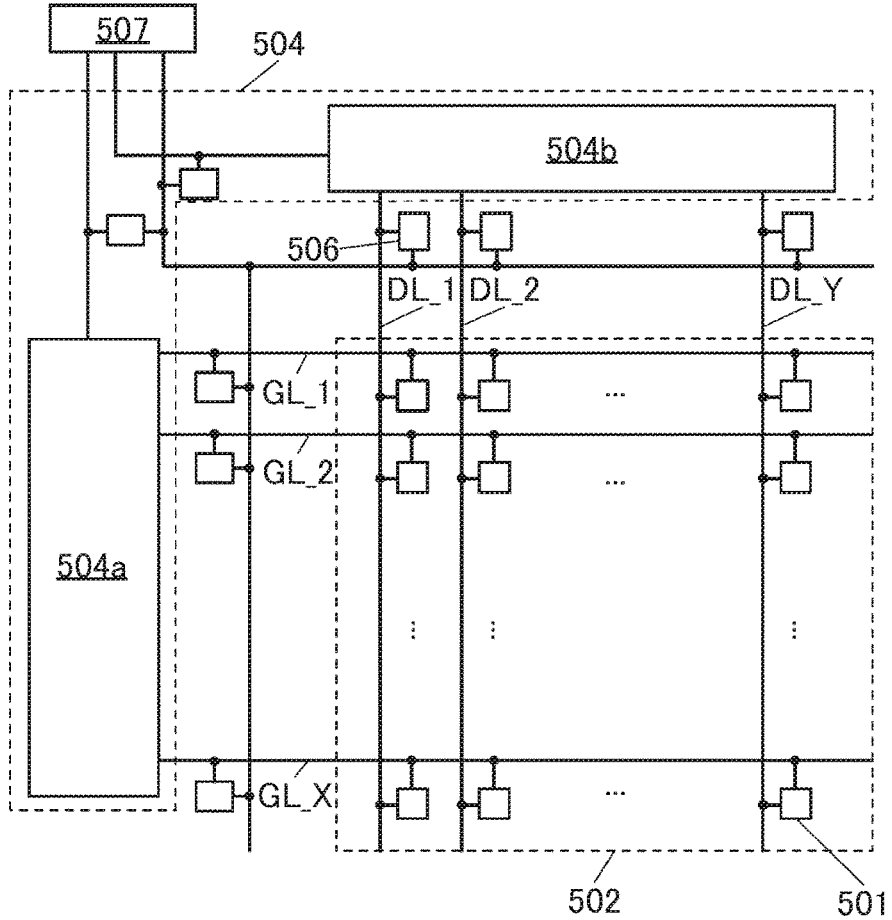
FIG. 15A and FIG. 15B are circuit diagrams illustrating an example of a display device.

A display device illustrated in FIG. 15A includes a pixel portion 502, a driver circuit portion 504, protection circuits 506, and a terminal portion 507. Note that the display device of one embodiment of the present invention may have a structure in which the protection circuits 506 are not provided.

The pixel portion 502 includes a plurality of pixel circuits 501 arranged in X rows and Y columns (X and Y each independently represent a natural number of 2 or more). Each of the pixel circuits 501 includes a circuit for driving a display element.

The driver circuit portion 504 includes driver circuits such as a gate driver 504a that outputs a scan signal to a gate line GL_1 to a gate line GL_X and a source driver 504b that supplies a data signal to a data line DL_1 to a data line DL_Y. The gate driver 504a includes at least a shift register. The source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is supplied to a wiring to which the protection circuit 506 is connected, establishes continuity between the wiring and another wiring. The protection circuit 506 illustrated in FIG. 15A is connected to a variety of wirings such as the gate lines GL that are wirings between the gate driver 504a and the pixel circuits 501 and the data lines DL that are wirings between the source driver 504b and the pixel circuits 501, for example.

The gate driver 504a and the source driver 504b may be provided over the same substrate as the pixel portion 502, or a substrate where a gate driver circuit or a source driver circuit is separately formed (e.g., a driver circuit board formed using a single crystal semiconductor or a polycrystalline semiconductor) may be mounted on the substrate by COG or TAB (Tape Automated Bonding).

In particular, the gate driver 504a and the source driver 504b are preferably placed below the pixel portion 502.

Figure 15B:
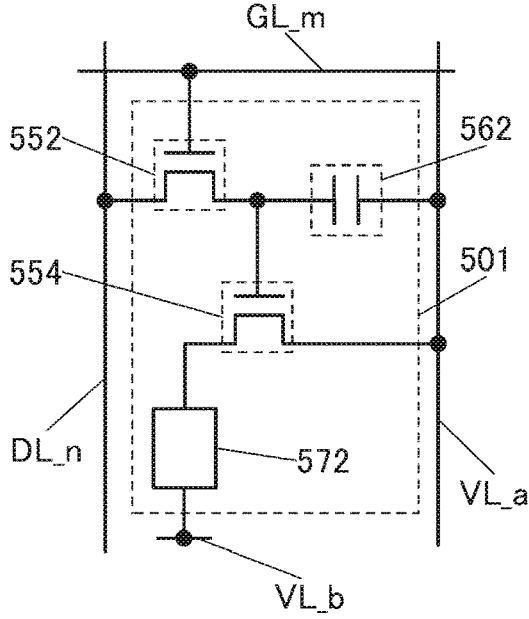

The plurality of pixel circuits 501 illustrated in FIG. 15A can have a structure illustrated in FIG. 15B, for example.

The pixel circuit 501 illustrated in FIG. 15B includes a transistor 552, a transistor 554, a capacitor 562, and a light-emitting element 572. The data line DL_n (n is an integer greater than or equal to 1 and less than or equal to Y), the gate line GL_m (m is an integer greater than or equal to 1 and less than or equal to X), a potential supply line VL_a, a potential supply line VL_b, and the like are connected to the pixel circuit 501.

Note that a high power supply potential VDD is supplied to one of the potential supply line VL_a and the potential supply line VL_b, and a low power supply potential VSS is supplied to the other. Current flowing through the light-emitting element 572 is controlled in accordance with a potential supplied to a gate of the transistor 554, whereby the luminance of light emitted from the light-emitting element 572 is controlled.

At least part of this embodiment can be implemented in combination with the other embodiments described in this specification as appropriate.

Embodiment 3

A pixel circuit including a memory for correcting gray levels displayed by pixels that can be used in the display device of one embodiment of the present invention and a display device including the pixel circuit will be described below.

[Circuit Structure]

Figure 16A:
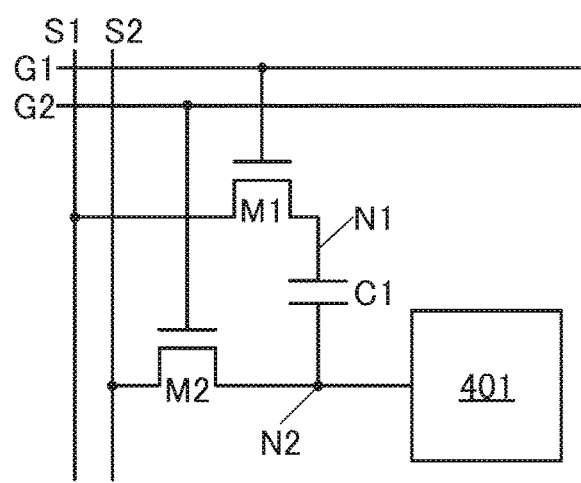
FIG. 16A and FIG. 16C are circuit diagrams illustrating examples of display devices.

FIG. 16A is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other is connected to one electrode of the capacitor C1. In the transistor M2, a gate is connected to the wiring G2, one of a source and a drain is connected to the wiring S2, and the other is connected to the other electrode of the capacitor C1 and the circuit 401.

The circuit 401 is a circuit including at least one display element. Any of a variety of elements can be used as the display element, and typically, a light-emitting element such as an organic EL element or an LED element can be used. In addition, a liquid crystal element, a MEMS (Micro Electro Mechanical Systems) element, or the like can also be used.

A node connecting the transistor M1 and the capacitor C1 is denoted as a node N1, and a node connecting the transistor M2 and the circuit 401 is denoted as a node N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1, can be used as one or both of the transistor M1 and the transistor M2. Accordingly, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

Driving Method Example

Figure 16B:
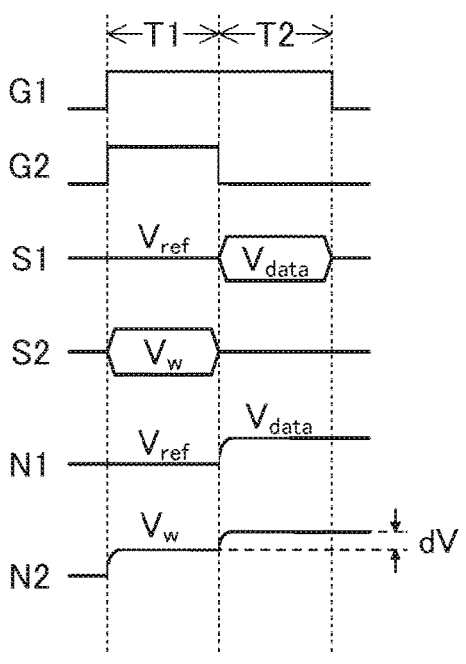
FIG. 16B is a timing chart showing an operation example of the display device.

Next, an example of a method for operating the pixel circuit 400 is described with reference to FIG. 16B. FIG. 16B is a timing chart for the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 16B, one frame period is divided into a period T1 and a period T2. The period T1 is a period in which a potential is written to the node N2, and the period T2 is a period in which a potential is written to the node Ni.

[Period T1]

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied from the wiring S2 to the node N2 through the transistor M2. Accordingly, a potential difference $V_w - V_{ref}$ is retained in the capacitor C1.

[Period T2]

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied from the wiring S1 to the node N1 through the transistor M1. At this time, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although the potential dV is shown as a positive value in FIG. 16B, the potential dV may be a negative value. That is, the second data potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. For example, in the case of using a light-emitting element, high-dynamic range (HDR) display or the like can be performed. In the case of using a liquid crystal element, overdriving or the like can be achieved.

Application Example

Figure 16C:
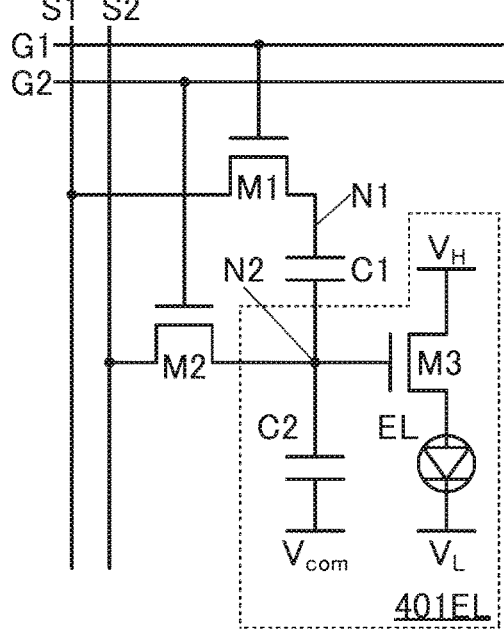

A pixel circuit 400EL illustrated in FIG. 16C includes a circuit 401EL. The circuit 401EL includes a light-emitting element EL, a transistor M3, and a capacitor C2.

In the transistor M3, a gate is connected to the node N2 and one electrode of the capacitor C2, one of a source and a drain is connected to a wiring that supplies a potential $V_H$, and the other is connected to one electrode of the light-emitting element EL. The other electrode of the capacitor C2 is connected to a wiring that supplies a potential $V_{com}$. The other electrode of the light-emitting element EL is connected to a wiring that supplies a potential $V_L$.

The transistor M3 has a function of controlling current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential $V_H$ and the potential $V_L$ can be changed as appropriate.

In the pixel circuit 400EL, a large amount of current can flow through the light-emitting element EL when a high potential is supplied to the gate of the transistor M3, which enables HDR display, for example. Moreover, a variation in the electrical characteristics of the transistor M3 or the light-emitting element EL can be corrected by supply of a correction signal to the wiring S1 or the wiring S2.

Note that the structure is not limited to the circuit illustrated in FIG. 16C, and a structure to which a transistor, a capacitor, or the like is further added may be employed.

At least part of this embodiment can be implemented in combination with the other embodiments described in this specification as appropriate.

Embodiment 4

Described in this embodiment is a metal oxide (also referred to as an oxide semiconductor) that can be used in the OS transistor described in the above embodiment.

As a semiconductor material used for the transistor, a metal oxide whose energy gap is greater than or equal to 2 eV, preferably greater than or equal to 2.5 eV, further preferably greater than or equal to 3 eV can be used. A typical example thereof is a metal oxide containing indium.

The metal oxide preferably contains indium, M (M is one or more kinds selected from gallium, aluminum, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin.

It is particularly preferable that an oxide containing indium (In), gallium (Ga), and zinc (Zn) (also referred to as IGZO) be used for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

Note that the composition is not limited to those, and an oxide semiconductor having an appropriate composition may be used depending on required semiconductor characteristics and electrical characteristics (field-effect mobility, threshold voltage, and the like) of the transistor. In addition, to obtain the required semiconductor characteristics of the transistor, it is preferable that the carrier concentration, impurity concentration, defect density, atomic ratio between a metal element and oxygen, interatomic distance, density, and the like of the semiconductor layer be set to be appropriate.

The metal oxide can be formed by a sputtering method, a CVD method such as an MOCVD method, an ALD method, or the like.

<Classification of Crystal Structures>

Amorphous (including completely amorphous), CAAC (c-axis-aligned crystalline), nc (nanocrystalline), CAC (cloud-aligned composite), single crystal, and polycrystalline (poly crystal) structures can be given as examples of a crystal structure of an oxide semiconductor.

A crystal structure of a film or a substrate can be evaluated with an X-ray diffraction (XRD) spectrum. For example, evaluation is possible using an XRD spectrum obtained by GIXD (Grazing-Incidence XRD) measurement. Note that a GIXD method is also referred to as a thin film method or a Seemann-Bohlin method.

For example, the XRD spectrum of a quartz glass substrate shows a peak with a substantially bilaterally symmetrical shape. On the other hand, the peak of the XRD spectrum of an IGZO film having a crystal structure has a bilaterally asymmetrical shape. The asymmetrical peak of the XRD spectrum clearly shows the existence of a crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction method (NBED) (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film formed at room temperature. Thus, it is suggested that the IGZO film formed at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the maximum diameter of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, or the like.

A crystal structure in which a clear grain boundary is observed is what is called polycrystal. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has a small amount of impurities or defects (e.g., oxygen vacancies). Hence, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Hence, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has a higher hydrogen concentration in the film than the nc-OS and the CAAC-OS.

<<Composition of Oxide Semiconductor>>

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes an indium oxide, an indium zinc oxide, or the like as its main component. The second region includes a gallium oxide, a gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a film formation gas. The ratio of the flow rate of the oxygen gas to the total flow rate of the film formation gas in film formation is preferably as low as possible; for example, the ratio of the flow rate of the oxygen gas to the total flow rate of the film formation gas in film formation is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

The second region has a higher insulating property than the first region. In other words, when the second regions are distributed in a metal oxide, leakage current can be inhibited.

Thus, in the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility ($\mu$) and excellent switching operation can be achieved.

A transistor using the CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1\times10^{17}$ cm$^3$, preferably lower than or equal to $1\times10^{15}$ cm$^3$, further preferably lower than or equal to $1\times10^{13}$ cm$^3$, still further preferably lower than or equal to $1\times10^{11}$ cm$^3$, yet further preferably lower than $1\times10^{10}$ cm$^3$, and higher than or equal to $1\times10^{-9}$ cm$^3$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Accordingly, a transistor using an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1\times10^{18}$ atoms/$cm^3$, preferably lower than or equal to $2\times10^{16}$ atoms/$cm^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 5

In this embodiment, electronic devices of one embodiment of the present invention will be described with reference to FIG. 17 to FIG. 19.

An electronic device in this embodiment includes the display device of one embodiment of the present invention. For the display device of one embodiment of the present invention, increases in resolution, definition, and sizes are easily achieved. Thus, the display device of one embodiment of the present invention can be used for display portions of a variety of electronic devices.

The display device of one embodiment of the present invention can be fabricated at low cost, which leads to a reduction in manufacturing cost of an electronic device.

Examples of electronic devices include electronic devices with a relatively large screen, such as a television device, a desktop or laptop personal computer, a monitor of a computer or the like, digital signage, and a large game machine such as a pachinko machine; a digital camera; a digital video camera; a digital photo frame; a mobile phone; a portable game machine; a portable information terminal; and an audio reproducing device.

In particular, the display device of one embodiment of the present invention can have a high resolution, and thus can be suitably used for an electronic device having a relatively small display portion. Examples of such an electronic device include information terminals that can be worn on a head (wearable devices) such as a glasses-type device for AR and a device for VR such as a head-mounted display, a watch-type wearable device, and a bracelet-type wearable device. Examples of wearable devices include a device for SR and a device for MR.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, definition of 4K2K, 8K4K, or higher is preferable. Furthermore, the pixel density (resolution) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With such a display device with high definition and high resolution, the electronic device can have higher realistic sensation, sense of depth, and the like in personal use such as portable use and home use.

The electronic device in this embodiment can be incorporated along a curved surface of an inside wall or an outside wall of a house or a building or the interior or the exterior of a car.

The electronic device in this embodiment may include an antenna. With the antenna receiving a signal, a video, information, and the like can be displayed on a display portion. When the electronic device includes an antenna and a secondary battery, the antenna may be used for contactless power transmission.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, electric power, radiation, a flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 17A:
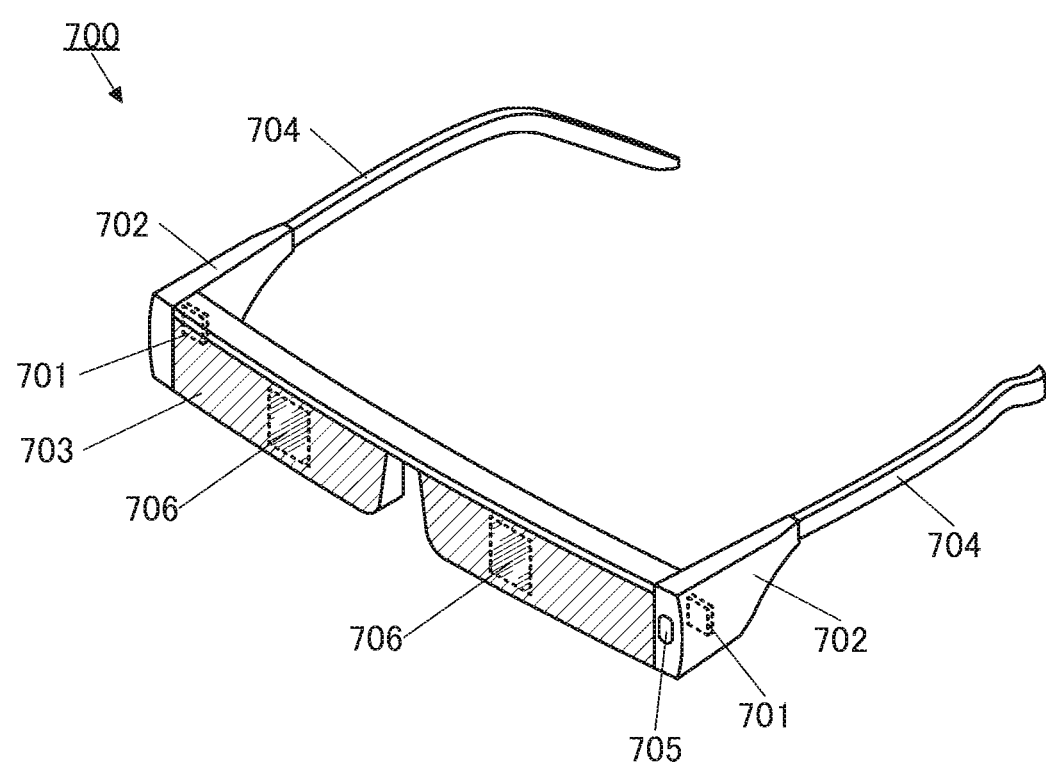
FIG. 17A and FIG. 17B are diagrams illustrating a structure example of an electronic device.

FIG. 17A is a perspective view of a glasses-type electronic device 700. The electronic device 700 includes a pair of display panels 701, a pair of housings 702, a pair of optical members 703, a pair of temples 704, and the like.

The electronic device 700 can project an image displayed on the display panel 701 onto a display region 706 of the optical member 703. Since the optical members 703 have a light-transmitting property, a user can see images displayed on the display regions 706, which are superimposed on transmission images seen through the optical members 703. Thus, the electronic device 700 is an electronic device capable of AR display.

One housing 702 is provided with a camera 705 capable of taking an image of what lies in front thereof. Although not illustrated, one of the housings 702 is provided with a wireless receiver or a connector to which a cable can be connected, whereby a video signal or the like can be supplied to the housing 702. Furthermore, when the housing 702 is provided with an acceleration sensor such as a gyroscope sensor, the orientation of the user's head can be detected and an image corresponding to the orientation can be displayed on the display region 706. Moreover, the housing 702 is preferably provided with a battery, and charging can be performed with or without a wire.

Figure 17B:
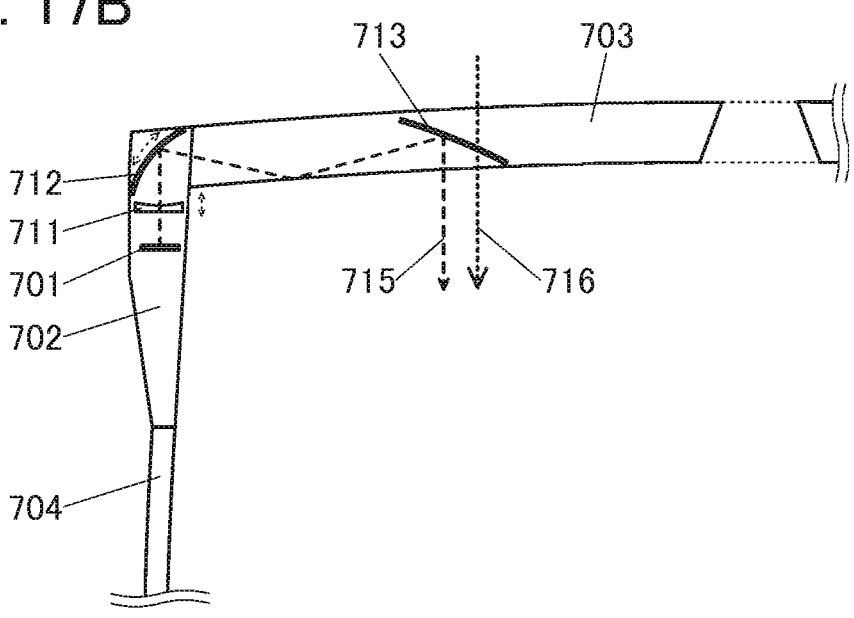

Next, a method for projecting an image on the display region 706 of the electronic device 700 is described with reference to FIG. 17B. The display panel 701, a lens 711, and a reflective plate 712 are provided in the housing 702. In addition, a reflective surface 713 functioning as a half mirror is provided in a portion corresponding to the display region 706 of the optical member 703.

Light 715 emitted from the display panel 701 passes through the lens 711 and is reflected by the reflective plate 712 toward the optical member 703. In the optical member 703, the light 715 is fully reflected repeatedly by end surfaces of the optical member 703 and reaches the reflective surface 713, whereby an image is projected on the reflective surface 713. Accordingly, the user can see both the light 715 reflected by the reflective surface 713 and transmitted light 716 that passes through the optical member 703 (including the reflective surface 713).

FIG. 17 illustrates an example in which the reflective plate 712 and the reflective surface 713 each have a curved surface. This structure can increase optical design flexibility and reduce the thickness of the optical member 703, compared to the case where the reflective plate 712 and the reflective surface 713 are flat. Note that the reflective plate 712 and the reflective surface 713 may be flat.

The reflective plate 712 can use a component having a mirror surface and preferably has high reflectance. As the reflective surface 713, a half mirror utilizing reflection of a metal film may be used, but the use of a total-reflection prism or the like can increase the transmittance of the transmitted light 716.

Here, the housing 702 preferably includes a mechanism for adjusting the distance or angle between the lens 711 and the display panel 701. This enables focus adjustment and zooming in/out of an image, for example. One or both of the lens 711 and the display panel 701 are preferably configured to be movable in the optical-axis direction, for example.

The housing 702 preferably includes a mechanism capable of adjusting the angle of the reflective plate 712. The position of the display region 706 where images are displayed can be changed by changing the angle of the reflective plate 712. Thus, the display region 706 can be placed at the optimum position in accordance with the position of the user's eye.

The display device or the display module of one embodiment of the present invention can be used for the display panel 701. Thus, the electronic device 700 can perform display with extremely high resolution.

Figures 18A, 18B:
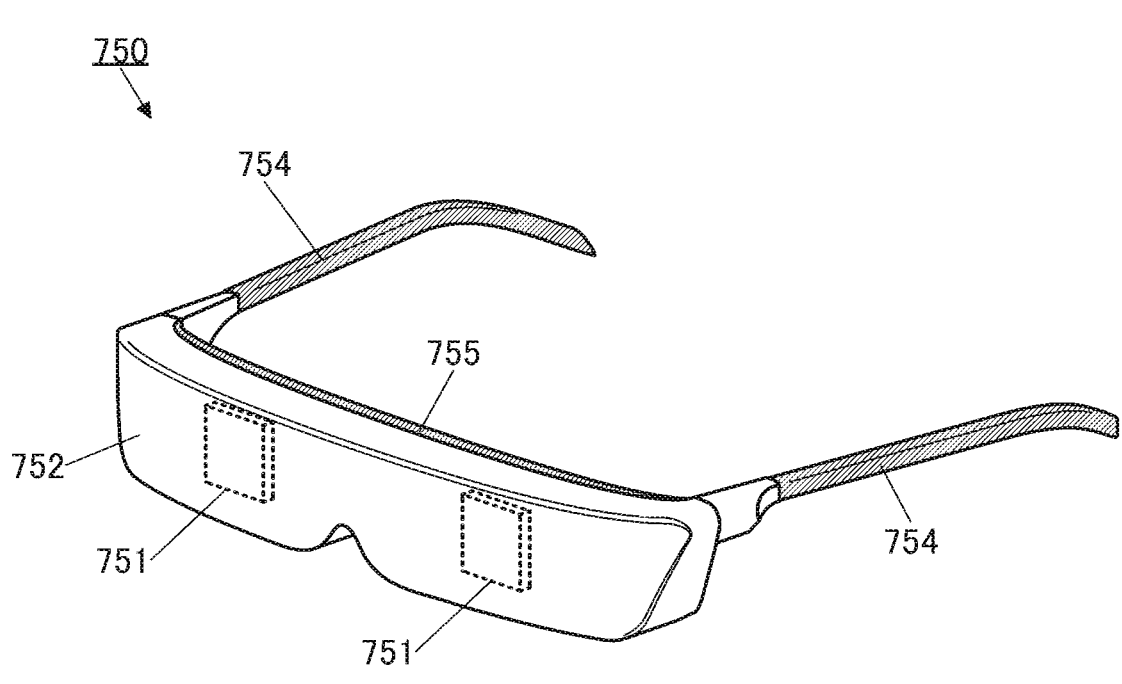
FIG. 18A and FIG. 18B are diagrams illustrating a structure example of an electronic device.

FIG. 18A and FIG. 18B are perspective views of a goggle-type electronic device 750. FIG. 18A is a perspective view illustrating the front surface, the top surface, and the left side surface of the electronic device 750, and FIG. 18B is a perspective view illustrating the back surface, the bottom surface, and the right side surface of the electronic device 750.

The electronic device 750 includes a pair of display panels 751, a housing 752, a pair of temples 754, a cushion 755, a pair of lenses 756, and the like. The pair of display panels 751 is positioned to be seen through the lenses 756 inside the housing 752.

The electronic device 750 is an electronic device for VR. A user wearing the electronic device 750 can see an image displayed on the display panel 751 through the lens 756. Furthermore, the pair of display panels 751 may display different images, whereby three-dimensional display using parallax can be performed.

An input terminal 757 and an output terminal 758 are provided on the back side of the housing 752. To the input terminal 757, a cable for supplying a video signal from a video output device or the like, power for charging a battery provided in the housing 752, or the like can be connected. The output terminal 758 can function as, for example, an audio output terminal to which earphones, headphones, or the like can be connected. Note that in the case where audio data can be output by wireless communication or sound is output from an external video output device, the audio output terminal is not necessarily provided.

The housing 752 preferably includes a mechanism by which the left and right positions of the lens 756 and the display panel 751 can be adjusted to the optimal positions in accordance with the position of the user's eye. In addition, the housing 752 preferably includes a mechanism for adjusting focus by changing the distance between the lens 756 and the display panel 751.

The display device or the display module of one embodiment of the present invention can be used for the display panel 751. Thus, the electronic device 750 can perform display with extremely high resolution. This enables a user to feel a high sense of immersion.

The cushion 755 is a portion in contact with the user's face (forehead, cheek, or the like). The cushion 755 is in close contact with the user's face, so that light leakage can be prevented, which increases the sense of immersion. A soft material is preferably used for the cushion 755 so that the cushion 755 is in close contact with the face of the user wearing the electronic device 750. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 755, whereby light leakage can be suitably prevented. Furthermore, using such a material is preferable because it has a soft texture and the user does not feel cold when wearing the device in a cold season, for example. The member in contact with user's skin, such as the cushion 755 or the temple 754, is preferably detachable because cleaning or replacement can be easily performed.

The electronic devices illustrated in FIG. 19A to FIG. 19F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The display device of one embodiment of the present invention can be used for a display portion 9001.

The details of the electronic devices illustrated in FIG. 19A to FIG. 19F will be described below.

FIG. 19A is a perspective view illustrating a watch-type portable information terminal 9200. For example, the portable information terminal 9200 can be used as a Smartwatch (registered trademark). The display surface of the display portion 9001 is curved and provided, and display can be performed along the curved display surface. Mutual communication between the portable information terminal 9200 and, for example, a headset capable of wireless communication enables hands-free calling. With a connection terminal 9006, the portable information terminal 9200 can perform mutual data transmission with another information terminal and charging. Note that the charging operation may be performed by wireless power feeding.

FIG. 19B is a perspective view illustrating a portable information terminal 9101. For example, the portable information terminal 9101 can be used as a smartphone. Note that the portable information terminal 9101 may be provided with a speaker 9003, the connection terminal 9006, a sensor 9007, and the like. The portable information terminal 9101 can display characters or image information on its plurality of surfaces. FIG. 19B illustrates an example in which three icons 9050 are displayed. Information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the reception strength of an antenna. Alternatively, the icon 9050 or the like may be displayed in the position where the information 9051 is displayed.

FIG. 19C is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

FIG. 19D to FIG. 19F are perspective views illustrating a foldable portable information terminal 9201. FIG. 19D is a perspective view of an opened state of the portable information terminal 9201, FIG. 19F is a perspective view of a folded state thereof, and FIG. 19E is a perspective view of a state in the middle of change from one of FIG. 19D and FIG. 19F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 0.1 mm and less than or equal to 150 mm.

At least part of the structure examples, the drawings corresponding thereto, and the like described in this embodiment as an example can be combined with the other structure examples, the other drawings, and the like as appropriate.

REFERENCE NUMERALS

DL_1: data line, DL_n: data line, DL_Y: data line, DL: data line, dV: potential, GL_1: gate line, GL_m: gate line, GL_X: gate line, GL: gate line, $V_{com}$: potential, $V_{data}$: second data potential, VDD: high power supply potential, $V_H$: potential, VL_a: potential supply line, VL_b: potential supply line, $V_L$: potential, $V_{ref}$: potential, VSS: low power supply potential, $V_w$-$V_{ref}$: potential difference, $V_w$: first data potential, 100: display device, 101: substrate, 111: conductive layer, 111B: conductive layer, 111f: conductive film, 111G: conductive layer, 111R: conductive layer, 113: layer, 113B: layer, 113Bf: film, 113BF: film, 113G: layer, 113Gf: film, 113GF: film, 113R: layer, 113Rf: film, 113RF: film, 114: layer, 114B: layer, 114f: film, 114G: layer, 114R: layer, 115: EL layer, 115a: EL layer, 115b: EL layer, 115B: EL layer, 115G: EL layer, 115R: EL layer, 116: conductive layer, 116B: conductive layer, 116f: conductive film, 116G: conductive layer, 116R: conductive layer, 117: insulating layer, 117f: insulating film, 118: insulating layer, 118a: insulating layer, 118b: insulating layer, 118f: insulating film, 120: light-emitting element, 120B: light-emitting element, 120G: light-emitting element, 120R: light-emitting element, 121: insulating layer, 131: plug, 132: structure body, 133: conductive layer, 134: layer, 135: conductive layer, 137: gap, 139: conductive layer, 139f: conductive film, 141B: sacrificial layer, 141BF: sacrificial film, 141G: sacrificial layer, 141GF: sacrificial film, 141R: sacrificial layer, 141RF: sacrificial film, 151B: resist mask, 151G: resist mask, 151R: resist mask, 152: resist mask, 152B: resist mask, 152G: resist mask, 152P: resist mask, 152R: resist mask, 153: resist mask, 154: resist mask, 161: insulating layer, 162: insulating layer, 163: insulating layer, 164: adhesive layer, 165B: coloring layer, 165G: coloring layer, 165R: coloring layer, 171: region, 172: region, 200: display device, 200A: display device, 200B: display device, 200C: display device, 200D: display device, 201: substrate, 202: substrate, 210: transistor, 211: conductive layer, 212: low-resistance region, 213: insulating layer, 214: insulating layer, 215: element isolation layer, 220: transistor, 221: semiconductor layer, 223: insulating layer, 224: conductive layer, 225: conductive layer, 226: insulating layer, 227: conductive layer, 228: insulating layer, 229: insulating layer, 230: transistor, 231: insulating layer, 232: insulating layer, 240: capacitor, 241: conductive layer, 242: conductive layer, 243: insulating layer, 251: conductive layer, 252: conductive layer, 253: conductive layer, 261: insulating layer, 261a: insulating layer, 261b: insulating layer, 262: insulating layer, 263: insulating layer, 264: insulating layer, 265: insulating layer, 271: plug, 271a: conductive layer, 271b: conductive layer, 272: plug, 273: plug, 274: plug, 280: display module, 281: display portion, 282: circuit portion, 283: pixel circuit portion, 283a: pixel circuit, 284: pixel portion, 284a: pixel, 285: terminal portion, 286: wiring portion, 290: FPC, 400: pixel circuit, 400EL: pixel circuit, 401: circuit, 401EL: circuit, 501: pixel circuit, 502: pixel portion, 504: driver circuit portion, 504a: gate driver, 504b: source driver, 506: protection circuit, 507: terminal portion, 552: transistor, 554: transistor, 562: capacitor, 572: light-emitting element, 700: electronic device, 701: display panel, 702: housing, 703: optical member, 704: temple, 705: camera, 706: display region, 711: lens, 712: reflective plate, 713: reflective surface, 715: light, 716: transmitted light, 750: electronic device, 751: display panel, 752: housing, 754: temple, 755: cushion, 756: lens, 757: input terminal, 758: output terminal, 4411: light-emitting layer, 4412: light-emitting layer, 4413: light-emitting layer, 4420: layer, 4420-1: layer, 4420-2: layer, 4430: layer, 4430-1: layer, 4430-2: layer, 4440: intermediate layer, 9000: housing, 9001: display portion, 9003: speaker, 9006: connection terminal, 9007: sensor, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display device comprising:
a first insulating layer; and
a light-emitting element and a structure body over the first insulating layer,
wherein the structure body is configured to be a wiring or a plug,
wherein the structure body comprises:
a first conductive layer over and in contact with the first insulating layer;
a first layer over the first conductive layer; and
a second conductive layer over the first layer,
wherein a third conductive layer is over the light-emitting element and the second conductive layer,
wherein the light-emitting element comprises:
a fourth conductive layer over and in contact with the first insulating layer;
a second layer over the fourth conductive layer;
a third layer over the second layer; and
a fifth conductive layer over the third layer,
wherein the third conductive layer is over and in contact with the second conductive layer and the fifth conductive layer,
wherein the second layer comprises a light-emitting compound,
wherein the first conductive layer comprises a material identical to a material of the fourth conductive layer, wherein the first layer comprises a material identical to a material of the third layer, and
wherein the second conductive layer comprises a material identical to a material of the fifth conductive layer.

2. The display device according to claim 1, wherein the third layer comprises a substance with a high electron-injection property.

3. The display device according to claim 1, wherein the third layer comprises lithium fluoride.

4. A display device comprising:
a first insulating layer;
a light-emitting element and a structure body over the first insulating layer; and
a second insulating layer over the light-emitting element and the structure body,
wherein the structure body is configured to be a wiring or a plug,
wherein the structure body comprises:
a first conductive layer over and in contact with the first insulating layer;
a first layer over the first conductive layer; and
a second conductive layer over the first layer,
wherein a third conductive layer is over the second insulating layer,
wherein the light-emitting element comprises:
a fourth conductive layer over and in contact with the first insulating layer;
a second layer over the fourth conductive layer;
a third layer over the second layer; and
a fifth conductive layer over the third layer,
wherein the second insulating layer is in contact with each of a side surface of the fourth conductive layer, a side surface of the second layer, a side surface of the third layer, a side surface of the fifth conductive layer, and a top surface of the fifth conductive layer,
wherein the second insulating layer comprises a first opening overlapping with the second conductive layer, and a second opening overlapping with the fifth conductive layer,
wherein the third conductive layer is in contact with the second conductive layer through the first opening, and in contact with the fifth conductive layer through the second opening,
wherein the second layer comprises a light-emitting compound,
wherein the first conductive layer comprises a material identical to a material of the fourth conductive layer,
wherein the first layer comprises a material identical to a material of the third layer, and
wherein the second conductive layer comprises a material identical to a material of the fifth conductive layer.

5. The display device according to claim 4,
wherein the second insulating layer has a stacked-layer structure of a third insulating layer and a fourth insulating layer over the third insulating layer,
wherein the third insulating layer is in contact with each of the side surface of the fourth conductive layer, the side surface of the second layer, the side surface of the third layer, the side surface of the fifth conductive layer, and the top surface of the fifth conductive layer,
wherein the third insulating layer comprises aluminum and oxygen, and
wherein the fourth insulating layer comprises silicon and nitrogen.

6. The display device according to claim 5, further comprising a gap in a region that is positioned between the third insulating layer and the fourth insulating layer and does not overlap with the fifth conductive layer.

7. The display device according to claim 4, wherein the third layer comprises a substance with a high electron-injection property.

8. The display device according to claim 4, wherein the third layer comprises lithium fluoride.

9. A method for fabricating a display device, the method comprising the steps of:

forming a first conductive film over a first insulating layer;

forming a first film comprising a light-emitting compound over the first conductive film;

forming a first sacrificial layer over the first film;

forming a first resist mask over the first sacrificial layer;

forming a second sacrificial layer from the first sacrificial layer and a second film from the first film by removing the first sacrificial layer and the first film that are not covered with the first resist mask;

removing the second sacrificial layer;

forming a third film over the second film;

forming a second conductive film over the third film;

forming a second resist mask over the second conductive film; and forming a fifth conductive layer and a second conductive layer from the second conductive film, a third layer and a first layer from the third film, a second layer from the second film, and a fourth conductive layer and a first conductive layer from the first conductive film by removing the second conductive film, the third film, the second film, and the first conductive film that are not covered with the second resist mask.

10. The method for fabricating a display device, according to claim 9, wherein a second insulating layer is formed over the second conductive layer, the fifth conductive layer, and the first insulating layer after the fifth conductive layer, the second conductive layer, the third layer, the first layer, the second layer, the fourth conductive layer, and the first conductive layer are formed, wherein a first opening positioned in a region overlapping with the second conductive layer and a second opening positioned in a region overlapping with the fifth conductive layer are formed in the second insulating layer, and wherein a third conductive layer is formed in contact with the second conductive layer through the first opening and in contact with the fifth conductive layer through the second opening.

11. The method for fabricating a display device, according to claim 10, wherein the second insulating layer has a stacked-layer structure of a third insulating layer and a fourth insulating layer over the third insulating layer, wherein the third insulating layer is formed by an ALD method, and wherein the fourth insulating layer is formed by a sputtering method.

12. The method for fabricating a display device, according to claim 10, wherein the second insulating layer has a stacked-layer structure of a third insulating layer, a fourth insulating layer over the third insulating layer, and a fifth insulating layer over the fourth insulating layer, wherein the third insulating layer and the fifth insulating layer are formed by an ALD method, and wherein the fourth insulating layer is formed by a sputtering method.

13. A method for fabricating a display device, the method comprising the steps of:

forming a first conductive film over a first insulating layer;

forming a first film comprising a light-emitting compound over the first conductive film;

forming a first sacrificial layer over the first film;

forming a first resist mask over the first sacrificial layer;

forming a second sacrificial layer from the first sacrificial layer and a second film from the first film by removing the first sacrificial layer and the first film that are not covered with the first resist mask;

removing the second sacrificial layer;

forming a third film using a metal mask over the second film;

forming a second conductive film over the third film and the first conductive film;

forming a second resist mask over the second conductive film; and forming a fifth conductive layer and a second conductive layer from the second conductive film, a third layer from the third film, a second layer from the second film, and a fourth conductive layer and a first conductive layer that is in contact with the second conductive layer from the first conductive film by removing the second conductive film, the third film, the second film, and the first conductive film that are not covered with the second resist mask.

14. The method for fabricating a display device, according to claim 13, wherein a second insulating layer is formed over the second conductive layer, the fifth conductive layer, and the first insulating layer after the fifth conductive layer, the second conductive layer, the third layer, the second layer, the fourth conductive layer, and the first conductive layer are formed, wherein a first opening positioned in a region overlapping with the second conductive layer and a second opening positioned in a region overlapping with the fifth conductive layer are formed in the second insulating layer, and wherein a third conductive layer is formed in contact with the second conductive layer through the first opening and in contact with the fifth conductive layer through the second opening.

15. The method for fabricating a display device, according to claim 14, wherein the second insulating layer has a stacked-layer structure of a third insulating layer and a fourth insulating layer over the third insulating layer, wherein the third insulating layer is formed by an ALD method, and wherein the fourth insulating layer is formed by a sputtering method.

16. The method for fabricating a display device, according to claim 14, wherein the second insulating layer has a stacked-layer structure of a third insulating layer, a fourth insulating layer over the third insulating layer, and a fifth insulating layer over the fourth insulating layer, wherein the third insulating layer and the fifth insulating layer are formed by an ALD method, and wherein the fourth insulating layer is formed by a sputtering method.

* * * * *